(12) United States Patent
Nakano et al.

(10) Patent No.: US 6,538,388 B2
(45) Date of Patent: Mar. 25, 2003

(54) PLASMA PROCESSING APPARATUS SUITABLE FOR POWER SUPPLY OF HIGHER FREQUENCY

(75) Inventors: Akira Nakano, Miyagi-ken (JP); Tadahiro Ohmi, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/977,453

(22) Filed: Oct. 15, 2001

(65) Prior Publication Data

US 2002/0088776 A1 Jul. 11, 2002

(30) Foreign Application Priority Data

Oct. 16, 2000 (JP) ......................................... 2000-315728

(51) Int. Cl.[7] .............................. H01J 7/24; H05B 31/26
(52) U.S. Cl. ............................. 315/111.21; 315/111.71
(58) Field of Search ...................... 315/111.21, 111.31, 315/111.71, 111.91, 111.41, 111.51; 204/298.06, 298.07, 298.08, 298.34, 298.25; H01J 7/24; H05B 31/26

(56) References Cited

U.S. PATENT DOCUMENTS

| | | | | |
|---|---|---|---|---|
| 5,309,063 A | * | 5/1994 | Singh | 315/111.51 |
| 5,472,561 A | | 12/1995 | Williams et al. | 156/627.1 |
| 5,537,004 A | * | 7/1996 | Imahashi et al. | 315/111.21 |
| 6,155,202 A | * | 12/2000 | Nakano et al. | 144/134.1 |
| 6,184,623 B1 | * | 2/2001 | Sugai et al. | 315/111.21 |
| 6,270,618 B1 | * | 8/2001 | Nakano et al. | 156/345.44 |
| 6,280,563 B1 | * | 8/2001 | Baldwin et al. | 156/345.48 |
| 6,313,583 B1 | * | 11/2001 | Arita et al. | 315/111.21 |
| 6,388,382 B1 | * | 5/2002 | Doi et al. | 315/111.51 |
| 6,462,483 B1 | * | 8/2002 | Jeng et al. | 315/111.51 |

* cited by examiner

Primary Examiner—Don Wong
Assistant Examiner—Trinh Vo Dinh
(74) Attorney, Agent, or Firm—Brinks Hofer Gilson & Lione

(57) ABSTRACT

A plasma processing apparatus has a plasma processing chamber, a radiofrequency generator, and an matching circuit. The plasma processing chamber includes a plasma excitation electrode and a susceptor electrode for exciting a plasma. The radiofrequency generator is connected to plasma excitation electrode. The matching circuit matches the impedance between the plasma processing chamber and the radiofrequency generator. A capacitance which is 26 times a plasma electrode capacitance $C_e$ between the plasma excitation electrode and the susceptor electrode is greater than a loss capacitance $C_X$ between the plasma excitation electrode and ground potential positions which are DC-grounded.

43 Claims, 28 Drawing Sheets

FIG. 30

DETAILED MAINTENANCE PAGE    CP4 xxxx  ← K13

ELECTRICAL PERFORMANCE   K10

| $f_o$ ... | $f_e$ ... | Z ... | R ... | $C_e$ ... | $C_x$ ... |
|---|---|---|---|---|---|

MAINTENANCE HISTORY   K17

| | CHAMBER 1 xxxx  K13 | | | | | | CHAMBER 2 xxxx  K13 | | | | | | VARIATIONS xxxx  K13 | | | | | |
|---|---|---|---|---|---|---|---|---|---|---|---|---|---|---|---|---|---|---|
| DATE | $f_o$ | $f_e$ | Z | R | $C_e$ | $C_x$ | $f_o$ | $f_e$ | Z | R | $C_e$ | $C_x$ | $f_o$ | $f_e$ | Z | R | $C_e$ | $C_x$ |
| | MHz | MHz | Ω | Ω | pF | pF | MHz | MHz | Ω | Ω | pF | pF | | | | | | |
| 7/27 | 45.3 | 40.68 | 8 | 3.1 | 37 | 1800 | 45.3 | 40.68 | 8 | 3.1 | 37 | 1800 | 0.04 | 0.05 | 0.4 | 0.3 | 0.09 | 0.02 | ously sealed with a bellows 11.

PLASMA PROCESSING APPARATUS SUITABLE FOR POWER SUPPLY OF HIGHER FREQUENCY

BACKGROUND OF THE INVENTION

1. Field of the Invention

The present invention relates to plasma processing apparatuses, plasma processing systems, and performance validation systems and performance inspection methods thereof. In particular, the present invention relates to a technology which is suitable for power supply of higher frequencies and achieves improvements in power consumption efficiency and coating layer characteristics.

2. Description of the Related Art

FIG. 32 illustrates a typical conventional dual-frequency excitation plasma processing apparatus which performs a plasma process such as a chemical vapor deposition (CVD) process, a sputtering process, a dry etching process, or an ashing process. This plasma processing apparatus is provided with a matching circuit 2A which is disposed between a radiofrequency generator 1 and a plasma excitation electrode (cathode) 4. The matching circuit 2A matches the impedance between the radiofrequency generator 1 and the excitation electrode 4.

Radiofrequency power from the radiofrequency generator 1 is fed to the plasma excitation electrode 4 via the matching circuit 2A and a feed plate 3. The matching circuit 2A is accommodated in a matching box 2 which is a housing composed of a conductive material. The plasma excitation electrode 4 and the feed plate 3 are covered by a conductive chassis 21.

The plasma excitation electrode 4 is provided with projections 4a at the bottom face thereof. A shower plate 5 having many holes 7 provided under the plasma excitation electrode 4 is in contact with the projection 4a. The plasma excitation electrode 4 and the shower plate 5 define a space 6. A gas feeding tube 17 comprising a conductor is connected to the space 6. The gas feeding tube 17 is provided with an insulator 17a at the middle thereof so as to insulate the plasma excitation electrode 4 and the gas source.

Gas from the gas feeding tube 17 is fed into a chamber space 60 composed of a chamber wall 10, via the holes 7 in the shower plate 5. An insulator 9 insulates the plasma excitation electrode 4 from the chamber wall 10. The exhaust system is not depicted in the drawing.

A susceptor electrode (wafer susceptor) 8 which holds a substrate 16 and functions as another plasma excitation electrode is provided in the chamber space 60. The wafer susceptor 8 is provided with a susceptor shield 12 thereunder.

The susceptor shield 12 comprises a shield supporting plate 12A for sustaining the susceptor electrode 8 and a cylindrical support 12B extending downward from the center of the shield supporting plate 12A. The cylindrical support 12B extends through a chamber bottom 10A, and the lower portion of the cylindrical support 12B and the chamber bottom 10A are hermetically sealed with a bellows 11.

The shaft 13 and the susceptor electrode 8 are electrically isolated from the susceptor shield 12 by a gap between the susceptor shield 12 and the susceptor electrode 8 and by insulators 12C provided around the shaft 13. The insulators 12C also maintain high vacuum in the chamber space 60. The susceptor electrode 8 and the susceptor shield 12 can be moved vertically by the bellows 11 to control the distance between the two electrodes 4 and 8.

The susceptor electrode 8 is connected to a second radiofrequency generator 15 via the shaft 13 and a matching circuit accommodated in a matching box 14. The chamber wall 10 and the susceptor shield 12 have the same DC potential.

FIG. 33 illustrates another example of conventional plasma processing apparatuses. Unlike the plasma processing apparatus shown in FIG. 32, the plasma processing apparatus shown in FIG. 33 is of a single-frequency excitation type. In detail, a radiofrequency power is supplied only to a cathode 4, a susceptor electrode 8 being grounded. Moreover, the matching box 14 and the radiofrequency generator 15 shown in FIG. 32 are not provided. The susceptor electrode 8 and a chamber wall 10 have the same DC potential.

In these conventional plasma processing apparatuses, power with a frequency of approximately 13.56 MHz is generally supplied to generate a plasma between the electrodes 4 and 8. A plasma process such as a plasma-enhanced CVD process, a sputtering process, a dry etching process, or an ashing process is then performed using the plasma.

The validation and evaluation of operation of the above-described plasma processing apparatuses have been performed by actual layer deposition and evaluation of the characteristics of the deposited layer, as follows.

Procedure (1): Deposition rate and planar uniformity

Step 1: Depositing a required layer on a 6-inch substrate by a plasma-enhanced CVD process.

Step 2: Patterning a resist layer by photolithography.

Step 3: Dry-etching the layer.

Step 4: Removing the resist layer by ashing.

Step 5: Measuring the surface roughness using a contact displacement meter to determine the layer thickness.

Step 6: Calculating the deposition rate from the deposition time and the layer thickness.

Step 7: Measuring the planar uniformity at 16 points on the substrate surface.

Procedure (2): BHF etching rate

A resist mask is patterned as in Steps 1 and 2 in Procedure (1).

Step 3: Immersing the substrate in a buffered hydrofluoric acid (BHF) solution for one minute to etch the layer.

Step 4: Rinsing the substrate with deionized water, drying the substrate, and removing the resist mask with a mixture of sulfuric acid and hydrogen peroxide ($H_2SO_4 + H_2O_2$).

Step 5: Measuring the roughness as in Step 5 in Procedure (1) to determine the layer thickness after the etching.

Step 6: Calculating the etching rate from the immersion time and the reduced layer thickness.

Procedure (3): Isolation voltage

Step 1: Depositing a conductive layer on a glass substrate by a sputtering method and patterning the conductive layer to form a lower electrode.

Step 2: Depositing an insulating layer by a plasma-enhanced CVD process.

Step 3: Forming an upper electrode as in Step 1.

Step 4: Forming a contact hole for the lower electrode.

Step 5: Measuring the current-voltage characteristics (I–V characteristics) of the insulating layer by probing the upper and lower electrodes while varying the voltage up to approximately 200 V.

Step 6: Defining the isolation voltage as a voltage V at 100 pA corresponding 1 $\mu A/cm^2$ in a 100 $\mu m$ square electrode.

The plasma processing apparatus has been required to achieve a higher plasma processing rate (a deposition rate or a processing rate), improved productivity, and improved planar uniformity in the plasma processing of substrates to be treated (a uniform distribution of the layer thickness and a uniform process in the planar direction). With an increased size of substrates in recent years, the requirement for planar uniformity is becoming more severe. Moreover, with an increased size of the substrate, the power required is also increased to the order of kilowatts, thus increasing the power consumption. As the capacity of the power supply increases, both costs for developing the power supply and for operating the apparatus consuming much power increase. Accordingly, it is desirable to reduce the operation costs.

Furthermore, an increase in power consumption leads to an increase in emission of carbon dioxide which places a burden on the environment. Since the power consumption is increased by the combination of an increase in the size of substrates and a low power consumption efficiency, there is a growing demand to reduce the carbon dioxide emission.

The plasma density generated in the plasma space can be improved by shifting the plasma excitation frequency to a higher side. For example, a frequency of 30 MHz or more in the VHF band can be used instead of the conventional 13.56 MHz. Thus, one possible way to improve the deposition rate in a deposition apparatus such as a plasma-enhanced CVD apparatus is to employ a higher plasma excitation frequency.

Another type of plasma processing apparatus has a plurality of plasma chambers. Such a plasma processing apparatus is also required to achieve a higher plasma processing rate (a deposition rate or a processing rate), improved productivity, and improved planar uniformity in the plasma processing of the substrates (a uniform distribution of the layer thickness and a uniform process in the planar direction), when the substrates are treated in different plasma chambers.

Moreover, these plasma chambers of the plasma processing apparatus are required to achieve substantially the same plasma processing results using the same process recipe specifying external parameters such as the flow rate and pressure of the charged gasses, the supplied power, and the treatment time.

A request at the time of installation or maintenance of the plasma processing apparatus is to reduce time for adjusting the apparatus to eliminate processing variations among the individual plasma chambers, so that substantially the same process results can be achieved using the same process recipe. Reduction in the cost for such adjustment is also required.

A plasma processing system equipped with a plurality of the above-described plasma processing apparatuses is also required to eliminate plasma processing variations among individual plasma chambers of these plasma processing apparatuses.

The above conventional plasma processing apparatuses are designed to use a power having a frequency of approximately 13.56 MHz and is not suited for higher frequencies. In detail, units to which the radiofrequency voltage is applied, i.e., plasma processing chambers are not designed in view of radiofrequency characteristics, such as impedance and resonance frequency characteristics. Thus, a loss current $I_x$ which shunts to other components in the plasma chamber increases relative to a plasma current $I_e$ supplied to the plasma space. Such a decrease in electrical power consumption in the plasma chamber results in a decrease in plasma density therein.

When a power having a frequency exceeding 13.56 MHz is supplied, the deposition rate is not improved, but rather decreased in some cases during the deposition process. Although the effective power consumed in the plasma space increases as the frequency increases, the power starts to decrease once the power reaches its peak value, eventually reaching a level at which glow-discharge no longer occur, thus rendering further increases in frequency meaningless.

In the plasma processing apparatuses and plasma processing systems, each having a plurality of plasma processing chambers, the radiofrequency characteristics of each plasma chamber are determined by the size and the shape thereof. Since each component constituting the plasma chamber has a variation in size due to machining tolerance which is inevitable in mechanical processing for the chamber production. In addition, each plasma chamber has assembling tolerance. Moreover, the plasma chamber includes portions in which sizes thereof are unmeasurable after assembling. Thus, there are no means for quantitatively determining whether or not the assembled chamber has designed radiofrequency characteristics and means for measuring difference in radiofrequency characteristics among plasma processing chambers.

As a result, the following problems arise.

The effective power consumed and the plasma density generated in the plasma space may not be equal between these plasma processing chambers. The same plasma processing results may not be obtained when the same process recipe is used for a plurality of plasma processing chambers.

Accordingly, in order to obtain the same plasma processing results, external parameters, such as a gas flow and a pressure, a supplied power, and a process time, must be compared with the process results according to Procedures (1) to (3) described above for each of the plasma chambers so as to determine the correlation between them. However, the amount of data is too enormous to completely perform the comparison.

When Procedures (1) to (3) described above are employed to validate and evaluate the operation of the plasma processing apparatus, it becomes necessary to actually operate the plasma processing apparatus and to examine the treated substrates at a different site by a plurality of inspection steps.

Since such an inspection requires several days to several weeks to yield evaluation results, it is desired that the time for performance inspection of a plasma processing apparatus be reduced in the development stage thereof.

Moreover, when Procedures (1) to (3) described above are employed to inspect the plasma processing apparatus or system having a plurality of plasma chambers, a time over months will be required for adjusting the plasma processing chambers in order to eliminate the difference in performance and the variation in processing among the plasma processing chambers and in order to achieve the same processing results using the same process recipe. The time required for such adjustment needs to be reduced. Also, the cost of substrates for inspection, the cost of processing the substrates for inspection, the labor cost for engineers involved with the adjustment and so forth are significantly high.

SUMMARY OF THE INVENTION

In view of the above problems, the present invention aims to achieve the following objects.

(1) To improve power consumption in the plasma space in order to achieve a processing rate and to obtain layer characteristics which are substantially equal to those in conventional apparatuses by reduced power supply compared with conventional apparatuses.

(2) To improve the plasma density in order to achieve improvements in plasma processing, that is, improving the planar uniformity of the plasma processing of the treated substrate (improving the thickness uniformity processing uniformity in the planar direction), and improving characteristics, such as isolation voltage, of a layer deposited by a plasma-enhanced CVD or sputtering system.

(3) To improve the processing rate (the deposition rate in a layer deposition system or the processing rate in a processing system) by shifting the plasma excitation frequency to the higher side.

(4) To obtain substantially the same radiofrequency characteristics, such as capacitance, impedance, and resonant frequency, for a plurality of plasma processing chambers.

(5) To obtain substantially the same process results from a plurality of plasma processing chambers using the same process recipe.

(6) To eliminate the determination of the process condition by the relationships between the external parameters and the process results based on Procedures (1) to (3) described above using enormous amounts of data on a plurality of plasma chambers.

(7) To reduce the time for adjustment which is performed to obtain the same process results from the same process recipe.

(8) To reduce operation and maintenance costs and to improve productivity.

(9) To provide a plasma processing apparatus and a plasma processing system which can readily maintain a normal operation state by a standard for performance validation of plasma processing chambers without actually treating substrates.

According to a first aspect of the present invention, a plasma processing apparatus comprises a plasma processing chamber having a plasma excitation electrode, a susceptor electrode, and a radiofrequency feeder, the plasma excitation electrode and the susceptor electrode generating a plasma in cooperation with each other; a radiofrequency generator for supplying a radiofrequency voltage to the plasma excitation electrode; and a matching circuit having an input terminal and an output terminal, the input terminal being connected to the radiofrequency generator and the output terminal being connected to an input end of the radiofrequency feeder so as to achieve impedance matching between the plasma processing chamber and the radiofrequency generator, wherein 26 times a plasma electrode capacitance $C_e$ between the plasma excitation electrode and the susceptor electrode is greater than a loss capacitance $C_X$ between the plasma excitation electrode and ground potential positions which are DC-grounded.

Preferably, 7 times the plasma electrode capacitance $C_e$ is greater than the loss capacitance $C_X$. More preferably, 5 times the plasma electrode capacitance $C_e$ is greater than the loss capacitance $C_X$.

According to a second aspect of the present invention, a plasma processing apparatus comprises a plurality of plasma processing chamber units, each unit comprising a plasma processing chamber having a plasma excitation electrode, a susceptor electrode, and a radiofrequency feeder, the plasma excitation electrode and the susceptor electrode generating a plasma in cooperation with each other; a radiofrequency generator for supplying a radiofrequency voltage to the plasma excitation electrode; and a matching circuit having an input terminal and an output terminal, the input terminal being connected to the radiofrequency generator and the output terminal being connected to an input end of the radiofrequency feeder so as to achieve impedance matching between the plasma processing chamber and the radiofrequency generator, wherein a variation in plasma electrode capacitance $C_e$ between the plasma excitation electrode and the susceptor electrode among the plurality of plasma processing chambers is set within a predetermined value, the variation being defined by $(C_{emax}-C_{emin})/(C_{emax}+C_{emin})$ wherein $C_{emax}$ and $C_{emin}$ are the maximum and the minimum, respectively, of the plasma electrode capacitance $C_e$, and a variation in loss capacitance $C_X$ between the plasma excitation electrode and ground potential positions which are DC-grounded among the plasma processing chambers is set within a predetermined value, the variation being defined by $(C_{Xmax}-C_{Xmin})/(C_{Xmax}+C_{Xmin})$ wherein $C_{Xmax}$ and $C_{Xmin}$ are the maximum and the minimum, respectively, of the loss capacitance $C_X$.

Preferably, both the variation in the plasma electrode capacitance $C_e$ and the variation in the loss capacitance $C_X$ are less than 0.1. More preferably, both the variation in the plasma electrode capacitance $C_e$ and the variation in the loss capacitance $C_X$ are less than 0.03. Preferably, 26 times the plasma electrode capacitance $C_e$ is greater than the loss capacitance $C_X$.

In these aspects, the plasma excitation electrode and the susceptor electrode may be of a parallel plate type, the plasma excitation electrode constitutes a part of an upper component of the plasma processing chamber, and the loss capacitance $C_X$ is a capacitance which is measured at a measuring position corresponding to the output terminal of the matching circuit of the upper component.

In the above aspects, preferably, the plasma processing apparatus further comprises a measuring terminal provided in the vicinity of the measuring position for measuring radiofrequency characteristics of the plasma processing chamber, and a switch which electrically disconnects the measuring position from the measuring terminal and electrically connects the radiofrequency feeder to the radiofrequency generator when the plasma is excited and which electrically connects the measuring position to the measuring terminal and electrically disconnects the radiofrequency feeder from the radiofrequency generator when the radiofrequency characteristics of the plasma processing chamber are measured.

Since the measuring terminal is disconnected from the electrical path including the radiofrequency generator, the radiofrequency supplier, the matching circuit, the radiofrequency feeder, and the plasma excitation electrode in a measuring mode, the radiofrequency characteristics including capacitance can be readily measured by operating the switch without detaching an impedance measuring probe. Since the switch eliminates mechanical detachment of the components which lie in the unmeasured region, the radiofrequency characteristics of the plasma processing chamber or the upper component can be more precisely measured. Thus, the radiofrequency characteristics of a plurality of plasma chambers can be readily measured, and the difference in the radiofrequency characteristics between plasma processing chambers can be readily eliminated. In conventional methods, such installation and maintenance operations require long periods over months.

According to a third aspect of the present invention, a plasma processing system comprises a plurality of plasma processing apparatuses, each plasma processing apparatus comprising a plurality of plasma processing chambers, each plasma processing chamber comprising: a plasma processing chamber having a plasma excitation electrode, a susceptor electrode, and a radiofrequency feeder, the plasma excitation electrode and the susceptor electrode generating a plasma in cooperation with each other; a radiofrequency generator for supplying a radiofrequency voltage to the plasma excitation electrode; and a matching circuit having an input terminal and an output terminal, the input terminal being connected to the radiofrequency generator and the output terminal being connected to an input end of the radiofrequency feeder so as to achieve impedance matching between the plasma processing chamber and the radiofrequency generator, wherein a variation in plasma electrode capacitance $C_e$ between the plasma excitation electrode and the susceptor electrode among the plurality of plasma processing chambers is set within a predetermined value, the variation being defined by $(C_{emax}-C_{emin})/(C_{emax}+C_{emin})$ wherein $C_{emax}$ and $C_{emin}$ are the maximum and the minimum, respectively, of the plasma electrode capacitance $C_e$, and a variation in loss capacitance $C_X$ between the plasma excitation electrode and ground potential positions which are DC-grounded among the plasma processing chambers is set within a predetermined value, the variation being defined by $(C_{Xmax}-C_{Xmin})/(C_{Xmax}+C_{Xmin})$ wherein $C_{Xmax}$ and $C_{Xmin}$ are the maximum and the minimum, respectively, of the loss capacitance $C_X$.

In the third aspect, both the variation in the plasma electrode capacitance $C_e$ and the variation in the loss capacitance $C_X$ are preferably less than 0.1 and more preferably less than 0.03. Preferably, 26 times the plasma electrode capacitance $C_e$ is greater than the loss capacitance $C_X$. More preferably, 7 times the plasma electrode capacitance $C_e$ is greater than the loss capacitance $C_X$. More preferably, 5 times the plasma electrode capacitance $C_e$ is greater than the loss capacitance $C_X$.

In this aspect, the plasma excitation electrode and the susceptor electrode may be of a parallel plate type, the plasma excitation electrode constitutes a part of an upper component of the plasma processing chamber, and the loss capacitance $C_X$ is a capacitance which is measured at a measuring position corresponding to the output terminal of the matching circuit of the upper component.

Preferably, the plasma processing system further comprises a measuring terminal provided in the vicinity of the measuring position for measuring radiofrequency characteristics of the plasma processing chamber, and a switch which electrically disconnects the measuring position from the measuring terminal and electrically connects the radiofrequency feeder to the radiofrequency generator when the plasma is excited and which electrically connects the measuring position to the measuring terminal and electrically disconnects the radiofrequency feeder from the radiofrequency generator when the radiofrequency characteristics of the plasma processing chamber are measured.

Preferably, the plasma processing system further comprises a radiofrequency-measuring meter which is detachably connected to the measuring terminal of each of the plurality of plasma processing chambers.

Since these plasma processing chambers have substantially the same radiofrequency characteristics, these plasma processing chambers consume substantially the same radiofrequency power in the plasma spaces. As a result, substantially the same results can be obtained by the same process recipe for these plasma processing chambers. When layers are deposited in these processing chambers, these layers will have substantially the same characteristics, e.g., the thickness, the isolation voltage, and the etching rate.

When the above variations are less than 0.1, the variation in layer thickness dan be controlled within ±5% under the same deposition conditions.

When the above variations are less than 0.03, the variation in layer thickness can be controlled within ±2% under the same deposition conditions.

Since the radiofrequency-measuring meter is detached from the measuring terminal in the measuring mode, the radiofrequency-measuring meter is not electrically affected during the plasma generation. Moreover, the radiofrequency characteristics of a plurality of plasma processing chambers can be measured using one radiofrequency-measuring meter.

Preferably, the radiofrequency characteristics between the measuring position and the radiofrequency-measuring meter are the same among the plurality of plasma processing chambers.

According to a fourth aspect of the present invention, a performance validation system for the plasma processing apparatus according to the first or second aspect or the plasma processing system according to the third aspect, comprises a customer terminal, an engineer terminal, and information providing means, wherein the customer terminal requests browsing of performance information to the information providing means via a public line, a maintenance engineer uploads the performance information to the information providing means through the engineer terminal, and the information providing means provides the performance information uploaded from the engineer terminal to the customer terminal upon the request from the customer terminal.

The customer can easily obtain the information for purchasing the plasma processing apparatus or system of the present invention and the information regarding the operations and maintenance of the apparatus or system in use.

Preferably, the performance information comprises the plasma electrode capacitance $C_e$. The performance information may be output as a catalog or specifications.

According to a fifth aspect of the present invention, in an inspection method for a plasma processing apparatus having a plasma processing chamber having a plasma excitation electrode, a susceptor electrode, and a radiofrequency feeder, the plasma excitation electrode and the susceptor electrode generating a plasma in cooperation with each other; a radiofrequency generator for supplying a radiofrequency voltage to the plasma excitation electrode; and a matching circuit having an input terminal and an output terminal, the input terminal being connected to the radiofrequency generator and the output terminal being connected to an input end of the radiofrequency feeder so as to achieve impedance matching between the plasma processing chamber and the radiofrequency generator, the method comprises setting the plasma electrode capacitance $C_e$ between the plasma excitation electrode and the susceptor electrode and the loss capacitance $C_X$ between the plasma excitation electrode and ground potential positions which are DC-grounded such that 26 times the plasma electrode capacitance $C_e$ is greater than the loss capacitance $C_X$.

Preferably, 7 times the plasma electrode capacitance $C_e$ is greater than the loss capacitance $C_X$. More preferably, 5 times the plasma electrode capacitance $C_e$ is greater than the loss capacitance $C_X$.

The plasma excitation electrode and the susceptor electrode may be of a parallel plate type, the plasma excitation electrode constitutes a part of an upper component of the plasma processing chamber, and the loss capacitance $C_X$ is a capacitance which is measured at a measuring position corresponding to the output terminal of the matching circuit of the upper component.

According to a sixth aspect of the present invention, in an inspection method for a plasma processing apparatus having a plurality of plasma processing chamber units, each unit comprising: a plasma processing chamber having a plasma excitation electrode, a susceptor electrode, and a radiofrequency feeder, the plasma excitation electrode and the susceptor electrode generating a plasma in cooperation with each other; a radiofrequency generator for supplying a radiofrequency voltage to the plasma excitation electrode; and a matching circuit having an input terminal and an output terminal, the input terminal being connected to the radiofrequency generator and the output terminal being connected to an input end of the radiofrequency feeder so as to achieve impedance matching between the plasma processing chamber and the radiofrequency generator, the method comprises setting a variation in plasma electrode capacitance $C_e$ between the plasma excitation electrode and the susceptor electrode among the plurality of plasma processing chambers at a predetermined value wherein the variation is defined by $(C_{emax}-C_{emin})/(C_{emax}+C_{emin})$ wherein $C_{emax}$ and $C_{emin}$ are the maximum and the minimum, respectively, of the plasma electrode capacitance $C_e$ and a variation in loss capacitance $C_X$ between the plasma excitation electrode and ground potential positions which are DC-grounded among the plasma processing chambers at a predetermined value wherein the variation is defined by $(C_{Xmax}-C_{Xmin})/(C_{Xmax}+C_{Xmin})$ wherein $C_{Xmax}$ and $C_{Xmin}$ are the maximum and the minimum, respectively, of the loss capacitance $C_X$.

Both the variation in the plasma electrode capacitance $C_e$ and the variation in the loss capacitance $C_X$ are set such that they are preferably less than 0.1 and more preferably less than 0.03.

Preferably, 26 times the plasma electrode capacitance $C_e$ is greater than the loss capacitance $C_X$. More preferably, 7 times the plasma electrode capacitance $C_e$ is greater than the loss capacitance $C_X$. Most preferably, 5 times the plasma electrode capacitance $C_e$ is greater than the loss capacitance $C_X$.

The plasma excitation electrode and the susceptor electrode may be of a parallel plate type, the plasma excitation electrode constitutes a part of an upper component of the plasma processing chamber, and the loss capacitance $C_X$ is a capacitance which is measured at a measuring position corresponding to the output terminal of the matching circuit of the upper component.

According to a seventh embodiment, in an inspection method for a plasma processing system having a plurality of plasma processing apparatuses, each plasma processing apparatus having a plurality of plasma processing chambers, each plasma processing chamber comprising: a plasma processing chamber having a plasma excitation electrode, a susceptor electrode, and a radiofrequency feeder, the plasma excitation electrode and the susceptor electrode generating a plasma in cooperation with each other; a radiofrequency generator for supplying a radiofrequency voltage to the plasma excitation electrode; and a matching circuit having an input terminal and an output terminal, the input terminal being connected to the radiofrequency generator and the output terminal being connected to an input end of the radiofrequency feeder so as to achieve impedance matching between the plasma processing chamber and the radiofrequency generator, the method comprises setting a variation in plasma electrode capacitance $C_e$ between the plasma excitation electrode and the susceptor electrode among the plurality of plasma processing chambers at a predetermined value wherein the variation is defined by $(C_{emax}-C_{emin})/(C_{emax}+C_{emin})$ wherein $C_{emax}$ and $C_{emin}$ are the maximum and the minimum, respectively, of the plasma electrode capacitance $C_e$ and a variation in loss capacitance $C_X$ between the plasma excitation electrode and ground potential positions which are DC-grounded among the plasma processing chambers at a predetermined value wherein the variation is defined by $(C_{Xmax}-C_{Xmin})/(C_{Xmax}+C_{Xmin})$ wherein $C_{Xmax}$ and $C_{Xmin}$ are the maximum and the minimum, respectively, of the loss capacitance $C_X$.

Both the variation in the plasma electrode capacitance $C_e$ and the variation in the loss capacitance $C_X$ are set such that they are preferably less than 0.1 and more preferably less than 0.03.

Preferably, 26 times the plasma electrode capacitance $C_e$ is greater than the loss capacitance $C_X$. More preferably, 7 times the plasma electrode capacitance $C_e$ is greater than the loss capacitance $C_X$. Most preferably, 5 times the plasma electrode capacitance $C_e$ is greater than the loss capacitance $C_X$.

The plasma excitation electrode and the susceptor electrode may be of a parallel plate type, the plasma excitation electrode constitutes a part of an upper component of the plasma processing chamber, and the loss capacitance $C_X$ is a capacitance which is measured at a measuring position corresponding to the output terminal of the matching circuit of the upper component.

In the present invention, 26 times the plasma electrode capacitance $C_e$ is greater than the loss capacitance $C_X$. Since the shunt component of the current from the radiofrequency generator is reduced, the input power can be effectively consumed in the plasma chamber. Thus, the effective power consumption in the plasma space is achieved compared with conventional plasma processing apparatuses when the same frequency is supplied. In a layer deposition process, the deposition rate will be improved.

Since the plasma electrode capacitance $C_e$ and the loss capacitance $C_X$ are radiofrequency characteristics mainly depending on the mechanical structure, thus the individual plasma processing chambers have different values. By controlling the plasma electrode capacitance $C_e$ and the loss capacitance $C_X$ to the above-described conditions, the overall radiofrequency characteristics of the plasma chambers can be optimized, achieving stable plasma generation. Consequently, the plasma processing apparatus exhibits improved operation stability.

When 7 times the plasma electrode capacitance $C_e$ is greater than the loss capacitance $C_X$, the shunt components flowing in the ground potential positions can be reduced. Thus, the power can be effectively fed into the plasma space, and the effective power consumption in the plasma space is achieved compared with conventional plasma processing apparatuses when the same frequency is supplied. In a layer deposition process, the deposition rate will be improved. In addition, the resulting layer exhibits excellent characteristics, such as isolation voltage, etching resistance to etching solutions, and density or hardness of the deposited layer. Since the radiofrequency current is concentrated between the two electrodes, the radiofrequency power is more effectively consumed in the plasma space. Thus, the resulting layer has planar uniformity, namely, reduced variations in thickness and isolation voltage in the planar direction.

When 5 times the plasma electrode capacitance $C_e$ is greater than the loss capacitance $C_X$, the deposition rate can be further increased and the planar uniformity of the thickness and the isolation voltage can be more readily achieved by reduced input power. Thus, the operational costs can be reduced.

Accordingly, in the present invention, the capacitance characteristics are used in the installation and maintenance of the plasma processing apparatus and the plasma processing system. The capacitance is more readily measured using an inexpensive meter, compared with a measurement of the radiofrequency characteristics such as impedance.

BRIEF DESCRIPTION OF THE DRAWINGS

FIG. 30 shows an output form of a subpage CP4 in accordance with the performance validation system of the plasma processing apparatus of the present invention;

DESCRIPTION OF THE PREFERRED EMBODIMENTS

First Embodiment

Figure 1:
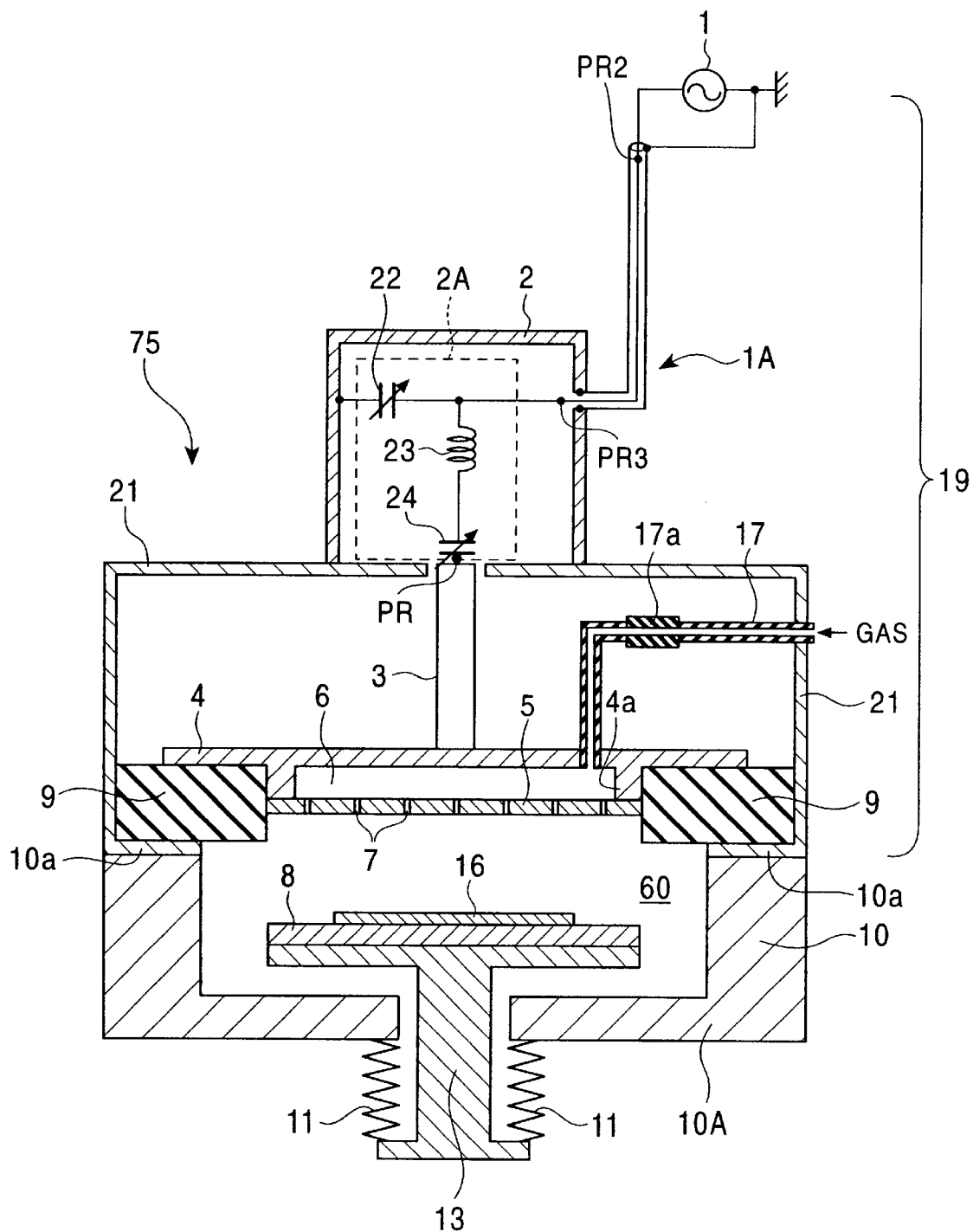
FIG. 1 is a cross-sectional view of the outline of the structure of a plasma processing apparatus according to the first embodiment.
Figure 2:
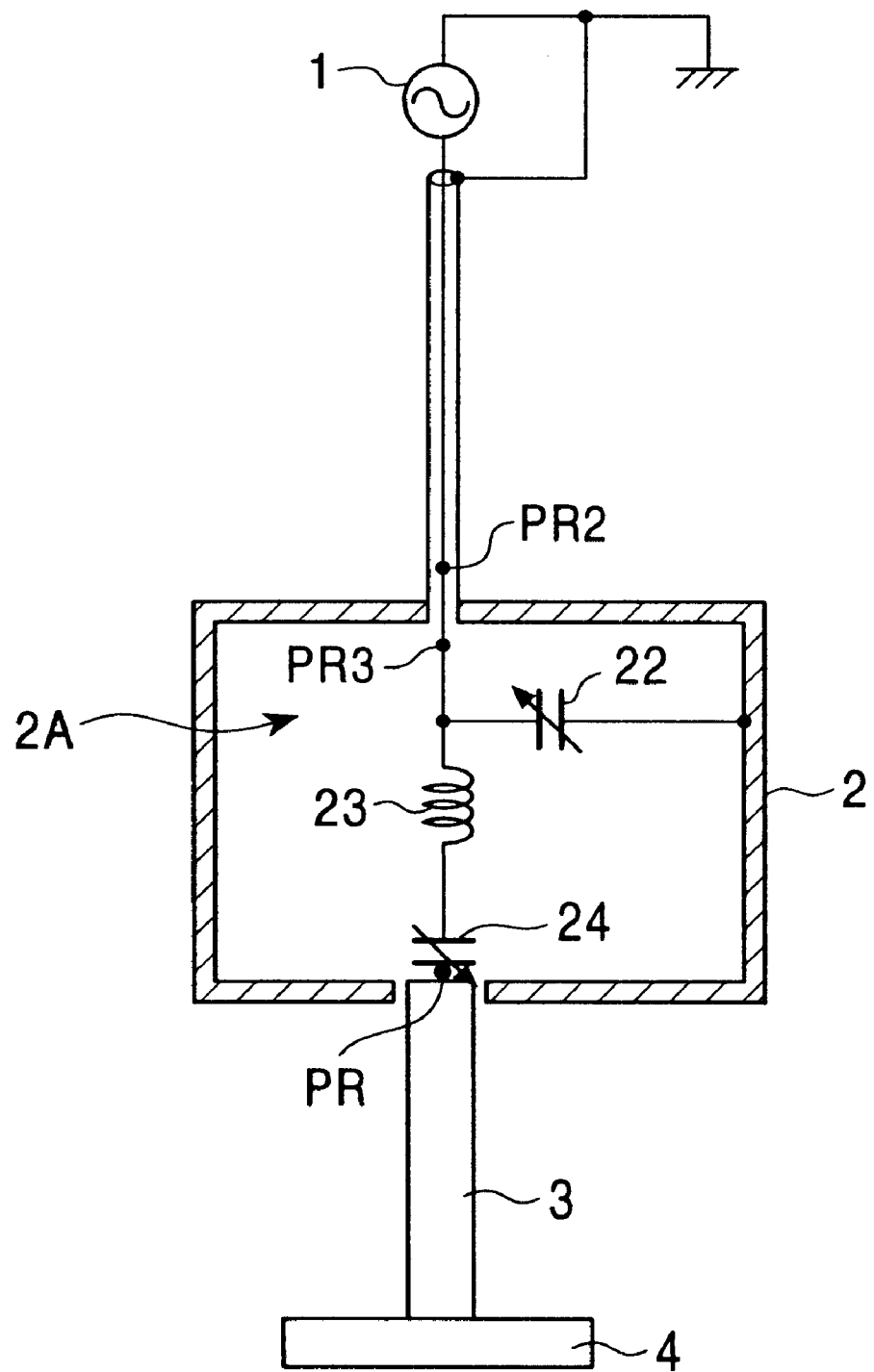
FIG. 2 is a schematic view of a matching circuit of the plasma processing apparatus shown in FIG. 1.
Figure 3:
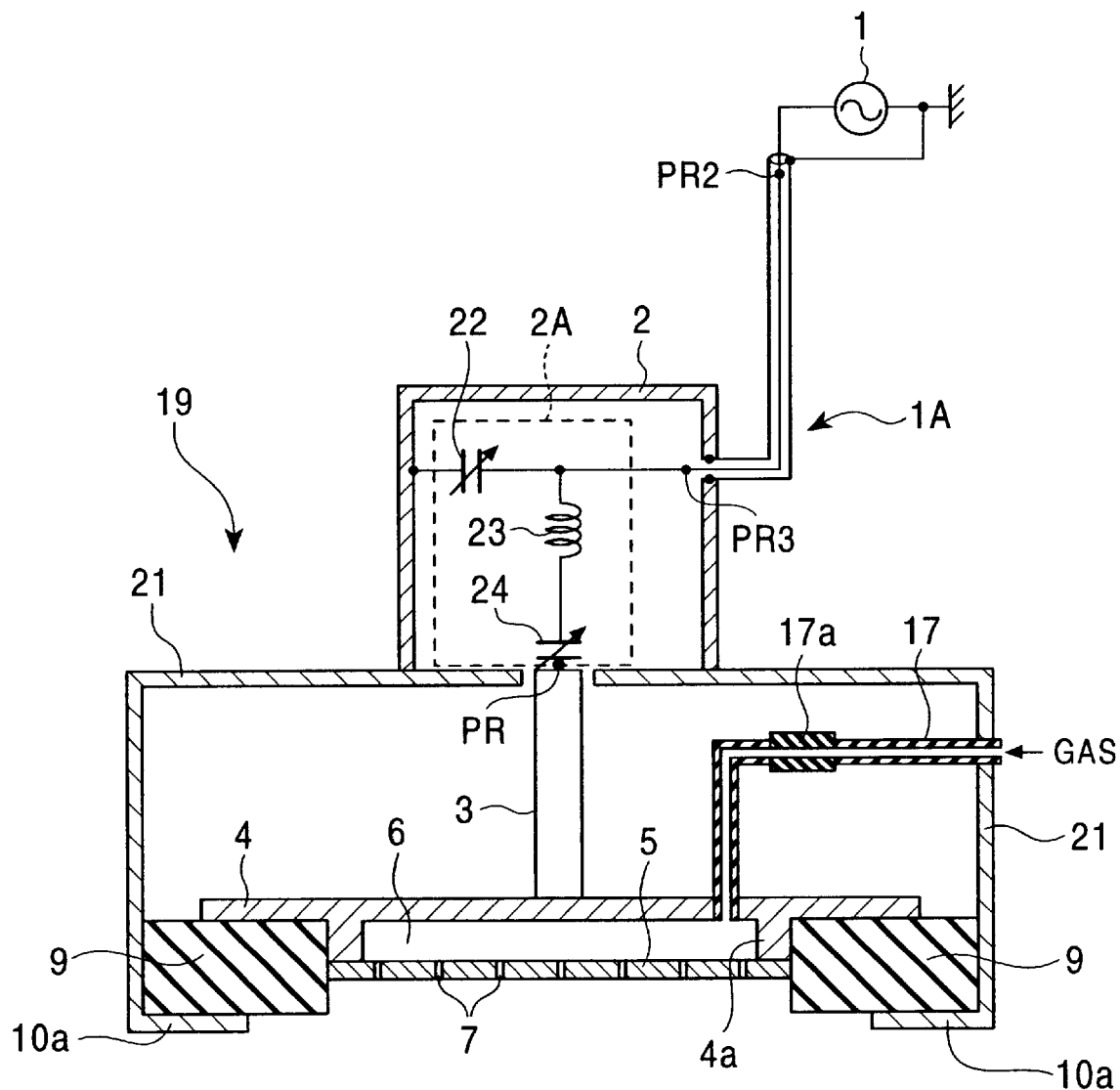
FIG. 3 is a cross-sectional view of the upper component of the plasma processing apparatus shown in FIG. 1.

A plasma processing apparatus according to a first embodiment of the present invention will now be described with reference to the drawings. FIG. 1 is an outline cross-sectional view illustrating the interior of the plasma processing apparatus according to the first embodiment. FIG. 2 illustrates a matching circuit 2A of the plasma processing apparatus shown in FIG. 1. FIG. 3 is a cross-sectional view of the upper component of the plasma processing apparatus shown in FIG. 1.

The plasma processing apparatus of this embodiment is of a single-frequency excitation type and performs plasma processing such as plasma-enhanced chemical vapor deposition (CVD), dry etching, ashing, and the like. Referring to FIG. 1, the plasma processing apparatus comprises a plasma processing chamber 75 having parallel plate electrodes 4 and 8, namely, a plasma excitation electrode (cathode) 4 for exciting a plasma and a susceptor electrode 8, a radiofrequency generator 1 connected to the plasma excitation electrode 4, and a matching circuit 2A for matching the impedance between the plasma processing chamber 75 and the radiofrequency generator 1.

In this plasma processing chamber 75, 26 times the plasma electrode capacitance $C_e$ between the parallel plate electrodes 4 and 8 is greater than the loss capacitance $C_X$ between the plasma excitation electrode 4 and ground potential positions which are DC-grounded.

In detail, referring to FIGS. 1 to 3, a shower plate 5 and the plasma excitation electrode 4 are disposed in the upper portion of the plasma processing chamber 60, while the susceptor electrode 8 for sustaining a substrate 16 to be treated is disposed to oppose the shower plate 5 in the lower portion of the plasma processing chamber 60. The plasma excitation electrode 4 is connected to the radiofrequency generator 1 via a feed plate (radiofrequency feeder) 3 and the matching circuit 2A. The plasma excitation electrode 4 and the feed plate 3 are covered by a chassis 21, and the matching circuit 2A is contained in a matching box 2.

The feed plate 3 is composed of, for example, silver-plated copper with a width of 50 to 100 mm, a thickness of 0.5 mm, and a length of 100 to 300 mm. The input end of the feed plate 3 is screwed to the output terminal of a tuning capacitor 24 in the matching circuit 2A, and the output end of the feed plate 3 is screwed to the plasma excitation electrode 4.

Projections 4a are provided at the bottom of the plasma excitation electrode 4, and the shower plate 5 having many holes 7 is in contact with the projection 4a. The plasma excitation electrode 4 and the shower plate 5 define a space 6. A gas feeding tube 17 is connected to the space 6. The gas feeding tube 17 is composed of a conductor, and is provided with an insulator 17a in a midway portion thereof to insulate between the plasma excitation electrode 4 and the gas supply source.

The gas from the gas feeding tube 17 is fed into a chamber space 60 defined by a chamber wall 10 via the holes 7 of the shower plate 5. The chamber wall 10 and the plasma excitation electrode 4 are insulated from each other by an insulator 9. The exhaust system is not shown in the drawing.

Also, the susceptor electrode 8 for holding the substrate 16 and for exciting a plasma is disposed in the chamber space 60.

An upper chamber wall 10a is provided on the entire top of the chamber wall 10 and is separable from the chamber wall 10. A sealing means such as an O-ring (not shown in the drawing) is provided between the upper chamber wall 10a and the chamber wall 10 to secure hermetic sealing therebetween. The upper chamber wall 10a is integrated with the bottom of the side wall of the chassis 21, thus the upper chamber wall 10a and the chassis 21 having the same DC potential.

Referring to FIG. 3, the upper chamber wall 10a, the plasma excitation electrode 4, the shower plate 5, the insulator 9, the chassis 21, and the gas feeding tube 17 constitute the upper component 19. The upper component 19 is separable from the lower structure including the chamber wall 10, the susceptor electrode 8 and the like. That is, the upper component 19 can turn on an stator such as a hinge (not shown in the drawing) provided on the chamber wall 10 to open the chamber space 60.

The susceptor electrode 8 has a disk shape. The susceptor electrode 8 is supported by a shaft 13 extending through a chamber bottom 10A. The bottom end portion of the shaft 13 and the central portion of the chamber bottom 10A are hermetically sealed by a bellows 11. The susceptor electrode 8 and the shaft 13 are vertically movable by the bellows 11 to adjust the distance between the plasma excitation electrode 4 and the susceptor electrode 8.

The susceptor electrode 8 is connected to the shaft 13, and the shaft 13 is connected to the bellows 11 which is connected to the chamber wall 10. Thus, the susceptor electrode 8, the shaft 13, the bellows 11, the chamber bottom 10A, the chamber wall 10, and the upper chamber wall 10a have the same potential. Because the chamber wall 10, the upper chamber wall 10a, and the chassis 21 are connected to each other, the chamber wall 10, the upper chamber wall 10a, the chassis 21, and the matching circuit 2A have the same DC potential.

Herein, the matching circuit 2A is provided with a plurality of passive elements in many cases in order to adjust the impedance of the chamber space 60 in response to a change in the state of the plasma.

Referring to FIGS. 1 and 2, the matching circuit 2A has passive elements, namely, a coil 23 and a tuning capacitor 24 connected in series between the radiofrequency generator 1 and the feed plate 3, and a load capacitor 22 connected in parallel with the coil 23 and the tuning capacitor 24. One end of the load capacitor 22 is coupled to the matching box 2. The tuning capacitor 24 is connected to the plasma excitation electrode 4 via the feed plate 3.

The matching box 2 is connected to a shielding line of a feed line 1A of a coaxial cable, and the shielding line is DC-grounded. Thus, the susceptor electrode 8, the shaft 13, the bellows 11, the chamber bottom 10A, the chamber wall 10, the chassis 21, and the matching box 2 are set to a ground potential. Also, one end of the load capacitor 22 is grounded.

Figure 4:
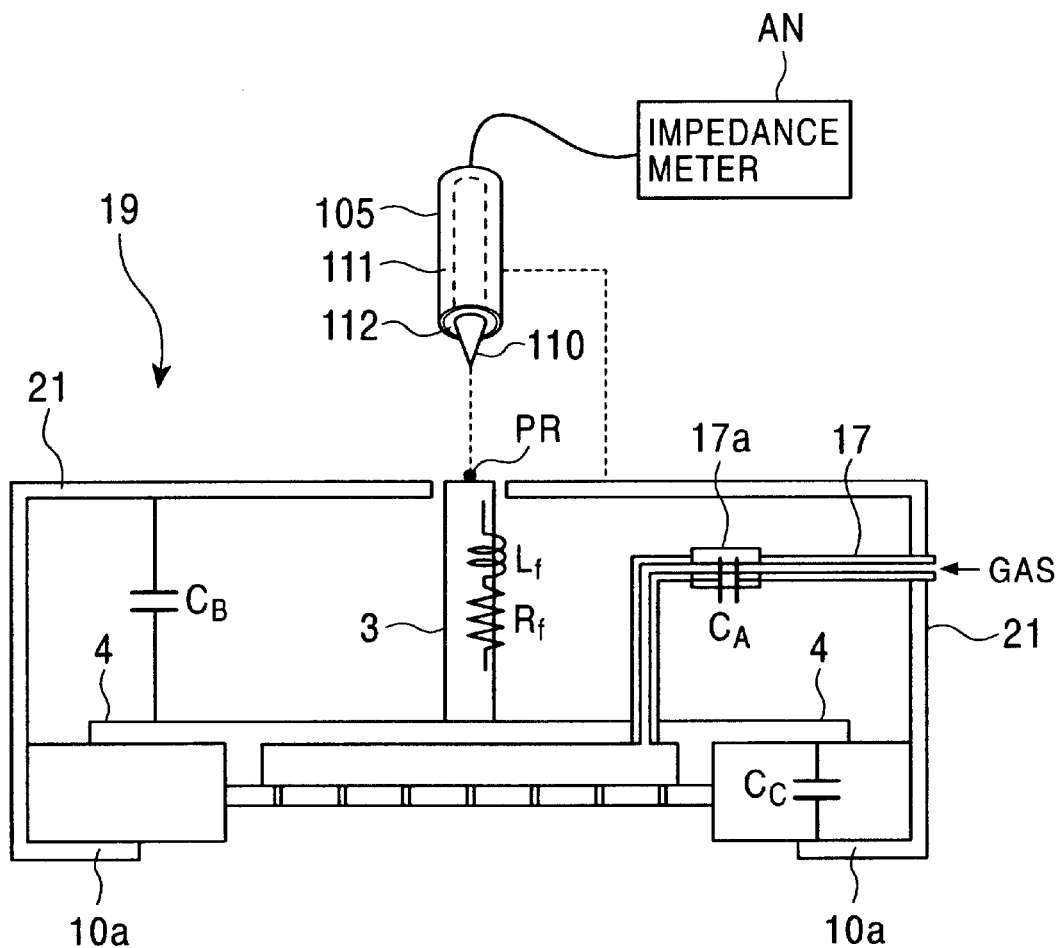
FIG. 4 is a schematic view explaining the loss capacitance $C_X$ of the upper component of the plasma processing chamber shown in FIG. 3.
Figure 5:
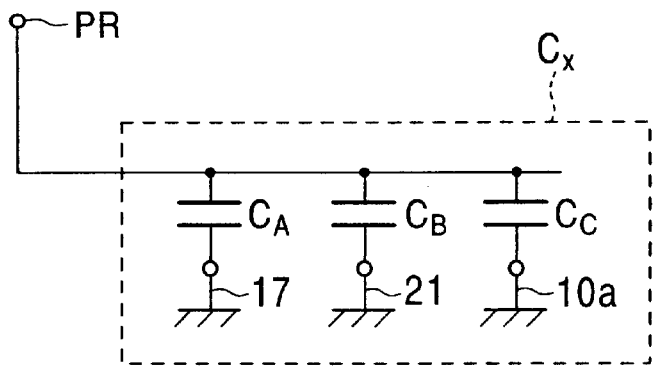
FIG. 5 is an equivalent circuit diagram illustrating the loss capacitance $C_X$ of the upper component shown in FIG. 4.

The plasma electrode capacitance $C_e$ and the loss capacitance $C_X$ in the plasma processing chamber 75 of this embodiment will now be described. FIG. 4 is a schematic view explaining the loss capacitance $C_X$ of the upper component of the plasma processing chamber 75, and FIG. 5 is an equivalent circuit diagram of the upper component shown in FIG. 4.

The plasma electrode capacitance $C_e$ is a capacitance between the parallel plate electrodes 4 and 8, namely, the plasma excitation electrode 4 and the susceptor electrode 8, and is defined by the areas of and the distance between these electrodes 4 and 8.

The loss capacitance $C_X$ is the sum of the capacitor components for currents which flow in regions other than the path from the plasma excitation electrode 4 to the susceptor electrode 8. That is, the loss capacitance $C_X$ is the sum of the capacitor components between the plasma excitation electrode 4 and individual ground potential positions which are DC grounded. Herein, the ground potential positions are components at the ground potential other than the susceptor electrode 8 of the plasma processing chamber 75. That is, the ground potential positions include the shaft 13, the bellows 11, the chamber bottom 10A, the chamber wall 10, the upper chamber wall 10a, the chassis 21, the matching box 2, the gas feeding tube 17, and the sheath line of the radiofrequency power feed line 1A. Specifically, as shown in FIG. 4, the gas feeding tube 17, the chassis 21, the upper chamber wall 10a are taken into consideration as the loss capacitance $C_X$ at the portions opposing the plasma excitation electrode 4. The loss capacitance $C_X$ is defined by the sum of the capacitance $C_A$ between the plasma excitation electrode 4 and the gas feeding tube 17 separated by the insulator 17a, the capacitance $C_B$ between the plasma excitation electrode 4 and the chassis 21, and the capacitance $C_C$ between the plasma excitation electrode 4 and the upper chamber wall 10a.

As shown in FIG. 4, the loss capacitance $C_X$ can be regarded as a capacitor component which is generated by the plasma excitation electrode 4 in the upper component 19 which is electrically separated from the plasma processing chamber 75.

In practice, as shown in FIG. 3, the loss capacitance $C_X$ is measured at an output terminal position PR corresponding to the output terminal of the matching circuit 2A in the upper component 19 which is separated from the plasma processing chamber 75 (a separated state). Herein, the separated state represents that the upper component 19 is separated, for example, by being rotated on a hinge or the like to open the chamber space 60. Thus, in the separated state, the capacitance between the plasma excitation electrode 4 and the susceptor electrode 8 is in an unmeasured state, and the upper component 19 is not physically connected to the chamber wall 10.

In this embodiment, the loss capacitance $C_X$ in the upper component 19 is measured in a state in which the output terminal of the passive element at the final stage of the matching circuit 2A is separated from the upper component 19. That is, as shown in FIG. 4, the matching circuit 2A is separated from the upper component 19 at the output terminal position PR of the tuning capacitor 24 which was connected to the feed plate 3 with the screws, and then the loss capacitance $C_X$ is measured.

As shown by broken lines in FIG. 4, a probe 105 of an impedance meter AN is connected to the free output terminal position PR and a grounded position, for example, the chassis 21 of the upper component 19. The probe 105 includes a lead wire 110, an insulating sheath 112 shielding the lead wire 110, and an outer conductor 111 covering the insulating sheath 112. The probe 105 is connected to the impedance meter AN via a coaxial cable. The lead wire 110 of the probe 105 is connected to the output terminal position PR and the outer conductor 111 is connected to the grounded position in the upper center of the chassis 21. The impedance meter may be replaced with an LCR meter measured at a fixed frequency or a tester provided with a capacitance measuring unit.

The following radiofrequency components are thereby measured as the loss capacitance $C_X$:

The capacitance $C_A$ between the plasma excitation electrode 4 and the gas feeding tube 17 separated by the insulator 17a;

The capacitance $C_B$ between the plasma excitation electrode 4 and the chassis 21; and The capacitance $C_C$ between the plasma excitation electrode 4 and the upper chamber wall 10a.

In the plasma processing chamber 75 of this embodiment, the plasma electrode capacitance $C_e$ and the loss capacitance $C_X$ are set such that 26 times the plasma electrode capacitance $C_e$ is greater than the loss capacitance $C_X$.

The plasma electrode capacitance $C_e$ and the loss capacitance $C_X$ are set, for example, as follows:

(1) Adjusting the distance between and the areas of the plasma excitation electrode 4 and the susceptor electrode 8;

(2) Adjusting the overlap area of the plasma excitation electrode 4 and the upper chamber wall 10a;

(3) Adjusting the material characteristics of the plasma excitation electrode 4 and the upper chamber wall 10a;

(4) Adjusting the thickness of the insulator provided between the plasma excitation electrode 4 and the upper chamber wall 10a;

(5) Adjusting the distance between and the areas of the plasma excitation electrode 4 and the chassis 21;

(6) Adjusting the material characteristics of the insulator 17a in the gas feeding tube 17; and (7) Adjusting the length of the insulator 17a.

In the plasma processing chamber 75 of this embodiment, the upper component 19 is connected to the chamber wall 10, whereas the matching circuit 2A, the matching box 2, the radiofrequency power feed line 1A, and the radiofrequency generator 1 are connected to predetermined positions. A power of 13.56 MHz or more, for example, 13.56 MHz, 27.12 MHz, or 40.68 MHz is supplied from the radiofrequency generator 1 to generate a plasma between the parallel plate electrodes 4 and 8. Using the plasma, a plasma treatment, such as a chemical vapor deposition (CVD) treatment, a sputtering treatment, a dry etching treatment, or an ashing treatment, is performed on the substrate 16 held on the susceptor electrode 8.

The radiofrequency current supplied from the radiofrequency generator 1 flows through the coaxial cable of the radiofrequency power feed line 1A, the matching circuit 2A, the feed plate 3, and the plasma excitation electrode 4. The radiofrequency current further flows through the chamber space 60, the susceptor electrode 8, the shaft 13, the bellows 11, the chamber bottom 10A, the chamber wall 10, and the upper chamber wall 10a. The current then returns the ground of the radiofrequency generator 1 via the chassis 21, the matching box 2, and the shielding line of the radiofrequency power feed line 1A.

Figure 6:
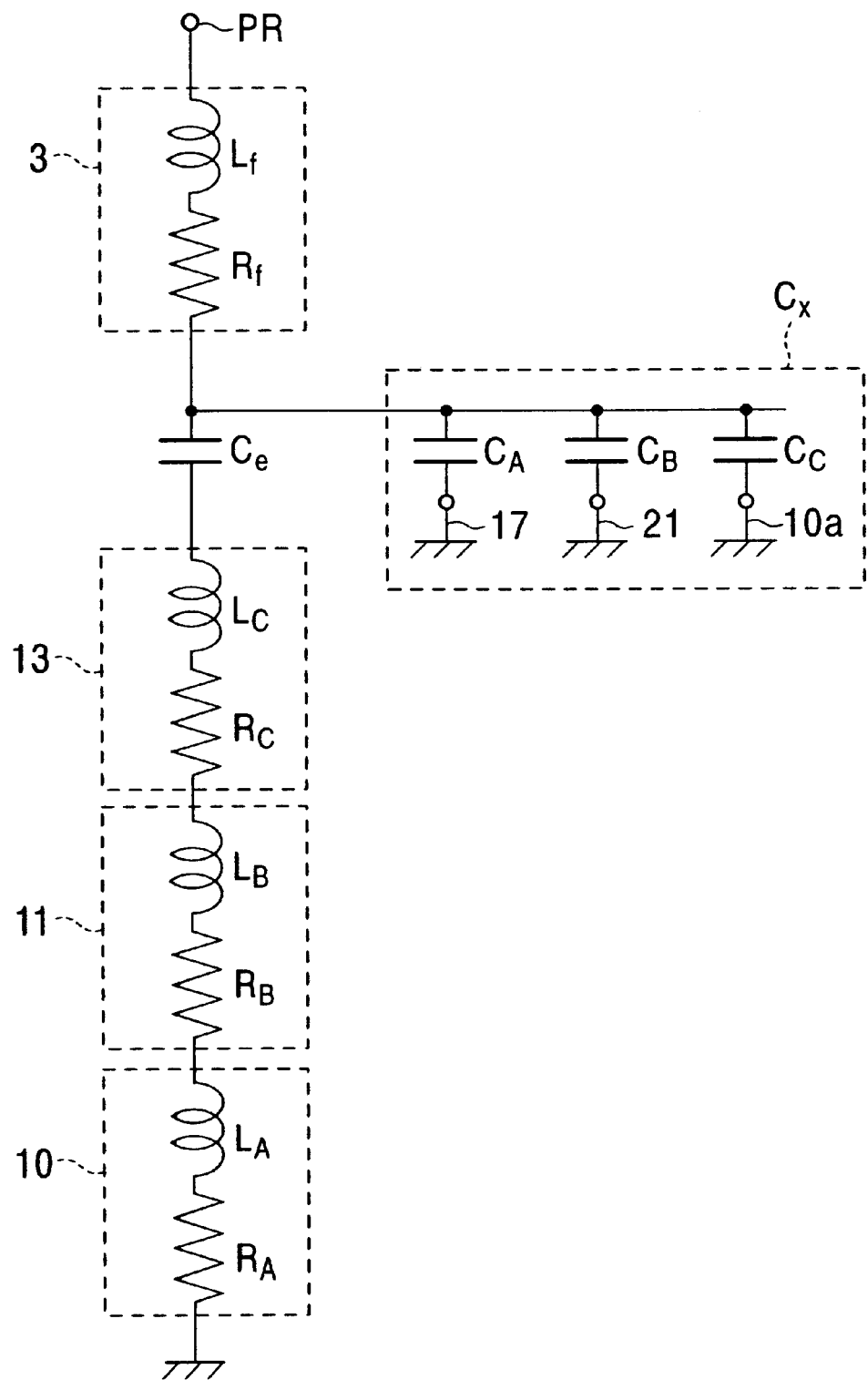
FIG. 6 is an equivalent circuit diagram illustrating the impedance characteristics of the plasma processing chamber shown in FIG. 1.
Figure 7:
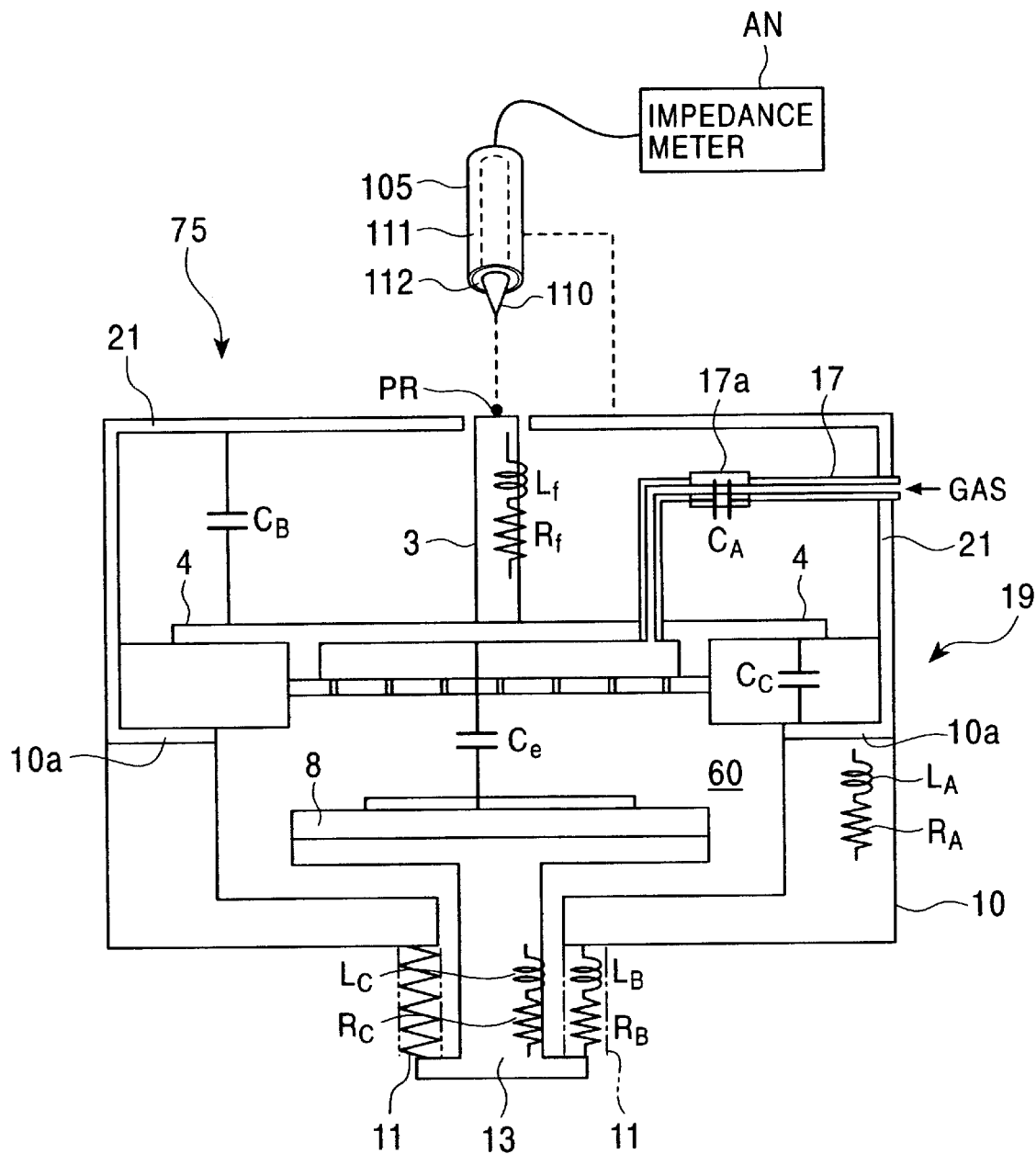
FIG. 7 is a schematic view of the plasma processing chamber represented by the equivalent circuit diagram shown in FIG. 6.

Referring FIGS. 6 and 7, the following radiofrequency factors in the above measuring region will affect the circuit of the radiofrequency current which is supplied for plasma generation:

The inductance $L_f$ and resistance $R_f$ of the feed plate 3;

The plasma electrode capacitance $C_e$ between the plasma excitation electrode 4 and the susceptor electrode 8;

The inductance $L_C$ and resistance $R_C$ of the shaft 13;

The inductance $L_B$ and resistance $R_B$ of the bellows 11;

The inductance $L_A$ and resistance $R_A$ of the chamber wall 10;

The capacitance $C_A$ between the gas feeding tube 17 and the plasma excitation electrode 4 separated by the insulator 17a;

The capacitance $C_B$ between the plasma excitation electrode 4 and the chassis 21; and The capacitance $C_C$ between the plasma excitation electrode 4 and the chamber wall 10.

Figure 8:
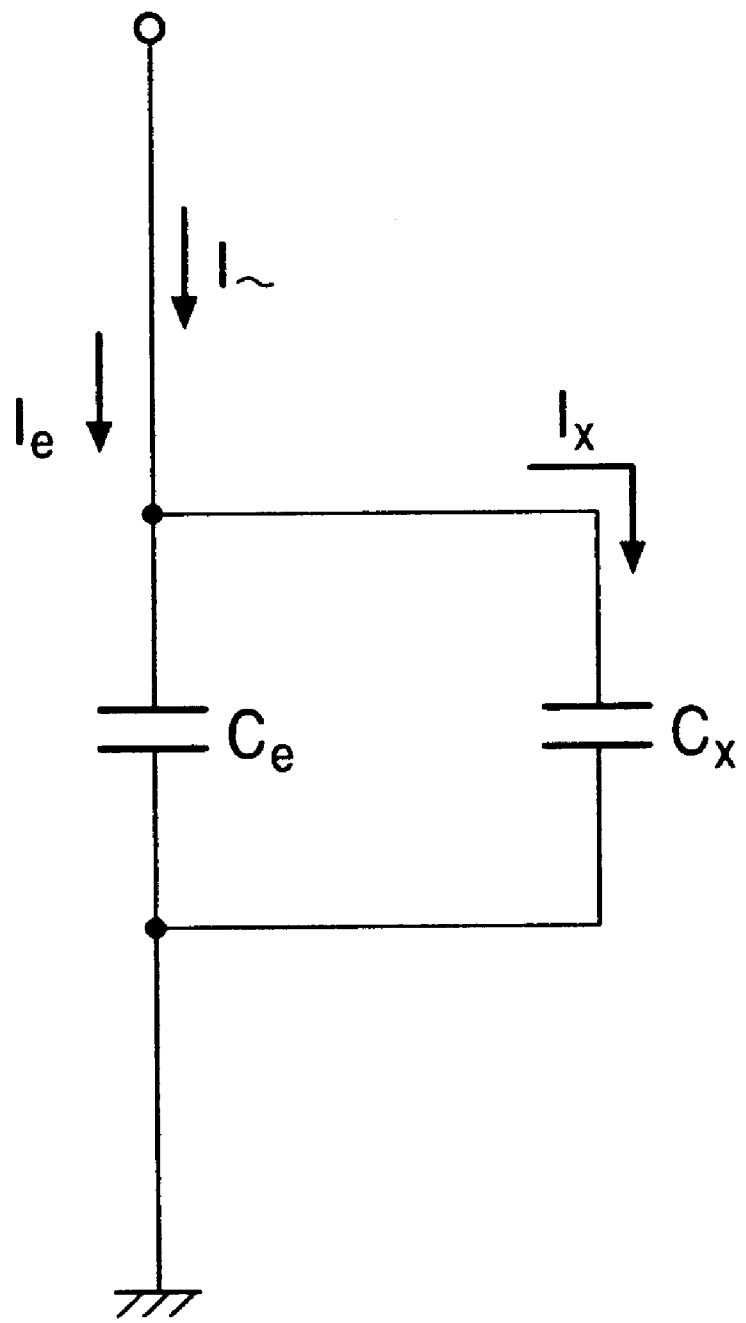
FIG. 8 is a circuit diagram illustrating the relationship between a supplied current $I_-$, a plasma current $I_e$, and a loss current $I_x$.

As shown in FIG. 6, these radiofrequency factors are arranged to form an equivalent circuit so that the inductance $L_f$ and resistance $R_f$ of the feed plate 3, the plasma electrode capacitance $C_e$ between the plasma excitation electrode 4 and the susceptor electrode 8, the inductance $L_C$ and resistance $R_C$ of the shaft 13, the inductance $L_B$ and resistance $R_B$ of the bellows 11, and the inductance $L_A$ and resistance $R_A$ of the chamber wall 10 are connected in series in that order while the resistance $R_A$ being grounded. Moreover, the capacitance $C_A$, the capacitance $C_B$, and the capacitance $C_C$ are connected in parallel between the resistance $R_f$ and the plasma electrode capacitance $C_e$, one end of each being grounded. In this equivalent circuit, as shown in FIG. 8, the current $I_-$ supplied from the radiofrequency generator 1 is divided into a plasma current $I_e$ flowing between the parallel plate electrodes 4 and 8 constituting the plasma electrode capacitance $C_e$ and a loss current $I_x$ which is a shunt component flowing into the other portions.

$$I_- = I_e + I_x \quad (14)$$

Since 26 times the plasma electrode capacitance $C_e$ is greater than the loss capacitance $C_X$ in the circuit of the plasma processing chamber 75 as described above, the impedance of the plasma excitation electrode 4 and the ground potential positions 17, 21, and 10a become larger than the impedance between the plasma excitation electrode 4 and the susceptor electrode 8. Supposing the imaginary unit being j (j²=−1) and the angular frequency being ω (ω=2πf_e wherein fe is a power frequency), the impedance Z (Ω) is represented by relationship (11):

$$Z = -j/\omega C \quad (11)$$

wherein C is the capacitance. Thus, the impedance can be determined by defining the capacitance. Since the current I is in inverse proportion to the impedance Z (Ω), an increase in the loss current $I_x$ relative to the plasma current $I_e$ can be suppressed.

Even when a power frequency $f_e$ which is higher than 13.56 MHz being a generally used frequency is supplied, the proportion of the plasma current $I_e$ fed in the plasma space is increased.

Since 26 times the plasma electrode capacitance $C_e$ is greater than the loss capacitance $C_X$, the shunt components other than the current flowing in the parallel plate electrodes 4 and 8 among the current $I_-$ supplied from the radiofrequency generator 1 can be controlled. Thus, the power can be effectively fed into the plasma space, and the effective power consumption in the plasma space is achieved compared with conventional plasma processing apparatuses when the same frequency is supplied. In a layer deposition process, the deposition rate will be improved. By setting the plasma electrode capacitance $C_e$ and the loss capacitance $C_X$ to the above-described range, the overall radiofrequency characteristics of the actual apparatus can be controlled. Since such a control generates a stable plasma, the plasma processing apparatus exhibits a stable operation.

Since the loss current $I_x$ is reduced, the effective power consumption in the plasma space is improved compared with conventional plasma processing apparatuses.

The improved power consumption in the plasma space contributes to uniform planar plasma processing on the substrate 16, for example, the formation of a layer having a uniform thickness in a layer deposition process. The improved power consumption in the plasma space also results in improved layer characteristics, such as isolation voltage, etching resistance to etching solutions, and density or hardness of the deposited layer. Herein, the layer density is represented by, for example, the etching resistance in a BHF solution.

Furthermore, in the plasma processing apparatus of this embodiment, a layer can be formed or treated by reduced electrical power at the same treatment rate and with the same layer characteristics compared with conventional plasma processing apparatuses, resulting in reduced operational costs, improved productivity, and reduced operation period. Accordingly, carbon dioxide emission is reduced.

According to the inspection method of this embodiment, the operation of the plasma processing apparatus can be inspected and evaluated for a short period by opening the upper component 19 in situ and measuring the loss capacitance $C_X$ with the impedance meter AN. Accordingly, this inspection method does not require a shutdown of the production line for several days to several weeks to check and evaluate the operation of the plasma processing apparatus by actually depositing layers on substrates. The production line, therefore, has high productivity.

Since the plasma electrode capacitance $C_e$ and the loss capacitance $C_X$ are radiofrequency characteristics mainly depending on the mechanical structure, thus the individual plasma processing chambers have different values. By controlling the plasma electrode capacitance $C_e$ and the loss capacitance $C_X$ to the above-described conditions, the overall radiofrequency characteristics of the plasma chambers can be optimized, achieving stable plasma generation. Consequently, the plasma processing apparatus exhibits improved operation stability.

In this inspection method, only the capacitance among the radiofrequency characteristics is measured; hence, an inexpensive measuring meter, such as an LCR meter measured at a fixed frequency or a tester having a capacitance measuring unit, can be used.

In this embodiment, the loss capacitance $C_X$ may be determined by the following procedure instead of the above procedure. The plasma electrode capacitance $C_e$ can be calculated based on the shape and size of the two parallel plate electrodes. On the other hand, the overall capacitance $C_T$ of the plasma processing chamber is measured at the above-described measuring point without disconnecting the upper component from the plasma processing chamber. Thus, the loss capacitance $C_X$ can be calculated from the overall capacitance $C_T$ and the plasma electrode capacitance $C_e$.

Second Embodiment

A plasma processing apparatus, a performance validation system and an inspection method thereof in accordance with a second embodiment will now be described with reference to the attached drawings.

Figure 9:
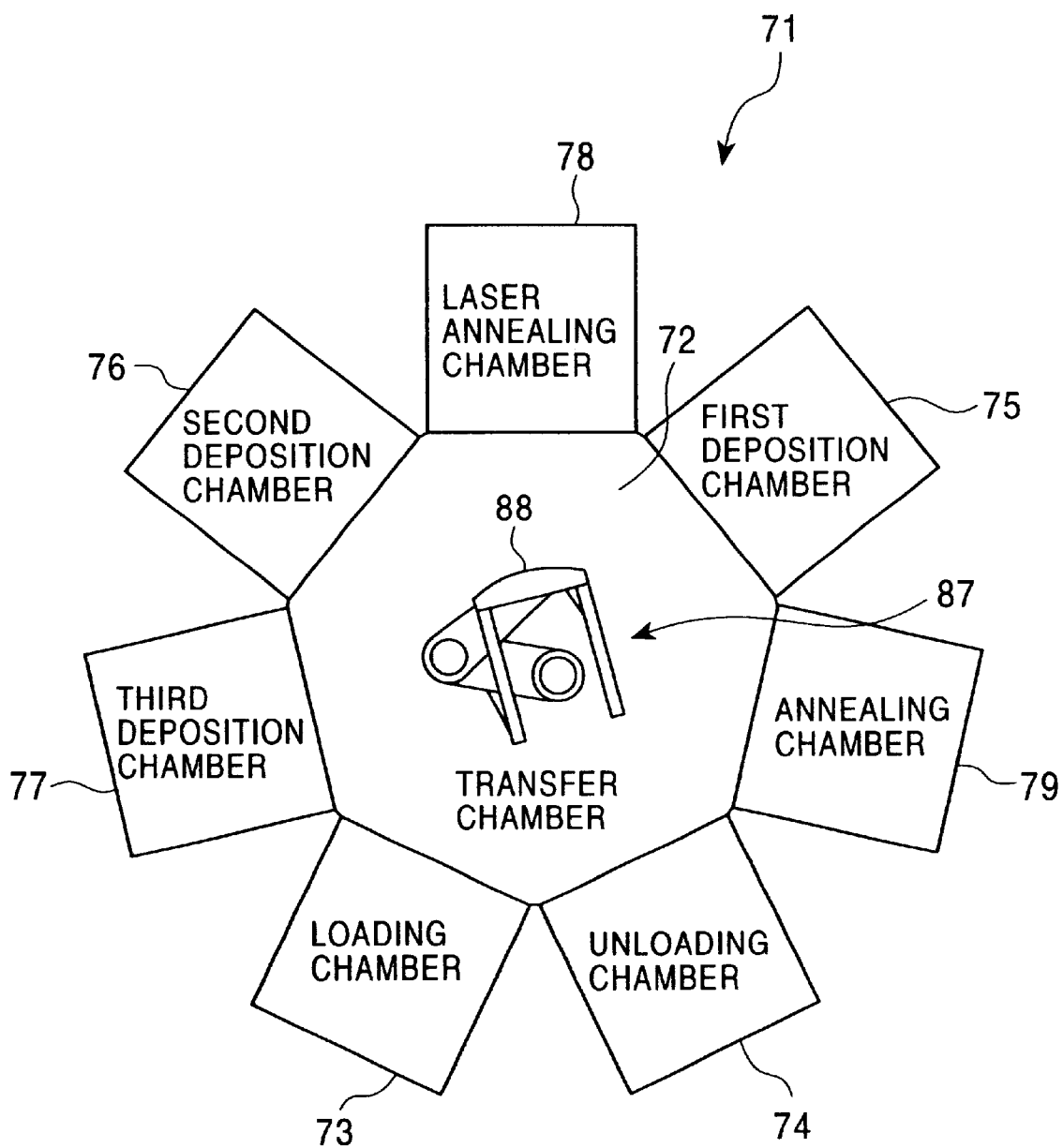
FIG. 9 is a schematic view of a plasma processing apparatus in accordance with a second embodiment of the present invention.

FIG. 9 is a schematic view of a plasma processing apparatus 71 of this embodiment. This plasma processing apparatus 71 has a plurality of processing chamber units which permit a consecutive treatment of, for example, from the deposition a polycrystalline silicon layer which functions as a semiconductor active layer to the deposition of the gate insulating layer in a top-gate TFT.

In this plasma processing apparatus 71, five processing chamber units, one loading chamber 73, and one unloading chamber 74 are continuously arranged around a substantially heptagonal transfer chamber 72. The five processing chamber units are a first deposition chamber 75 for depositing an amorphous silicon layer, a second deposition chamber 76 for depositing a silicon oxide layer, a third deposition chamber 77 for depositing a silicon nitride layer, a laser annealing chamber 78 for annealing a processed substrate after deposition, and an annealing chamber 79 for performing a heat treatment of the processed substrate.

The first deposition chamber 75, the second deposition chamber 76, and the third deposition chamber 77 have substantially the same configuration as that of the dual-frequency plasma processing apparatus of the first embodiment shown in FIGS. 1 to 8 and may perform different treatments for forming different layers or the same treatment using the same recipe.

In this embodiment, a variation between the maximum $C_{emax}$ and the minimum $C_{emin}$ among the plasma electrode capacitances $C_e$ of the first to third deposition chambers 75, 76, and 77 is defined by:

$$(C_{emax} - C_{emin})/(C_{emax} + C_{emin}) \quad (12)$$

and is less than 0.1. Moreover, a variation between the maximum $C_{Xmax}$ and the minimum $C_{Xmin}$ among the loss capacitances $C_X$ of these deposition chambers 75 to 77 is defined by:

$$(C_{Xmax} - C_{Xmin})/(C_{Xmax} + C_{Xmin}) \quad (13)$$

and is less than 0.1.

Referring to the first deposition chamber 75, the feature of this embodiment will be described.

The first deposition chamber 75 is of a single-frequency excitation type which can be used for plasma treatments, such as CVD, sputtering, dry etching, and ashing. As in the first embodiment, 7 times the plasma electrode capacitance $C_e$ is greater than the loss capacitance $C_X$.

Similarly, in each of the second deposition chamber 76 and the third deposition chamber 77, 7 times the plasma electrode capacitance $C_e$ is greater than the loss capacitance $C_X$.

In each of the plasma deposition chambers 75 to 77, the plasma electrode capacitance $C_e$ is a capacitance between the plasma excitation electrode 4 and the susceptor electrode 8 and is defined by the areas of and the distance between the plasma excitation electrode 4 and the susceptor electrode 8.

The loss capacitance $C_X$ is the sum of the capacitor components for currents which flow in regions other than the path from the plasma excitation electrode 4 to the susceptor electrode 8. That is, the loss capacitance $C_X$ is the sum of the capacitor components between the plasma excitation electrode 4 and individual ground potential positions which are grounded. Herein, the individual ground potential positions indicate components at the ground potential other than the susceptor electrode 8 of the plasma processing chamber 75, and include the shaft 13, the bellows 11, the chamber bottom 10A, the chamber wall 10, the upper chamber wall 10a, the chassis 21, the matching box 2, the gas feeding tube 17, and the sheath line of the radiofrequency power feed line 1A. In this embodiment, as shown in FIG. 4, the gas feeding tube 17, the chassis 21, the upper chamber wall 10a are taken into consideration as components which cause loss capacitance $C_X$ in connection with the plasma excitation electrode 4.

Accordingly, the loss capacitance $C_X$ is defined by the sum of the capacitance $C_A$ between the plasma excitation electrode 4 and the gas feeding tube 17 separated by the insulator 17a, the capacitance $C_B$ between the plasma excitation electrode 4 and the chassis 21, and the capacitance $C_C$ between the plasma excitation electrode 4 and the upper chamber wall 10a.

As shown in FIG. 4, the loss capacitance $C_X$ can be regarded as a capacitor component which is generated by the plasma excitation electrode 4 in the upper component 19 which is electrically separated from the plasma processing chamber 75, as in the first embodiment.

In the plasma processing chamber 75 of this embodiment, 7 times the plasma electrode capacitance $C_e$ is greater than the loss capacitance $C_X$.

The plasma electrode capacitance $C_e$ and the loss capacitance $C_X$ may be set according to methods (1) to (7) described in the first embodiment with reference to FIGS. 1 to 8.

The plasma electrode capacitance $C_e$ and the loss capacitance $C_X$ in each of the plasma processing chambers 75, 76, and 77 in this embodiment will now be described. The loss capacitance $C_X$ can be regarded as a capacitor component which is generated by the plasma excitation electrode 4 in the upper component 19, as described above.

It is believed that the plasma electrode capacitance $C_e$ and the loss capacitance $C_X$ are radiofrequency characteristics which mainly depend on the mechanical structure of the apparatus and are slightly different from each other between apparatuses.

Figure 31:
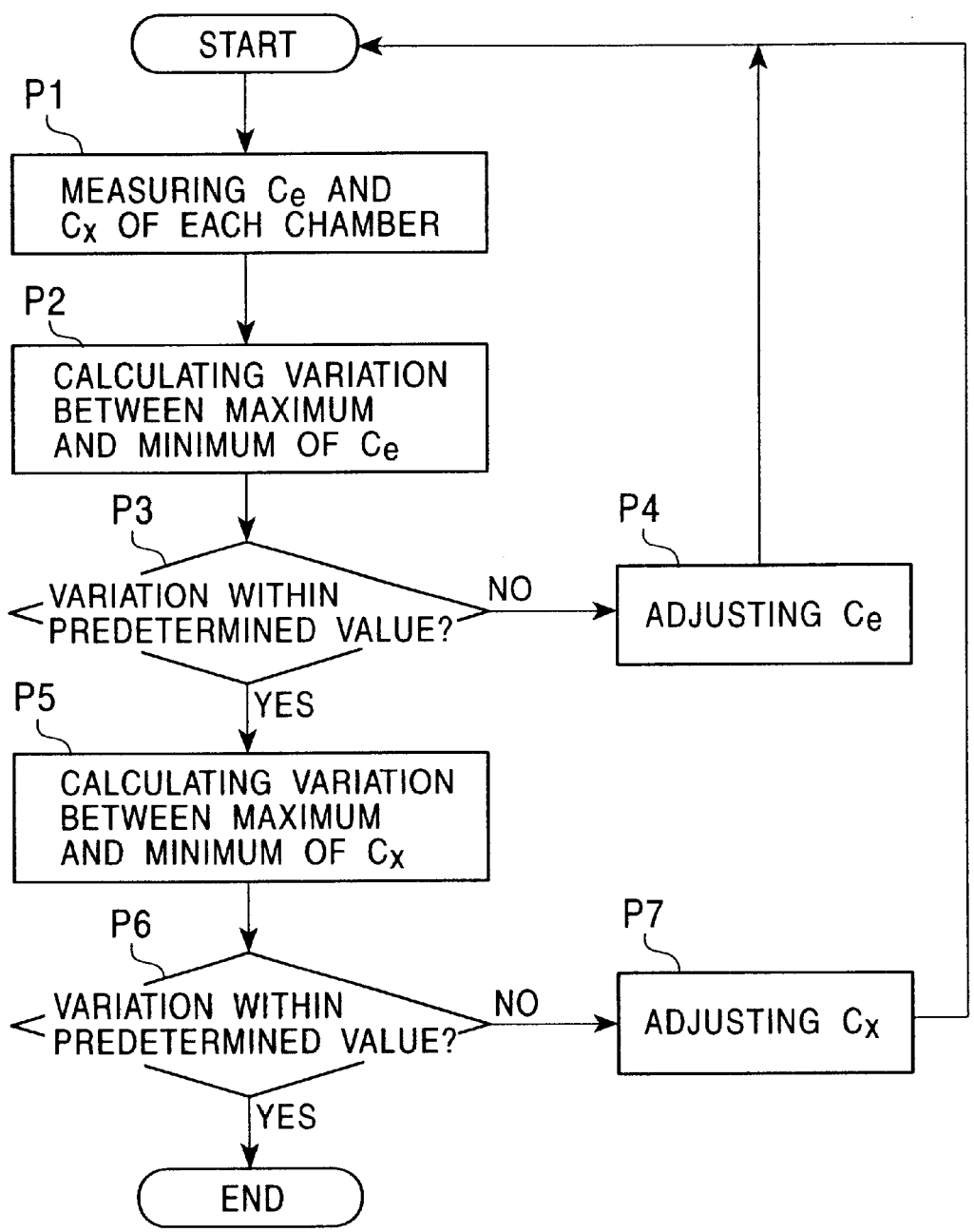
FIG. 31 is a flow chart of an inspection method for a plasma processing apparatus in accordance with the present invention.
Figure 32:
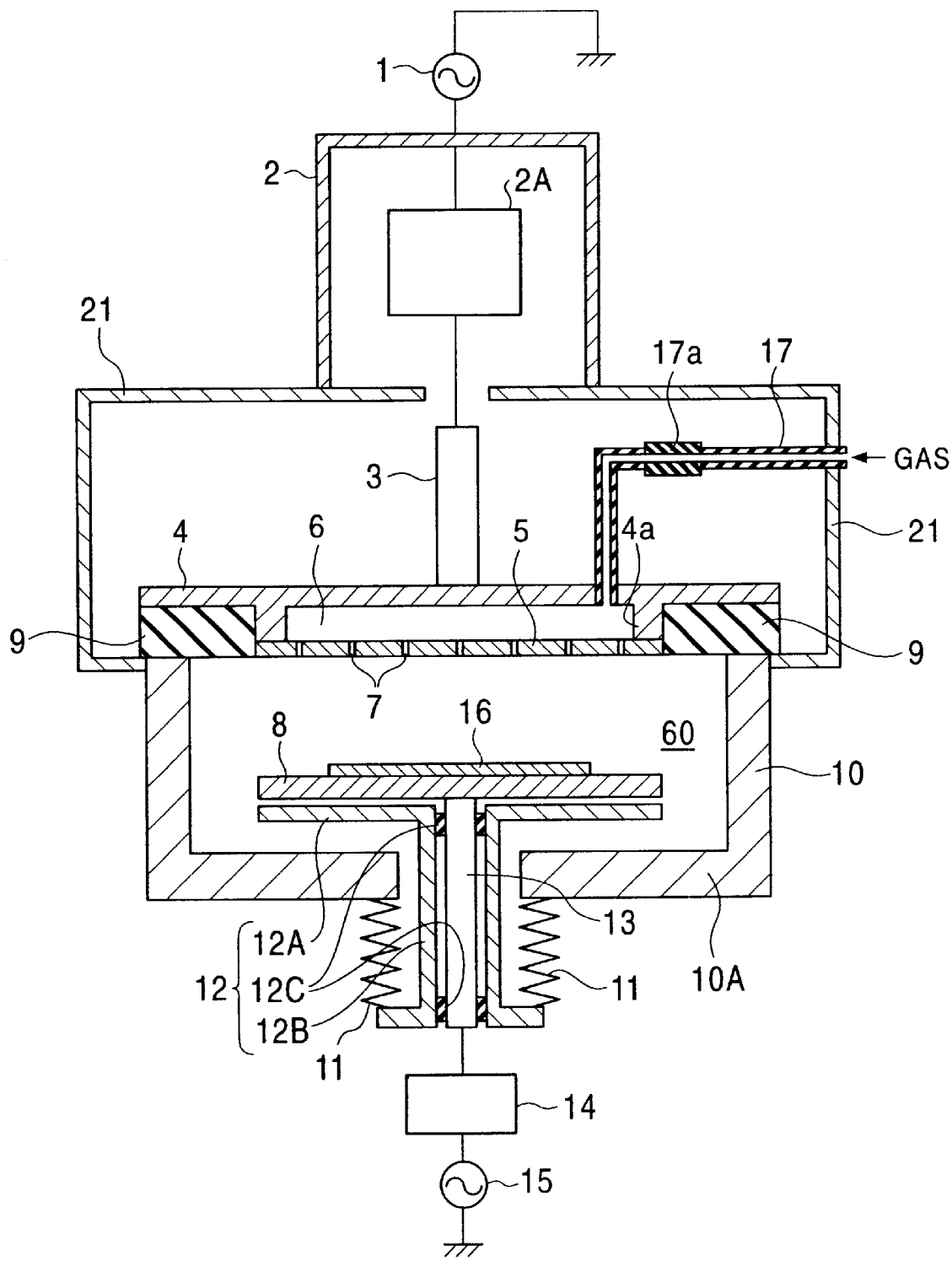
FIG. 32 is a schematic cross-sectional view of a conventional plasma processing apparatus.
Figure 33:
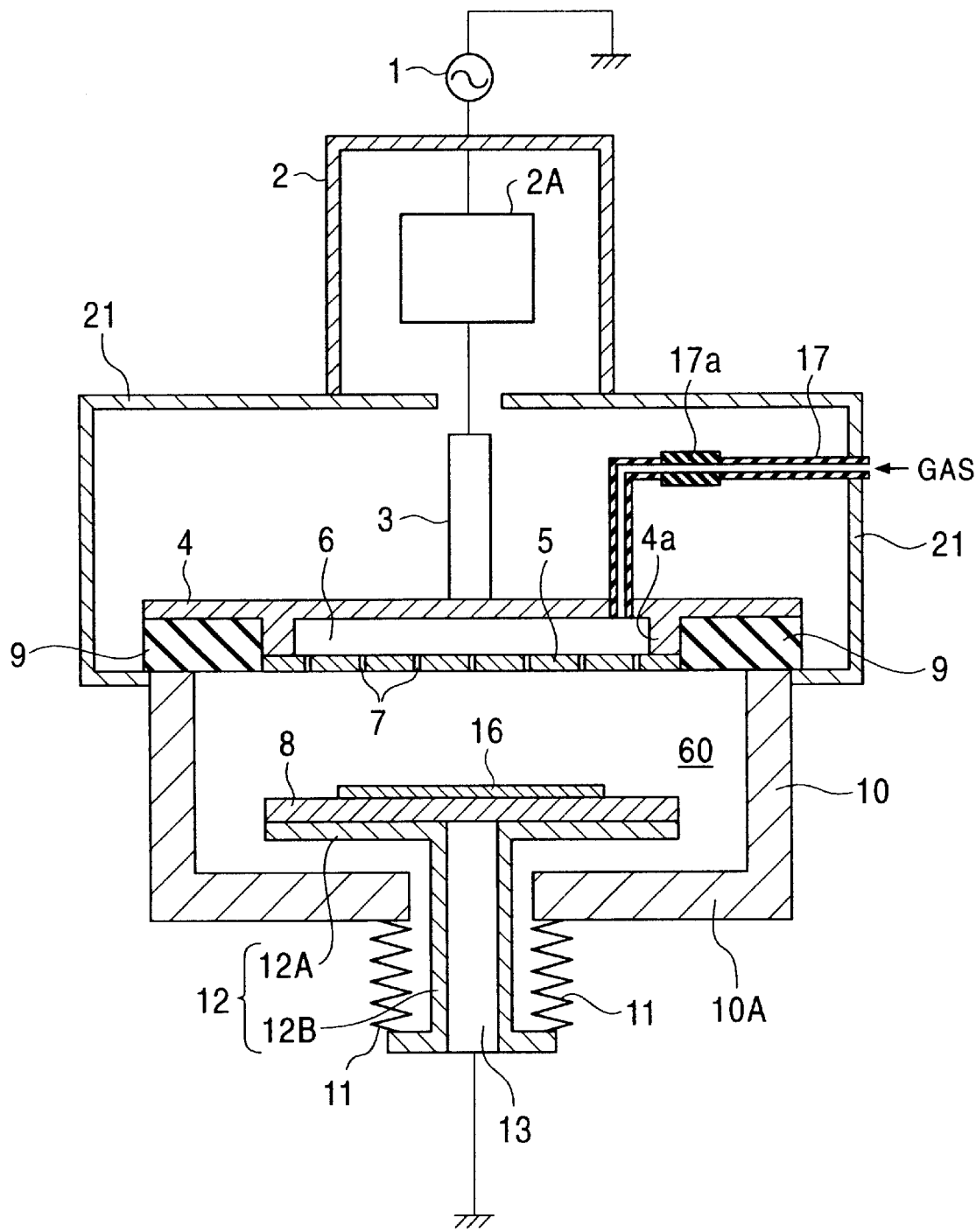
FIG. 33 is a schematic cross-sectional view of another conventional plasma processing apparatus.

A method for controlling the variations of the plasma electrode capacitance $C_e$ and the loss capacitance $C_X$ within a predetermined value will now be described with reference to FIG. 31.

The plasma electrode capacitance $C_e$ and the loss capacitance $C_X$ of each plasma chamber are measured (Step P1). That is, the plasma electrode capacitances $C_{e75}$, $C_{e76}$, and the loss capacitances $C_{e77}$ are and $C_{X75}$, $C_{X76}$, and $C_{X76}$ are measured for the first to third plasma (deposition) chambers 75, 76, and 77, respectively.

The variation of the observed plasma electrode capacitance $C_e$ is defined by relationship (12):

$$(C_{emax}-C_{emin})/(C_{emax}+C_{emin}) \quad (12)$$

wherein $C_{emax}$ and $C_{emin}$ are the maximum and the minimum, respectively, among $C_{e75}$, $C_{e76}$, and $C_{e77}$ (Step P2). The variation represented by relationship (12) is set such that it is less than 0.1 (Steps P3 and P4), according to methods (1) to (7) described in the first embodiment.

Similarly, the variation of the observed loss capacitance $C_X$ is defined by relationship (13):

$$(C_{Xmax}-C_{Xmin})/(C_{Xmax}+C_{Xmin}) \quad (13)$$

wherein $C_{Xmax}$ and $C_{Xmin}$ are the maximum and the minimum, respectively, among $C_{X75}$, $C_{X76}$, and $C_{X77}$ (Step P5). The variation represented by relationship (13) is also is set such that it is less than 0.1 (Steps P6 and P7), according to methods (1) to (7) described in the first embodiment.

In the deposition of the amorphous silicon layer, the silicon oxide layer, and the silicon nitride layer in the processing chambers 75, 76, and 77, respectively, as shown in FIG. 1, a substrate 16 to be treated is placed on a susceptor electrode 8. A radiofrequency voltage is applied to both a plasma excitation electrode 4 and the susceptor electrode 8 from a radiofrequency generator 1, while a reactive gas is supplied from a gas feeding tube 17 into a chamber space 60 through a shower plate 6 to generate a plasma. The target layer is thereby formed on the substrate 16.

Figure 10:
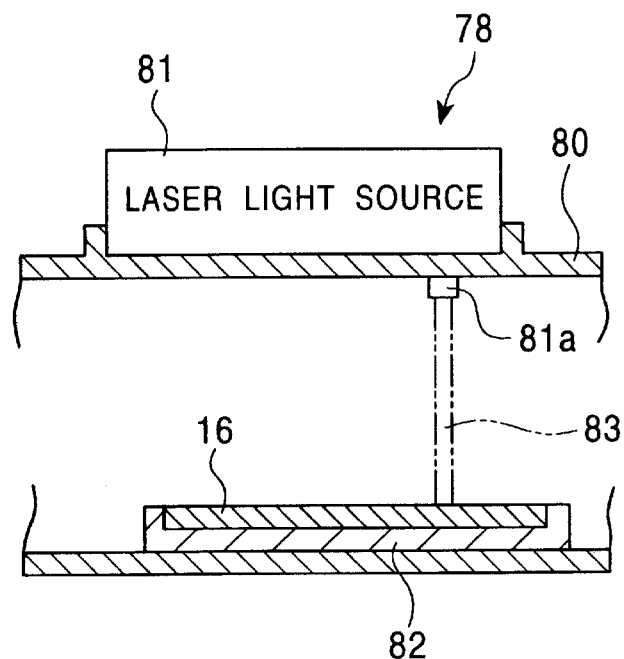
FIG. 10 is a longitudinal cross-sectional view of a laser annealing chamber shown in FIG. 9.

Referring to FIG. 10, the laser annealing chamber 78 is provided with a laser light source 81 on the upper wall 80 and a stage 82 for placing the substrate 16 on the bottom wall of the chamber. The stage 82 is horizontally movable in the orthogonal X and Y directions. Spot laser light 83 (shown by chain lines) is emitted from an aperture 81a of a laser light source 81, while the stage 82 holding the substrate 16 horizontally moves in the X and Y directions so that the laser light 83 scans the entire surface of the substrate 16. Examples of the laser light sources 81 are gas lasers using halogen gases, such as XeCl, ArF, ArCl, and XeF.

The laser annealing chamber 78 may have any configuration as long as the spot laser beam from the laser light source can scan the entire surface of the substrate to be treated. Also, in this case, gas lasers using halogen gases, such as XeCl, ArF, ArCl, and XeF can be used as laser light sources. Alternatively, other laser light sources such as a YAG laser may be used depending on the type of the layer to be annealed. Laser annealing may be pulsed laser annealing or continuously oscillating laser annealing. The annealing chamber may have a configuration of, for example, a multistage electrical furnace type.

Figure 11:
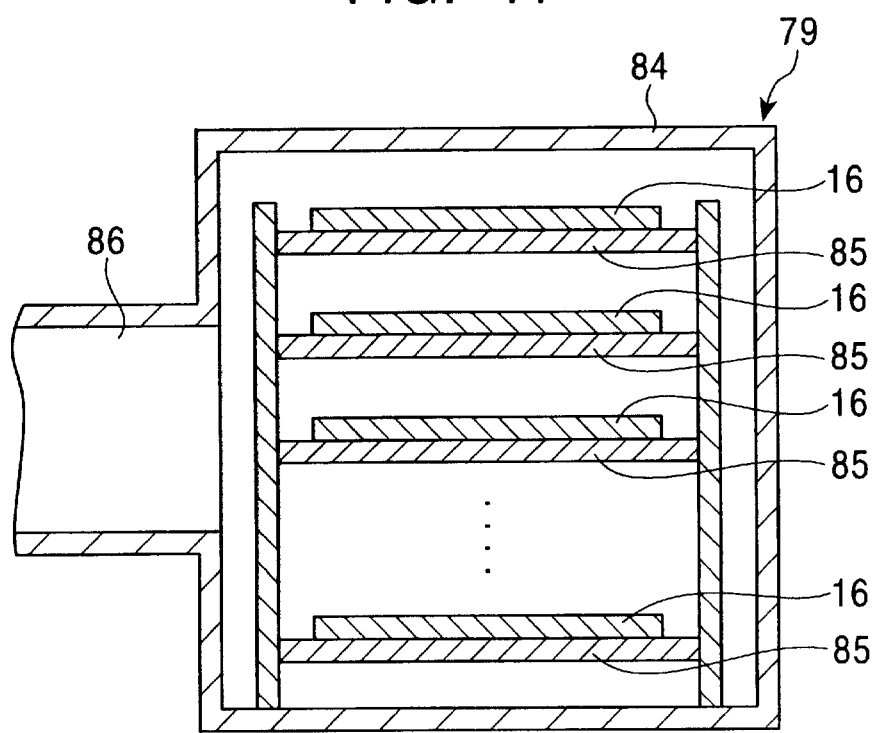
FIG. 11 is a longitudinal cross-sectional view of an annealing chamber shown in FIG. 9.

Referring to FIG. 11, the annealing chamber 79 is of a multistage electrical furnace type. In the annealing chamber 79, a plurality of substrates 16 is placed on heaters 85 which are vertically arranged in the chamber. These heaters 85 are energized to heat the substrates 16. A gate valve 86 is provided between the annealing chamber 79 and the transfer chamber 72.

Referring to FIG. 9, the loading chamber 73 and the unloading chamber 74 are provided with a loading cassette and an unloading cassette, respectively, which are detachable from these chambers. These cassettes can contain a plurality of substrates 16, that is, the loading cassette contains unprocessed substrates 16 whereas the unloading cassette contains processed substrates 16. A transfer robot 87 for transferring the substrates 16 is placed in the transfer chamber 72 which is surrounded by the processing chamber units, the loading chamber 73, and the unloading chamber 74. The transfer robot 87 is provided with an arm 88 thereon. The arm 88 has an expandable and shrinkable link mechanism and can rotate and vertically move. The substrate 16 is supported and transferred by the end of the arm 88.

In this plasma processing apparatus 71, the operations of the processing chamber units are automatically controlled by a control section, whereas various processing conditions, such as layer deposition conditions, annealing conditions, and heating conditions, and process sequences are controlled by an operator. In the operation of the plasma processing apparatus 71, untreated substrates 16 are set on the loading cassette, and are transferred from the loading cassette into each processing chamber by the transfer robot 87 based on the starting operation by the operator. After the substrates 16 are automatically and sequentially processed in each chamber, the substrates 16 are placed onto the unloading cassette by the transfer robot 87.

In the plasma processing apparatus 71 and the inspection method thereof in this embodiment, 7 times the plasma electrode capacitance $C_e$ which is measured at an output terminal position PR of the matching circuit 2A is greater than the loss capacitance $C_X$ in each of the plasma processing chambers 75, 76, and 77 so as to decrease a shunt radiofrequency current which flows into the ground potential positions, namely, the gas feeding tube 17, the chassis 21, and the upper chamber wall 10a. In such a condition, the plasma density which is generated in the plasma space is further increased due to effective power consumption, resulting in a further improved processing rate. In particular, the deposition rate is further increased in a deposition process in the plasma processing chambers 75, 76, and 77. The effective power consumption in the plasma space also results in improvement in characteristics of the deposited layer. When an insulating layer is deposited, the resulting layer will have high isolation voltage. The plasma current $I_e$ from the radiofrequency generator 1 can be concentrated between the plasma excitation electrode 4 and the susceptor electrode 8. Thus, the deposited layer has uniform characteristics in the planar direction, for example, a uniform thickness and isolation voltage in the planar direction.

In the plasma processing apparatus 71 and the inspection method of this embodiment, the variation between the maximum plasma electrode capacitance $C_{emax}$ and the minimum plasma electrode capacitance $C_{emin}$ is defined by relationship (12) and is set such that it is less than 0.1. Also, the variation between the maximum loss capacitance $C_{Xmax}$ and the minimum loss capacitance $C_{Xmin}$ is defined by relationship (13) and is set such that it is less than 0.1. Differences in radiofrequency characteristics between the plasma processing chambers 75, 76, and 77 can thereby be eliminated. Since these plasma processing chambers 75, 76, and 77 can be maintained within a predetermined control range using an impedance parameter, these plasma processing chambers 75, 76, and 77 consume substantially the same power in the plasma spaces thereof.

Accordingly, substantially the same result is achieved from a single process recipe for these different processing chambers 75, 76, and 77. When layers are formed in these processing chambers 75, 76, and 77, these layers can have substantially the same characteristics, e.g., the thickness, the isolation voltage, and the etching rate. When the variations in capacitance are controlled to be less than 0.1 under the same deposition conditions in the plasma chambers 75, 76, and 77, the variation in layer thickness can be controlled to be less than ±5%.

As a result, the overall radiofrequency characteristics of the plasma processing apparatus 71 can be optimized so as to generate a stable plasma. Thus, the operations of the processing chambers 75, 76, and 77 of the plasma processing apparatus 71 are stable and uniform.

In layer deposition treatments such as a plasma-enhanced CVD process and a sputtering process, layers having improved characteristics, e.g., a high isolation voltage, etching resistance in etching solutions, and layer hardness or density, can be obtained without variations between the plasma processing chambers 75, 76, and 77. Herein, the layer density is represented by, for example, the etching resistance in a BHF solution.

Thus, the overall radiofrequency characteristics of the plasma processing apparatus 71 can be controlled to generate a stable plasma in each processing chamber, unlike conventional plasma processing apparatus.

The above-mentioned method does not require a determination of process conditions by the relationships between enormous amounts of data on these processing chambers 75, 76, and 77 and the results obtained by evaluation of actually processed substrates.

Thus, in installation of new systems and inspection of installed systems, the time required for obtaining substantially the same results using the same process recipe in these processing chambers 75, 76, and 77 can be significantly reduced by measuring the plasma electrode capacitance $C_e$ and the loss capacitance $C_X$ compared with an inspection method by actual deposition onto the substrate 16. Moreover, according to this inspection method, the plasma processing apparatus 71 can be directly evaluated in situ in a short period of time, instead of a two-stage evaluation, i.e., processing of the substrates and confirmation and evaluation of the operation of the plasma processing apparatus 71 based on the evaluation of the processed substrates. In this embodiment, inspection by layer deposition on substrates is performed to determine the process recipe when the plasma processing apparatus is installed. Since the plasma processing chambers 75, 76, and 77 have the same radiofrequency characteristics, the layer deposition may be performed in only one of the chambers. In the maintenance of the plasma processing apparatus, actual layer deposition is not required because the radiofrequency characteristics of the plasma processing chambers are controlled within the predetermined value. In contrast, in conventional methods performing actual layer deposition on substrates, these plasma processing chambers must be independently evaluated.

Accordingly, the inspection method of this embodiment does not require a shutdown of the production line for several days to several weeks to check and evaluate the operation of the plasma processing apparatus 71. The production line, therefore, has high productivity with reduced expenses for substrates used in the inspection, processing of these substrates, and labor during the inspection operations.

Figure 19:
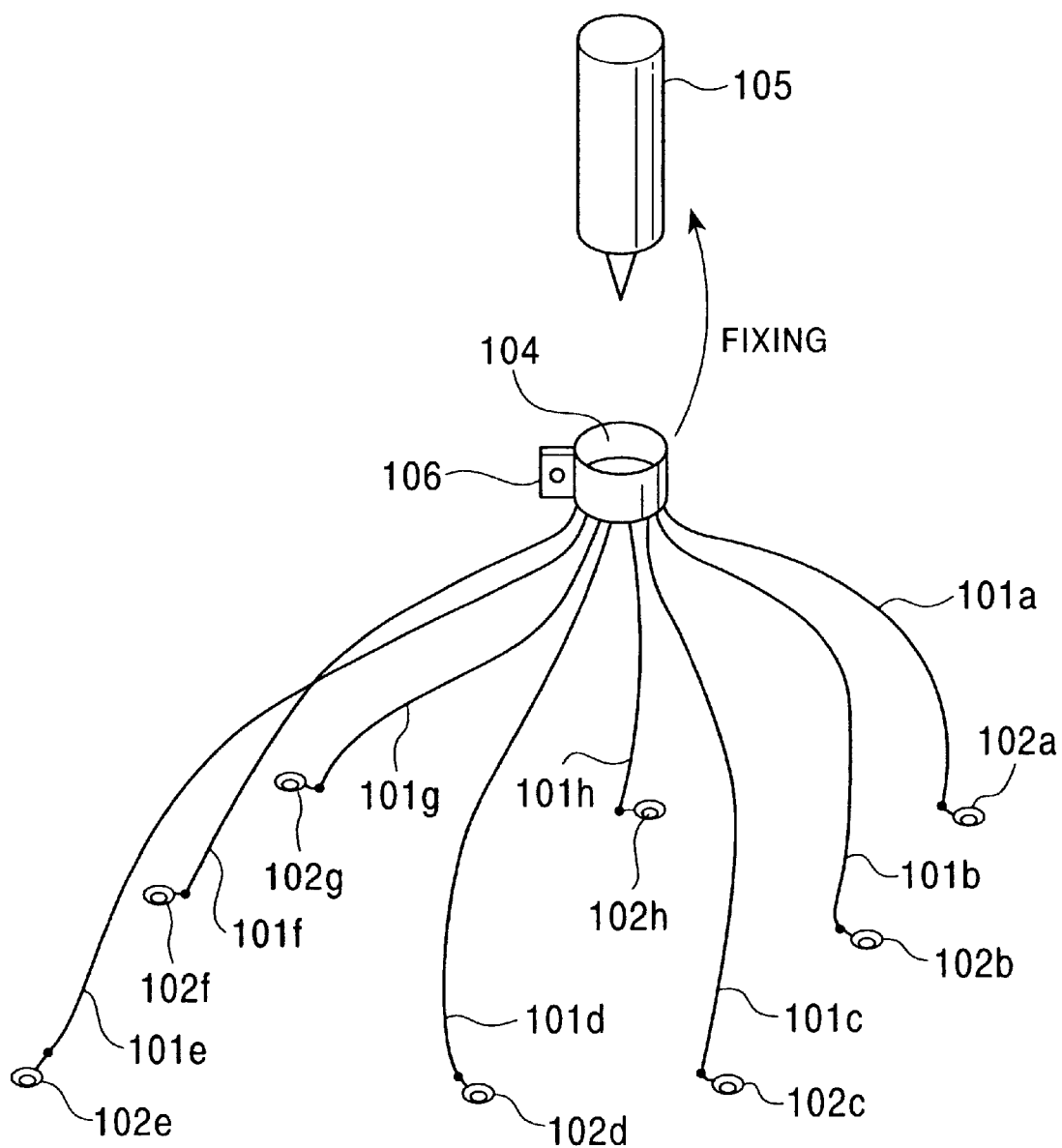
FIG. 19 is an isometric view of a probe of an impedance meter.

The radiofrequency characteristics (plasma electrode capacitance $C_e$ and the loss capacitance $C_X$) of the plasma processing chambers 75, 76, and 77 can also be measured by using a clamp shown in FIG. 19 comprising a plurality of conductive wires 101a to 101h having the same impedance, and a probe attachment 104, to which one end of each of the plurality of conductive wires 101a to 101h is attached.

The probe attachment 104 is formed, for example, by shaping a 50 mm×10 mm×0.5 mm copper plate into a clamping portion 106 and a ring portion. The diameter of the ring portion is determined so that the ring portion is attachable to the circumference of the probe 105. One end of each of the conductive wires 101a to 101h is soldered to the probe attachment 104 to be electrically connected thereto.

Terminals (attachments) 102a to 102h which are attachable to and detachable from an object (the plasma processing chamber 75, 76, or 77, or the upper component 19) to be measured are installed at the other ends of the conductive wires 101a to 101h.

Figure 20:
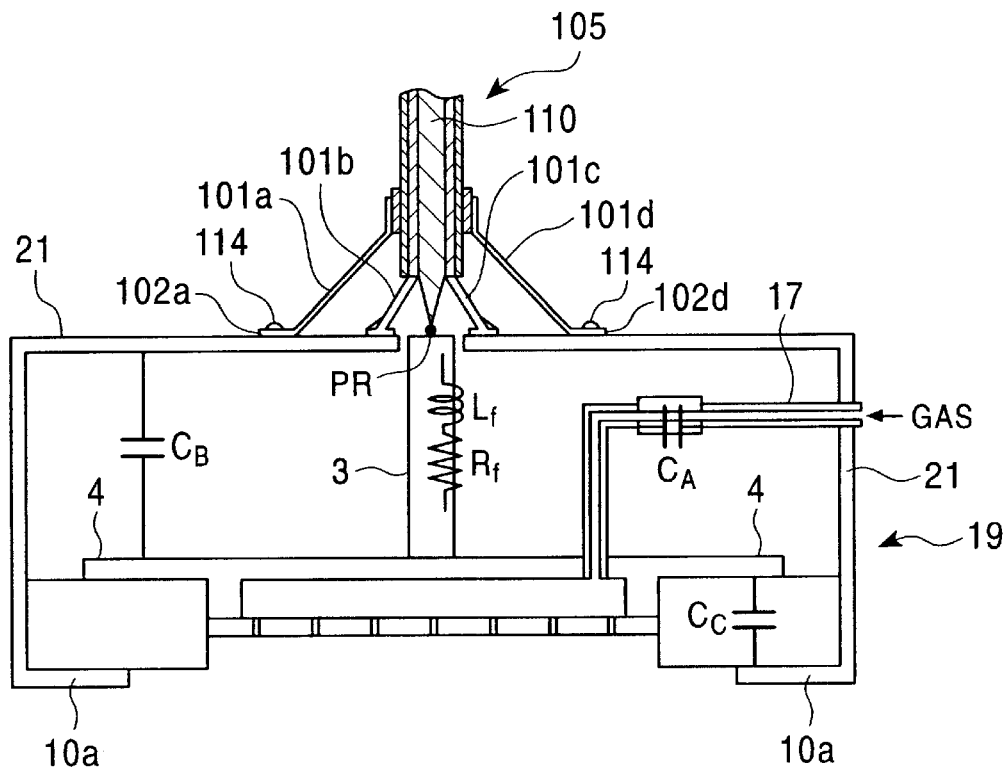
FIG. 20 is a schematic view showing connection of the probe shown in FIG. 19.

Using this clamp, the probe 105 is inserted into the ring portion of the probe attachment 104, and the probe 105 and the probe attachment 104 are clamped by the clamping portion 106. The conductive wires 101a to 101h are detachably screwed to the measured object in a substantially symmetrical manner about a point through the terminals 102a to 102h, as shown in FIG. 20.

The conductive wires 101a to 101h may be made of, for example, aluminum, copper, silver, or gold, or may be plated by silver or gold having a thickness of 50 μm or more.

The method for measuring radiofrequency characteristics using this clamp is now explained with reference to FIG. 20.

First, the radiofrequency generator 1 and the matching box 2 are detached from each of the plasma processing chambers 75, 76, and 77. When the external circuit substrate of the upper component 19 is measured, the upper component 19 is also detached from each of the plasma processing chambers 75, 76, and 77. The conductive line 110 of the probe 105 of the impedance meter is then connected to the feed plate 3. The terminals 102a to 102h connected to the conductive wires 101a to 101h of the clamp of the impedance meter are screwed to the chassis 21 of the plasma processing chamber 75, 76, or 77 or the upper component 19 in a symmetrical manner about the feed plate 3 using screws 114. After the impedance meter is set as above, a measuring signal is fed to the conductive line 110 of the impedance meter to measure the impedance of the path from the feed plate 3 to the chassis 21 via the plasma space 60.

In this manner, a uniform current uniformly flows in the measuring object regardless of the size thereof or the distance between two points to be measured. Also, by setting a residual impedance which does not affect the measurement of the impedance of the object, the impedance can be more precisely measured. Accordingly, the plasma electrode capacitance $C_e$ and the loss capacitance $C_X$ as radiofrequency characteristics can be more precisely measured.

In this embodiment, the substrate 16 is placed on the susceptor electrode 8 to measure the plasma electrode capacitance $C_e$ and the loss capacitance $C_X$ regarding the plasma excitation electrode 4 in the plasma processing chamber 75, 76, or 77. Alternatively, the substrate 16 may be placed at the plasma excitation electrode 4 side.

Third Embodiment

A plasma processing apparatus, a plasma processing system, and a performance validation system thereof in accordance with a third embodiment of the present invention will now be described with reference to the drawings.

Figure 12:
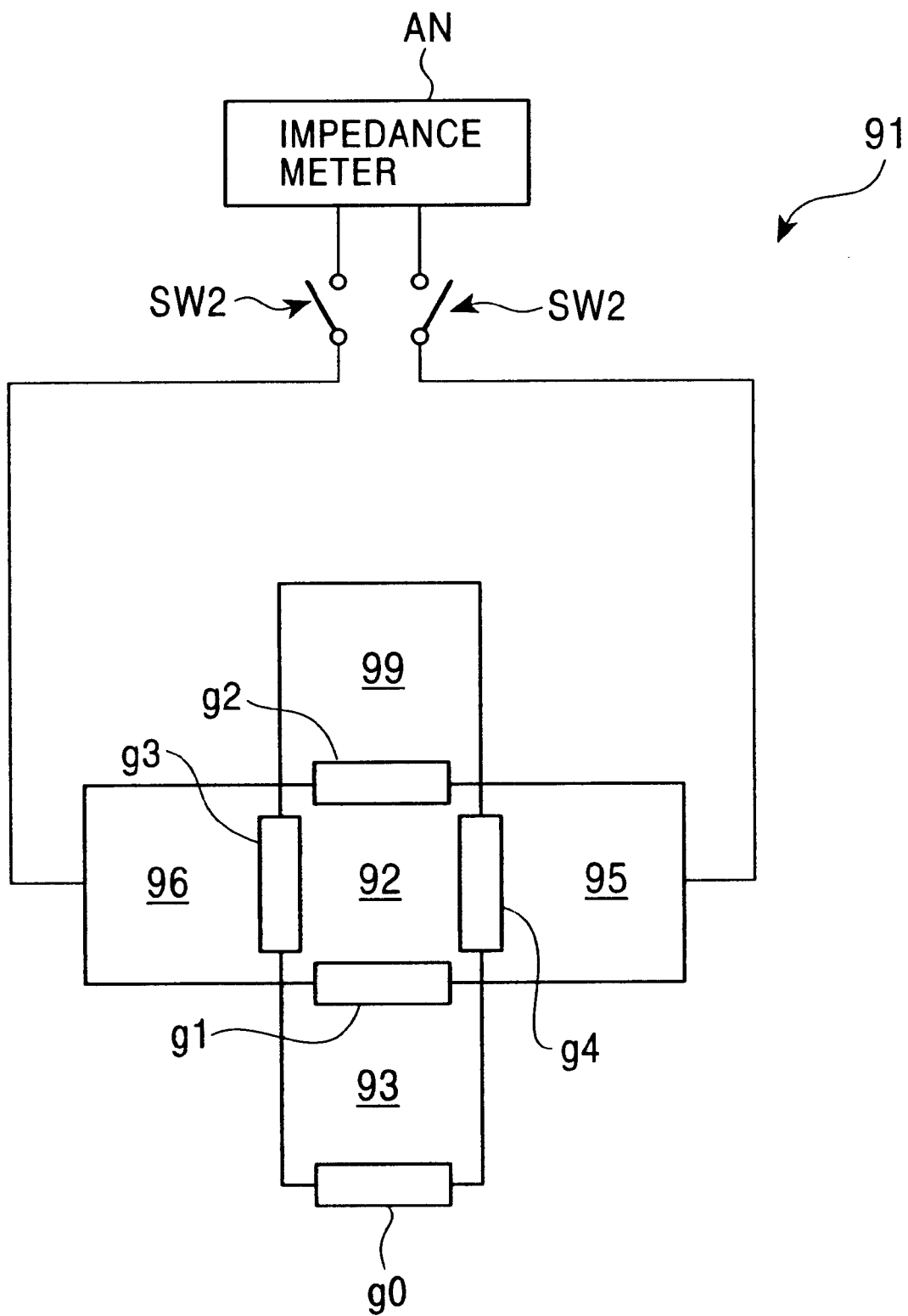
FIG. 12 is a cross-sectional view of an outline configuration of a plasma processing apparatus in accordance with a third embodiment of the present invention.

FIG. 12 is a cross-sectional view of an outline configuration of a plasma processing apparatus 91 used in this embodiment. The plasma processing apparatus 91 has a load-lock chamber 93, an annealing chamber 99, and processing chambers 95 and 96 which are provided around a substantially square transfer chamber (waiting chamber) 92. The transfer chamber 92 contains a transfer robot for transferring substrates and has gates g1, g2, g3, and g4 at the interfaces to the chambers. The transfer chamber 92, the heating chamber 99, and the processing chambers 95 and 96 are evacuated to high vacuum by individual high-vacuum pumps. The load-lock chamber 93 is evacuated to low vacuum by a low-vacuum pump.

The components of the plasma processing apparatus 91 of this embodiment correspond to those of the plasma processing apparatus 71 of the first embodiment shown in FIGS. 1 to 11. That is, the transfer chamber 92 corresponds to the transfer chamber 72, the annealing chamber 99 corresponds to the annealing chamber 79, and the load-lock chamber 93 corresponds to the loading chamber 73 and the unloading chamber 74. The components having the same configurations are not described.

The processing chambers 95 and 96 have substantially the same configuration as that of the plasma processing chambers 75 and 76 of the first to second embodiments shown in FIGS. 1 to 11 and may perform different treatments for forming different layers or the same treatment using the same recipe.

These plasma processing chamber units 95 and 96 are connected to an impedance meter AN via switches SW2. Furthermore, a variation between the maximum $C_{emax}$ and the minimum $C_{emin}$ among the plasma electrode capacitances $C_e$ of these plasma processing chambers 95 and 96 is defined by:

$$(C_{emax}-C_{emin})/(C_{emax}+C_{emin}) \qquad (12)$$

and is less than 0.03. Moreover, a variation between the maximum $C_{Xmax}$ and the minimum $C_{Xmin}$ among the loss capacitances $C_X$ of these deposition chambers 95 and 96 is defined by:

$$(C_{Xmax}-C_{Xmin})/(C_{Xmax}+C_{Xmin}) \qquad (13)$$

and is less than 0.03.

The configuration of the plasma processing chamber unit 95 will now be described as an example of this embodiment.

Figure 13:
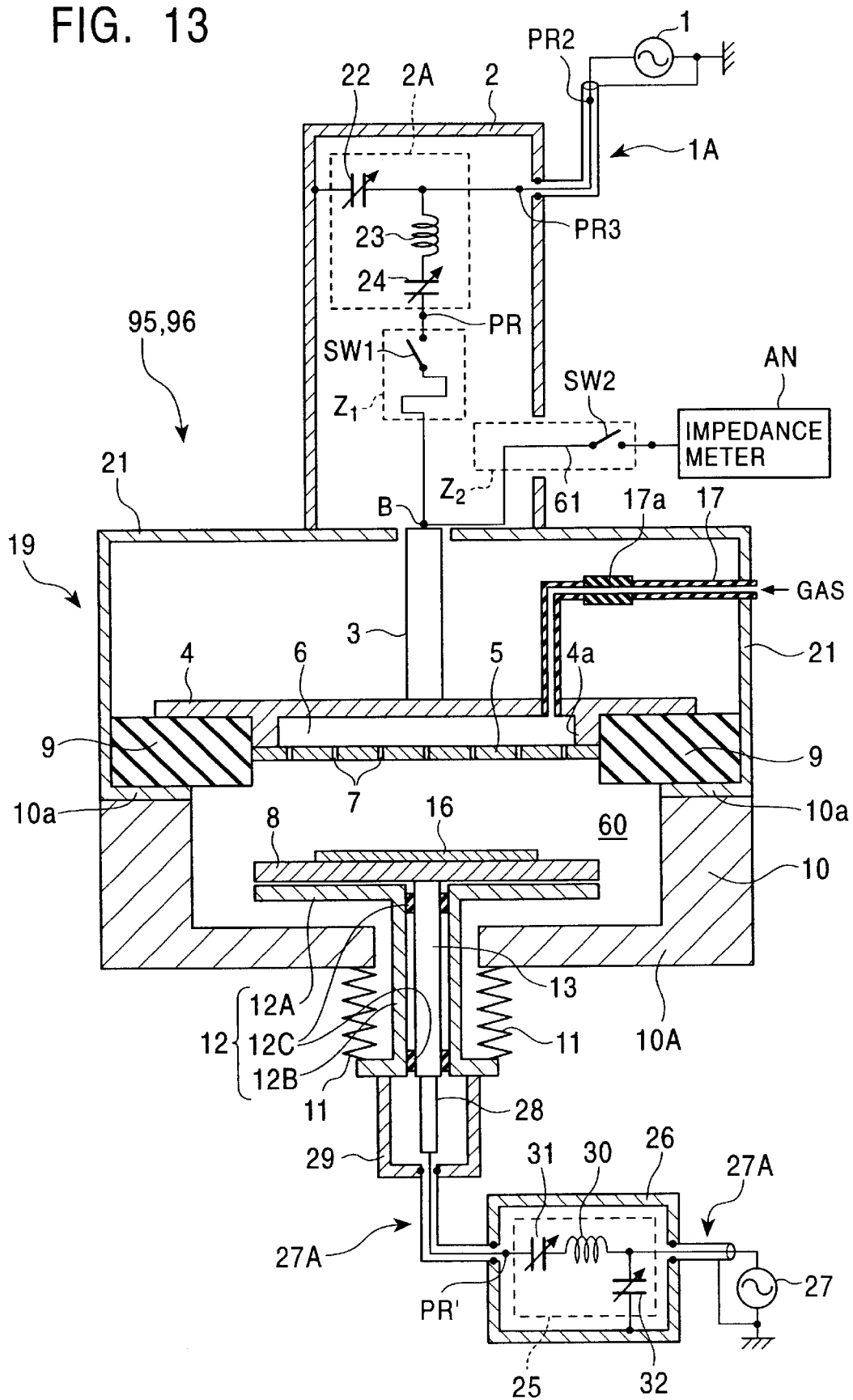
FIG. 13 is a cross-sectional view illustrating an outline configuration of a plasma processing chamber unit of the plasma processing apparatus shown in FIG. 12.
Figure 14:
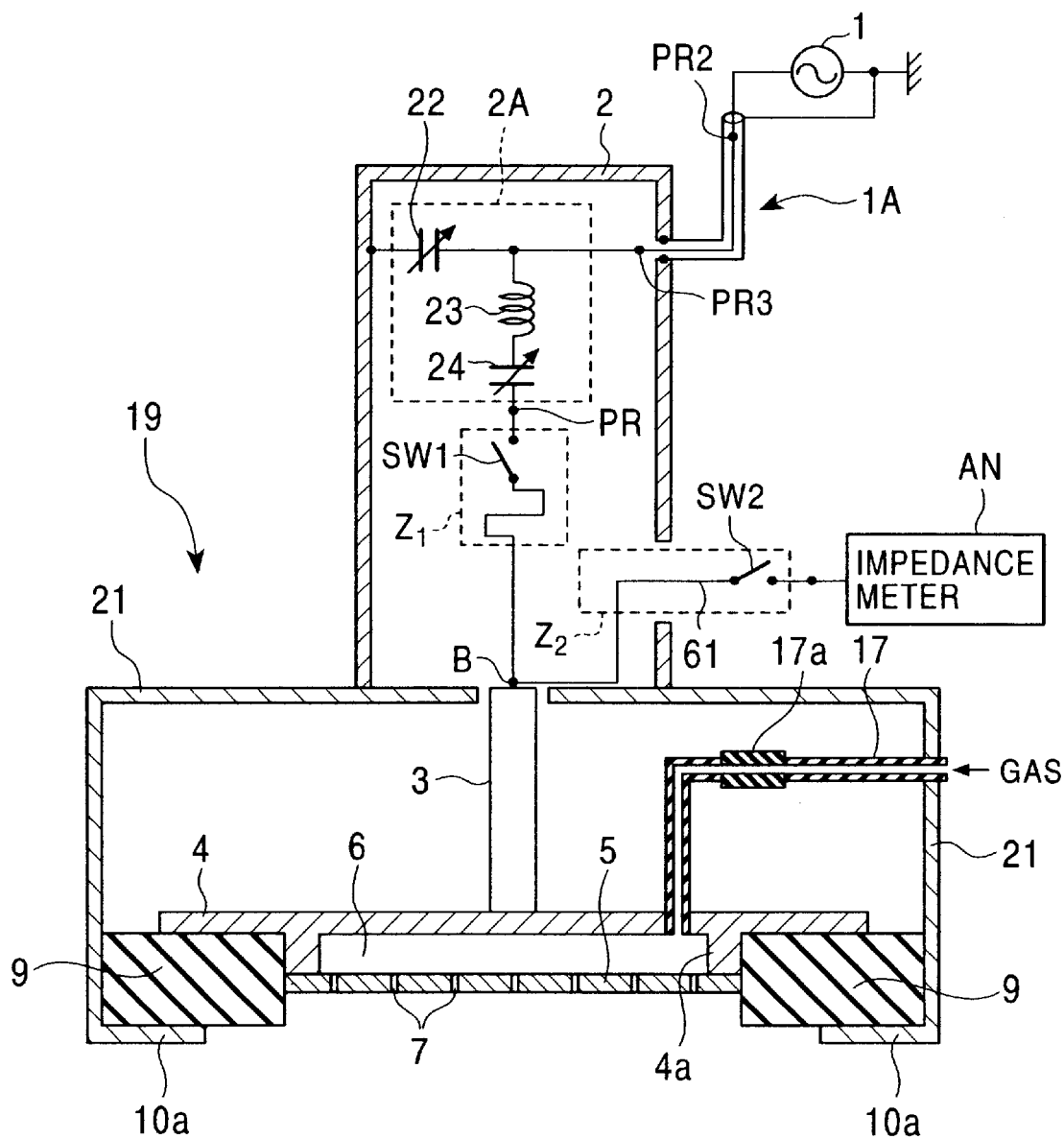
FIG. 14 is a schematic view of the upper component of the plasma processing chamber unit shown in FIG. 13.

FIG. 13 is a cross-sectional view illustrating an outline configuration of the plasma processing chamber unit 95 (or 96) of this embodiment, and FIG. 14 is a schematic view of an upper component 19 in FIG. 13.

The plasma processing chamber unit 95 of this embodiment is of a dual-frequency excitation type. This plasma processing chamber 95 differs from the plasma processing chamber 75 of the first and second embodiments shown in FIGS. 1 to 11 in that power is also supplied from the susceptor electrode 8 side and that a measuring terminal 61 is provided. Another difference is the setting of the plasma electrode capacitance $C_e$ and the loss capacitance $C_X$. Other corresponding components are referred to as the same reference numerals and symbols and the description thereof is omitted.

In the plasma processing chambers 95 and 96 of this embodiment, 5 times the plasma electrode capacitance $C_e$ is greater than the loss capacitance $C_X$.

Referring to FIGS. 13 and 14, an upper chamber wall 10a is provided on the entire top of the chamber wall 10 and is separable from the chamber wall 10. A sealing means such as an O-ring (not shown in the drawing) is provided between the upper chamber wall 10a and the chamber wall 10 to secure hermetic sealing therebetween. The upper chamber wall 10a is integrated with the bottom of the side wall of the chassis 21, the upper chamber wall 10a and the chassis 21 having the same DC potential.

As shown in FIG. 14, the upper chamber wall 10a, the plasma excitation electrode 4, the shower plate 5, the insulator 9, the chassis 21, and the gas feeding tube 17 constitute the upper component 19. The upper component 19 is separable from the lower structure including the chamber wall 10, the susceptor electrode 8 and the like. That is, the upper component 19 can turn on an stator such as a hinge (not shown in the drawing) provided on the chamber wall 10 to open the chamber space 60.

Referring to FIG. 13, the plasma processing chamber 95 of this embodiment has a susceptor shield 12 disposed under a susceptor electrode 8 and a bellows 11 for vertically moving the susceptor electrode 8 and the susceptor shield 12. The distance between a plasma excitation electrode 4 and the susceptor electrode 8 is thereby adjustable. The shaft 13 and the susceptor electrode 8 are electrically isolated from the susceptor shield 12 by a gap between the susceptor shield 12 and the susceptor electrode 8 and by insulators 12C provided around the shaft 13. The insulators 12C also maintain high vacuum in the chamber space 60. The susceptor electrode 8 is connected to a second radiofrequency generator 27 through a feed plate 28 connected to the bottom end of a shaft 13 and a matching circuit 25 contained in a conductive matching box 26.

The feed plate 28 is covered by a chassis 29 connected to the bottom end of a cylindrical support 12B of the susceptor shield 12. The chassis 29 is connected to the matching box 26 by a shielding line of a feed line 27A which is a coaxial cable, and is grounded together with the matching box 26. Thus, the susceptor shield 12, the chassis 29, and the matching box 26 have the same DC potential.

The matching circuit 25 matches the impedance between the second radiofrequency generator 27 and the susceptor electrode 8. Referring to FIG. 13, the matching circuit 25 has, as passive elements, a tuning coil 30 and a tuning capacitor 31 connected in series between the second radiofrequency generator 27 and the feed plate 28, and a load capacitor 32 connected in parallel with the tuning coil 30 and the tuning capacitor 31. One end of the load capacitor 32 is connected to the matching box 26. Accordingly, the matching circuit 25 has substantially the same configuration as that of the matching circuit 2A. The matching box 26 is set to a ground potential through the shielding line of the feed line 27A, thereby the end of the load capacitor 32 being grounded. Alternatively, another tuning coil may be connected in series to the tuning coil 30, and another load capacitor may be connected in parallel to the load capacitor 32.

The feed plate 28 may be identical to the feed plate 3. The input end of the feed plate 28 is screwed to a terminal from the matching circuit 25, and the output end is screwed to the shaft 13.

The measuring range in the plasma processing chamber 95 of this embodiment includes the downstream side of the output terminal position PR toward the plasma excitation electrode 4. An impedance measuring terminal 61 extends from a branch point B at the input terminal of the feed plate 3 to the exterior of the matching box 2.

A switch SW1 is provided between the matching circuit 2A and the feed plate 3 and a switch SW2 is provided between the impedance measuring terminal 61 and the feed plate 3.

The impedance characteristics from the impedance measuring terminal 61 side when the impedance measuring terminal 61 is connected by the switch SW2 and the impedance characteristics from the matching circuit 2A side when the matching circuit 2A is connected by the switch SW1 are set to be equal to each other. That is, as shown in FIG. 13, the impedance $Z_1$ measured in the vicinity of the switch SW1 and the impedance $Z_2$ measured in the vicinity of the switch SW2 are set to be equal to each other.

In other words, the impedance $Z_1$ from the output terminal position PR to the branch point B when the switch SW1 is closed and the switch SW2 is open is set to be equal to the impedance $Z_2$ from the impedance measuring terminal 61 to the branch point B when the switch SW2 is closed and the switch SW1 is opened.

A probe of an impedance meter AN is detachably connected to the impedance measuring terminal 61. The probe is also detachably connected to the ground position, for example, a chassis 21 of the plasma processing chamber 95.

Moreover, the impedance from the impedance measuring terminal 61 to the impedance meter AN when the switch SW2 is closed and when the switch SW1 is opened is set to be the same in the plasma processing chambers 95 and 96. In other words, the coaxial cables from the switch SW2 to the impedance meter AN provided for the plasma processing chambers 95 and 96 have the same length.

In the plasma processing chamber 95 of this embodiment, while closing the switch SW1 and opening the switch SW2, the substrate 16 to be treated is placed on the susceptor electrode 8, radiofrequency voltages are applied to the plasma excitation electrode 4 and the susceptor electrode 8 from a first radiofrequency generator 1 and the second radiofrequency generator 27, respectively, while a reactive gas is fed into a chamber space 60 through a gas feeding tube 17 and shower holes 7 to generate a plasma, and plasma processing such as deposition or the like is performed on the substrate 16. During this process, a radiofrequency voltage of approximately 13.56 MHz or more, for example, 13.56 MHz, 27.12 MHz, or 40.68 MHz, is supplied from the first radiofrequency generator 1. The second radiofrequency generator 27 may supply either the same radiofrequency power as does the first radiofrequency generator 1 or a different radiofrequency of, for example, 1.6 MHz.

The plasma electrode capacitance $C_e$ and the loss capacitance $C_X$ as the radiofrequency characteristics A of the plasma processing chamber 95 of this embodiment are defined and measured as in the first and second embodiment. That is, the plasma electrode capacitance $C_e$ and the loss capacitance $C_X$ are defined as shown in FIGS. 13 to 16.

Figure 15:
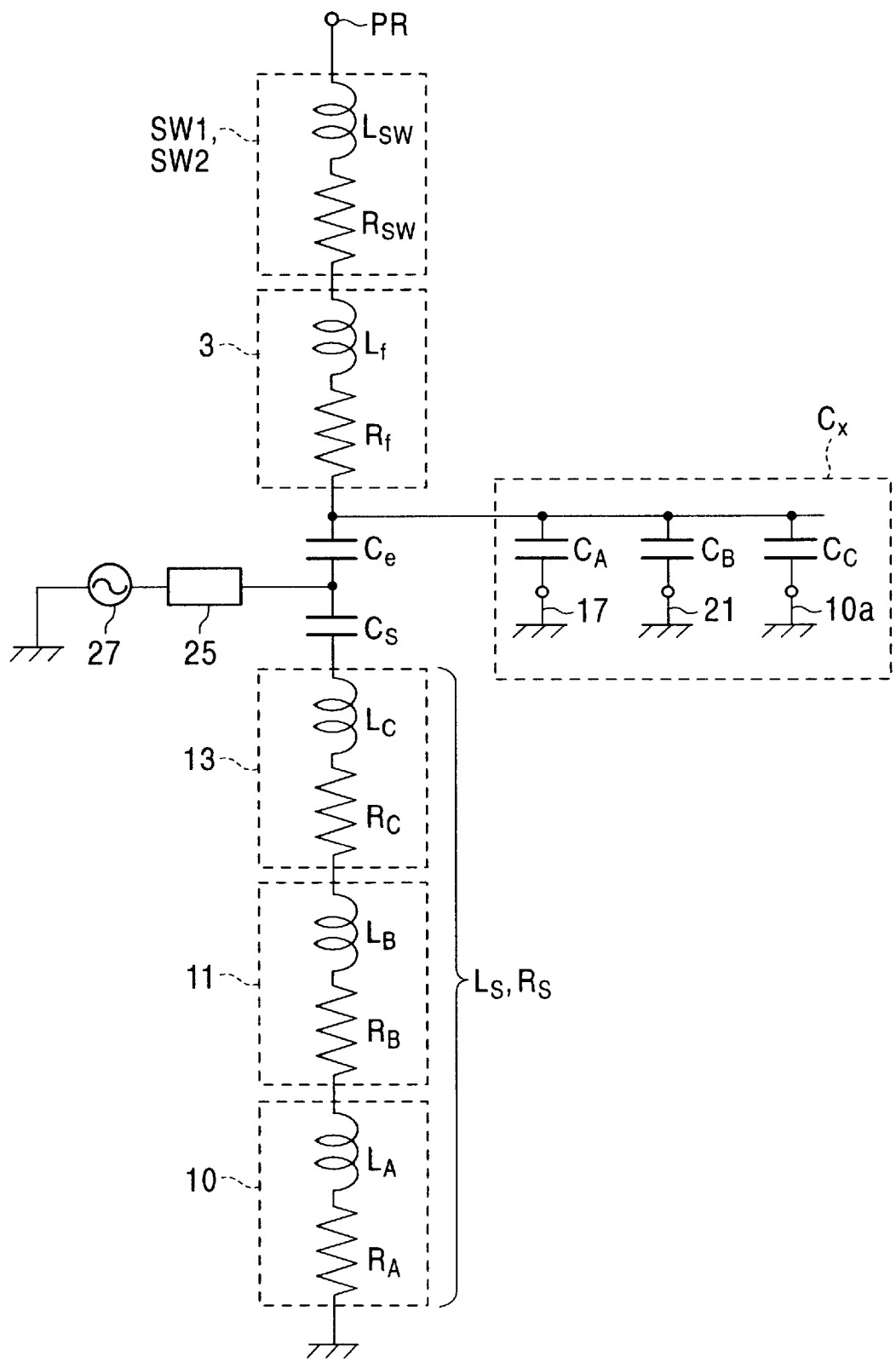
FIG. 15 is an equivalent circuit diagram for measuring the plasma electrode capacitance $C_e$ and the loss capacitance $C_X$ of the plasma processing chamber shown in FIG. 13.
Figure 16:
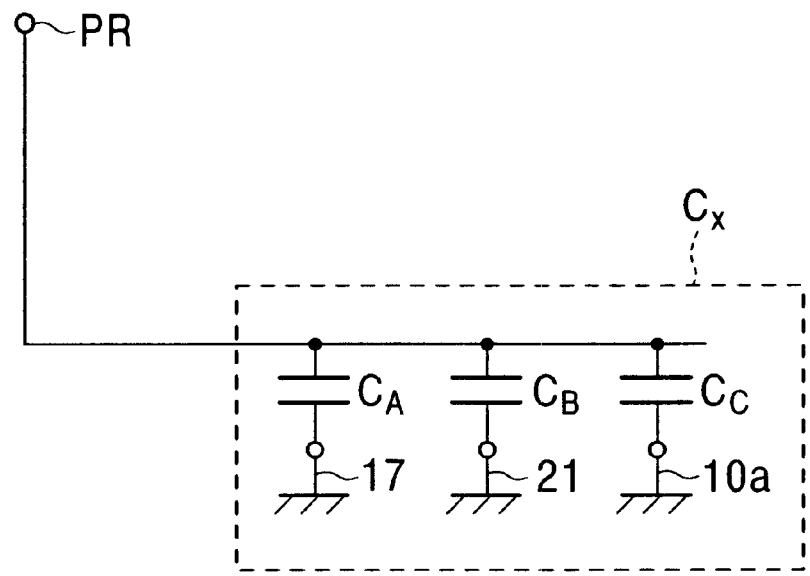
FIG. 16 is an equivalent circuit diagram for measuring the plasma electrode capacitance $C_e$ and the loss capacitance $C_X$ of the upper component shown in FIG. 14.

FIG. 15 is an equivalent circuit diagram for measuring the plasma electrode capacitance $C_e$ and the loss capacitance $C_X$ of the plasma processing chamber 15 shown in FIG. 13, and FIG. 16 is an equivalent circuit diagram for measuring the plasma electrode capacitance $C_e$ and the loss capacitance $C_X$ of the upper component 19 shown in FIG. 14.

In this embodiment, the loss capacitance $C_X$ of the plasma processing chamber 95 means that of the upper component 19 which is measured at the output terminal position PR. As shown in FIG. 13, the impedance $Z_1$ in the vicinity of the switch SW1 is equal to the impedance $Z_2$ in the vicinity of the switch SW2. Thus, the radiofrequency characteristics (impedance) of the upper component 19 measured at the output terminal position PR is equal to the radiofrequency characteristics (impedance) thereof measured at the impedance measuring terminal 61.

In the first and second embodiments, the matching circuit 2A is mechanically detached when the radiofrequency characteristics are measured. In this embodiment, however, the matching circuit 2A is electrically disconnected from the measuring range by the switch SW1, as shown in FIGS. 13 and 14; hence, the radiofrequency characteristics of the upper component 19 can be readily measured without mechanically detaching the matching circuit 2A.

Referring to FIG. 15, the radiofrequency electrical factors affecting the above-described measuring region of the plasma processing chamber 95 are as follows:

The inductance $L_{SW}$ and resistance $R_{SW}$ of the switch SW2;

The inductance $L_f$ and resistance $R_f$ of the feed plate 3;

The plasma electrode capacitance $C_e$ between the plasma excitation electrode 4 and the susceptor electrode 8;

The capacitance $C_s$ between the susceptor electrode 8 and a susceptor shield 12;

The inductance $L_C$ and resistance $R_C$ of a cylindrical support 12B of the susceptor shield 12;

The inductance $L_B$ and resistance $R_B$ of a bellows 11;

The inductance $L_A$ and resistance $R_A$ of a chamber wall 10;

The capacitance $C_A$ between a gas feeding tube 17 and the plasma excitation electrode 4 via an insulator 17a;

The capacitance $C_B$ between the plasma excitation electrode 4 and the chassis 21; and The capacitance $C_C$ between the plasma excitation electrode 4 and the upper chamber wall 10a.

That is, the radiofrequency characteristics in the measuring mode include the contribution of the switch SW2 which corresponds to the switch SW1 closed in the operation mode. Since the impedance $Z_1$ is equal to the impedance Z2, the radiofrequency characteristics measured at the impedance measuring terminal 61 precisely reflect the state of the radiofrequency circuit during plasma generation in the operation mode.

The probe 105 shown in FIG. 19 and connected to the impedance meter AN is connected to the impedance measuring terminal 61 and a ground position, for example, the chassis 21 of the plasma processing chamber 95. While closing switch SW2 and opening the switch SW1, the loss capacitance $C_X$ as the radiofrequency characteristics of the upper component 19 is measured with the impedance meter AN.

As shown in FIG. 14, the loss capacitance $C_X$ represents the capacitance component generated for the plasma excitation electrode 4 in the upper component 19 which is electrically disconnected from the plasma processing chamber 95.

The loss capacitance $C_X$ is the sum of the capacitor components for currents which flow in regions other than the path from the plasma excitation electrode 4 to the susceptor electrode 8. That is, the loss capacitance $C_X$ is the sum of the capacitor components between the plasma excitation electrode 4 and individual ground potential positions which are DC grounded. Herein, the individual ground potential positions indicate components at the ground potential other than the susceptor electrode 8 of the plasma processing chamber 95. That is, the individual ground potential positions include the susceptor shield 12, the cylindrical support 12B, the shaft 13, the bellows 11, the chamber bottom 10A, the chamber wall 10, the upper chamber wall 10a, the chassis 21, the matching box 2, the gas feeding tube 17 at the gas supply side from the insulator 17a, and the sheath line of the radiofrequency power feed line 1A. Specifically, as in the first embodiment shown in FIG. 4, the gas feeding tube 17, the chassis 21, the upper chamber wall 10a are taken into consideration as the loss capacitance $C_X$.

Thus, the loss capacitance $C_X$ is defined by the sum of the capacitance $C_A$ between the plasma excitation electrode 4 and the gas feeding tube 17 separated by the insulator 17a, the capacitance $C_B$ between the plasma excitation electrode 4 and the chassis 21, and the capacitance $C_C$ between the plasma excitation electrode 4 and the upper chamber wall 10a.

The plasma electrode capacitance $C_e$ between the parallel plate electrodes 4 and 8 is determined by the areas of (the sizes of) and the distance between the plasma excitation electrode 4 and the susceptor electrode 8.

In the plasma processing chamber 95 of this embodiment, 5 times the plasma electrode capacitance $C_e$ is greater than the loss capacitance $C_X$.

The plasma electrode capacitance $C_e$ and the loss capacitance $C_X$ are set, for example, as follows:

(1) Adjusting the distance between and the areas of the plasma excitation electrode 4 and the susceptor electrode 8;

(2) Adjusting the overlap area of the plasma excitation electrode 4 and the upper chamber wall 10a;

(3) Adjusting the material characteristics of the plasma excitation electrode 4 and the upper chamber wall 10a;

(4) Adjusting the thickness of the insulator provided between the plasma excitation electrode 4 and the upper chamber wall 10a;

(5) Adjusting the distance between and the areas of the plasma excitation electrode 4 and the chassis 21;

(6) Adjusting the material characteristics of the insulator 17a in the gas feeding tube 17; and (7) Adjusting the length of the insulator 17a.

Moreover, in this embodiment, the plasma electrode capacitance $C_e$ between the plasma excitation electrode 4 and the susceptor electrode 8 is set according to an effective interelectrode distance δ in the plasma space.

Figure 17:
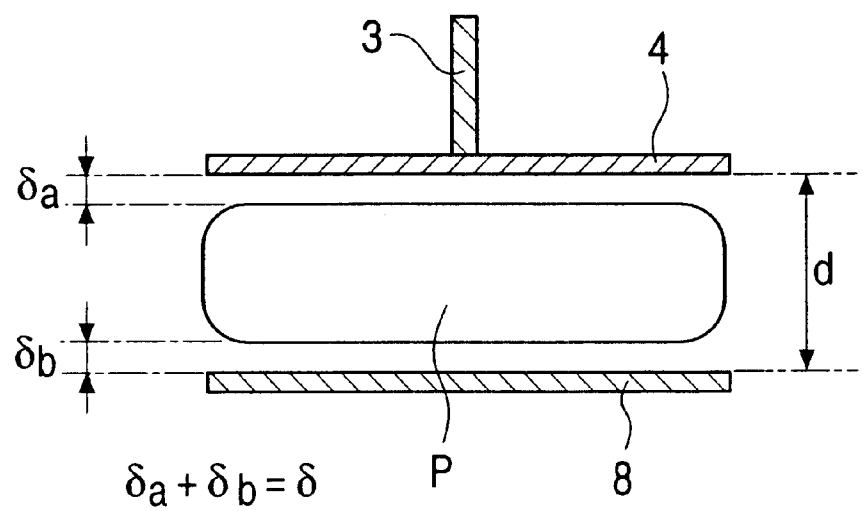
FIG. 17 is a schematic view of the state of the space between two electrodes when a plasma is generated.

FIG. 17 is a schematic view of the state of the space between two electrodes when a plasma is generated.

The plasma excitation electrode 4 and the susceptor electrode 8 are of a parallel plate type and have a distance d. The sum of the distance $δ_a$ between the plasma excitation electrode 4 and a plasma region P, which can be visually recognized during plasma emission, and the distance $δ_b$ between the susceptor electrode 8 and the plasma region P is represented by δ. In other words, the distance $δ_a$ of the nonplasma region between the plasma excitation electrode 4 and the plasma region P and the distance $δ_b$ of the nonplasma region between the plasma region P and the susceptor electrode 8 satisfy relationship (6):

$$δ_a + δ_b = δ \tag{6}$$

An apparent capacitance $C_0''$ between the electrodes 4 and 8 during plasma emission will be derived from the distance d between the electrodes 4 and 8 and the sum δ of the distances $δ_a$ and $δ_b$ of the nonplasma regions between the electrodes 4 and 8, as follows.

The plasma region P functions as a conductor during plasma emission; hence, the distance between the electrodes 4 and 8 can be regarded as δ during the plasma emission. The apparent capacitance $C_0''$ between the parallel plate electrodes 4 and 8 during plasma emission is inversely proportional to the effective distance δ between the electrodes 4 and 8, and the actual interelectrode capacitance $C_0$ when the plasma is not emitted is inversely proportional to the actual distance d between the electrodes 4 and 8. Thus, the apparent capacitance $C_0''$ during plasma emission becomes d/δ times the actual interelectrode capacitance $C_0$ as shown in relationship (7):

$$C_0 \propto 1/d$$
$$C_0'' \propto 1/δ$$
$$\therefore C_0'' \propto d/δ \cdot C_0 \tag{7}$$

Accordingly, in this embodiment, five times the actual interelectrode capacitance $C_0$ may be greater than the loss capacitance $C_X$. That is, the actual interelectrode capacitance $C_0$ may be set such that 5×d/δ times the actual interelectrode capacitance $C_0$ is greater than the loss capacitance $C_X$. Power consumption during plasma emission is thereby further improved.

In the plasma processing apparatus 91 of this embodiment, the plasma processing chamber 96 has substantially the same configuration as that of the plasma processing chamber 95. Also, the actual interelectrode capacitance $C_0$ and the loss capacitance $C_X$ of the plasma processing chamber 96 are set as in the plasma processing chamber 95.

In these plasma processing chambers 95 and 96, the power frequency $f_e$ is set to 40.68 MHz to measure the plasma electrode capacitance $C_e$ and the loss capacitance $C_X$.

It is believed that the plasma electrode capacitance $C_e$ and the loss capacitance $C_X$ are radiofrequency characteristics which mainly depend on the mechanical structure of the apparatus and are different from each other between apparatuses.

The plasma electrode capacitance $C_e$ and the loss capacitance $C_X$ of each plasma chamber are measured. That is, $C_{e95}$ and $C_{e96}$ are measured as the plasma electrode capacitance $C_e$ and $C_{X95}$ and $C_{X96}$ are measured as the loss capacitance $C_X$ of the first and second plasma processing chambers 95 and 96, respectively.

The variation of the observed plasma electrode capacitance $C_e$ defined by relationship (12) between the maximum $C_{emax}$ and the minimum $C_{emin}$ is set such that it is less than 0.03, according to methods (1) to (7) described in the first embodiment.

Similarly, the variation of the observed loss capacitance $C_X$ defined by relationship (13) between the maximum $C_{Xmax}$ and the minimum $C_{Xmin}$ is also set such that it is less than 0.03, according to methods (1) to (7) described in the first embodiment.

In this embodiment, the impedance meter AN is detachably connected to the impedance measuring terminal 61 of each of the plasma processing chambers 95 and 96. In the operation mode in which the plasma is generated, the impedance meter AN is disconnected from the impedance measuring terminal 61 of each of the plasma processing chambers 95 and 96 by the switch SW2 so that the impedance meter AN is not adversely affected by the radiofrequency. The radiofrequency characteristics, namely, the plasma electrode capacitance $C_e$ and the loss capacitance $C_X$ of these plasma chambers 95 and 96 can be thereby measured using the same impedance meter AN by switching.

In this embodiment, the plasma processing chambers 95 and 96 have the same radiofrequency characteristic A (impedance Z) from branch point B to the impedance meter AN via the switch SW2. In detail, the impedance $Z_2$ from the impedance measuring terminal 61 including the switch SW2 to the branch point B and the length of the coaxial cable from the switch SW2 to the impedance meter AN are the same in the plasma processing chambers 95 and 96.

In this plasma processing apparatus 91, a gate go is opened to transfer the substrate 16 into the load-lock chamber 93. The gate g0 is closed to evacuate the load-lock chamber 93 by a low-vacuum pump. The gates g1 and g2 are opened to transfer the substrate 16 from the load-lock chamber 93 to the heating chamber 99 by a transfer arm of a transfer robot in the transfer chamber 92. The gates g1 and g2 are closed to evacuate the transfer chamber 92 and the heating chamber 99 using a high-vacuum pump. After the substrate 16 is annealed, the gates g2 and g4 are opened to transfer the annealed substrate 16 to the processing chamber 95 by the transfer arm of the transfer robot. After the substrate 16 is processed in the processing chamber 95, the gates g3 and g4 are opened to transfer the substrate 16 to the plasma chamber 96 by the transfer arm of the transfer robot in the transfer chamber 92. After the substrate 16 is processed in the plasma chamber 96, the gates g1 and g3 are opened to transfer the substrate 16 to the load-lock chamber 93 by the transfer arm of the transfer robot in the transfer chamber 92.

Individual sections are automatically operated by a controller section, although the processing conditions such as layer deposition conditions in these processing chambers and the processing sequence are set by an operator. In the use of this plasma processing apparatus 91, an untreated substrate 16 is placed onto a loading cassette in the load-lock chamber 93 and the operator pushes a start switch. The substrate 16 is sequentially transferred from the loading cassette to processing chambers by the transfer robot. After a series of processing steps are sequentially performed in these processing chambers, the substrate 16 is placed into the unloading (loading) cassette by the transfer robot.

In these processing chambers 95 and 96, as in the second embodiment, the substrate 16 is placed on the susceptor electrode 8, and the radiofrequency generator 1 supplies a radiofrequency power to the plasma excitation electrode 4 and the radiofrequency generator 27 supplies another radiofrequency power to the susceptor electrode 8, while a reactive gas is fed into the chamber space 60 from the gas feeding tube 17 via the shower plate 6 to generate a plasma for forming an amorphous silicon layer, a silicon oxide layer, or a silicon nitride layer on the substrate 16.

The plasma processing apparatus 91 and the inspection method therefore of this embodiment exhibit the same advantages as those in the first and second embodiments. Moreover, the variations of the plasma electrode capacitance $C_e$ and the loss capacitance $C_X$ of each of the plasma processing chambers 95 and 96 are set such that they are less than 0.03. Thus, these plasma processing chambers 95 and 96 have substantially the same radiofrequency characteristics such as impedance and resonant frequency. Since the radiofrequency characteristics of these processing chambers 95 and 96 are controlled within a predetermined range, these processing chambers 95 and 96 consume substantially the same electrical power.

Accordingly, substantially the same result is achieved from a single process recipe for these different processing chambers 95 and 96. When layers are formed in these processing chambers 95 and 96, these layers can have substantially the same characteristics, e.g., the thickness, the isolation voltage, and the etching rate. When the variation is controlled to be less than 0.03 under the same deposition conditions in the plasma chambers 95 and 96, the variation in layer thickness can be controlled to be less than ±2%.

Referring to FIG. 13, in the plasma processing apparatus 91 of this embodiment, the impedance measuring terminal 61 is provided at a position corresponding to the output terminal PR of matching circuit 2A in each of the processing chambers 95 and 96, and the impedance meter AN is detachably connected to the impedance measuring terminal 61. Moreover, the matching circuit 2A is disconnected from the processing chambers 95 and 96 by operating the switches SW1 and SW2 when the impedance characteristics of the processing chambers 95 and 96 are measured. Thus, the impedance characteristics of the processing chambers 95 and 96 can be measured without disconnecting the matching circuit 2A from the radiofrequency power feed line 1A, unlike the first and second embodiments. Accordingly, the loss capacitance $C_X$ of the processing chambers 95 and 96 can be readily measured with improved processing efficiency.

As described above, the impedance $Z_1$ is equal to the impedance $Z_2$ in these processing chambers 95 and 96 in this embodiment; hence, switching between the measuring mode of the impedance characteristics and the loss capacitance $C_X$ and the operating mode of the plasma processing apparatus can be readily performed only by operating the switches SW1 and SW2, without connecting and disconnecting the matching circuit 2A and the probe 105 for measuring the impedance (shown in FIG. 19). Thus, the measurements of the loss capacitance $C_X$ of these processing chambers 95 and 96 can be rapidly performed, by operating the switches SW1 and SW2.

Moreover, in this embodiment, 5 times the plasma electrode capacitance $C_e$ is greater than the loss capacitance $C_X$. Thus, the electrical power which is required for the uniformity in the processing rate (deposition rate), the layer thickness, and layer characteristics, such as isolation voltage, in the planar direction can be reduced, resulting in reduced operational costs.

In this embodiment, the two switches SW1 and SW2 are provided. Since the essential feature in this embodiment is that the impedance from the branch to the measuring point PR is equal to the impedance from the branch to the probe, this requirement may be satisfied using one switch.

Figure 21:
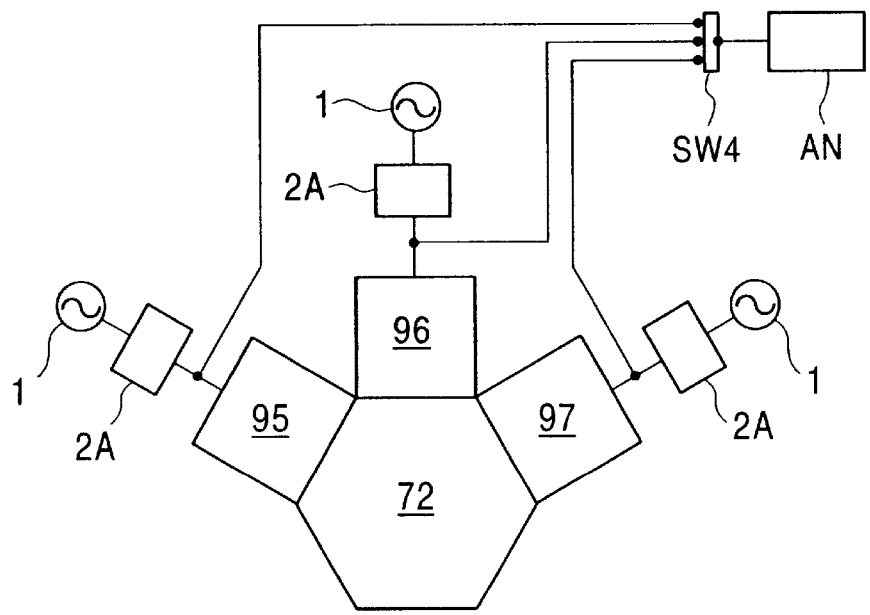
FIG. 21 is a schematic view of another configuration of the plasma processing apparatus in accordance with the present invention.

Alternatively, as shown in FIG. 21, an impedance meter AN is connected to a connection point for every matching circuit 2A via a switch SW4.

In this embodiment, the plasma electrode capacitance $C_e$ and the loss capacitance $C_X$ are measured for the plasma excitation electrode 4. Alternatively, the plasma electrode capacitance $C_e$ and the loss capacitance $C_X$ may be measured for the susceptor electrode 8. In such a case, shown in FIG. 13, these values are measured at a measuring point PR' which corresponds to the output terminal of the matching circuit 25.

Moreover, in addition to the plasma processing apparatus using the parallel plate type electrodes 4 and 8, the present invention can be applied to an inductive coupled plasma (ICP) excitation type plasma processing apparatus, a radial line slot antenna (RLSA) type plasma processing apparatus, and a reactive ion etching (RIE) type processing apparatus.

Target components may be provided in place of the parallel plate electrodes 4 and 8 to perform plasma sputtering.

Fourth Embodiment

A plasma processing apparatus, a plasma processing system, and a performance validation system and inspection method therefore in accordance with a fourth embodiment of the present invention will now be described with reference to the drawings.

Figure 18:
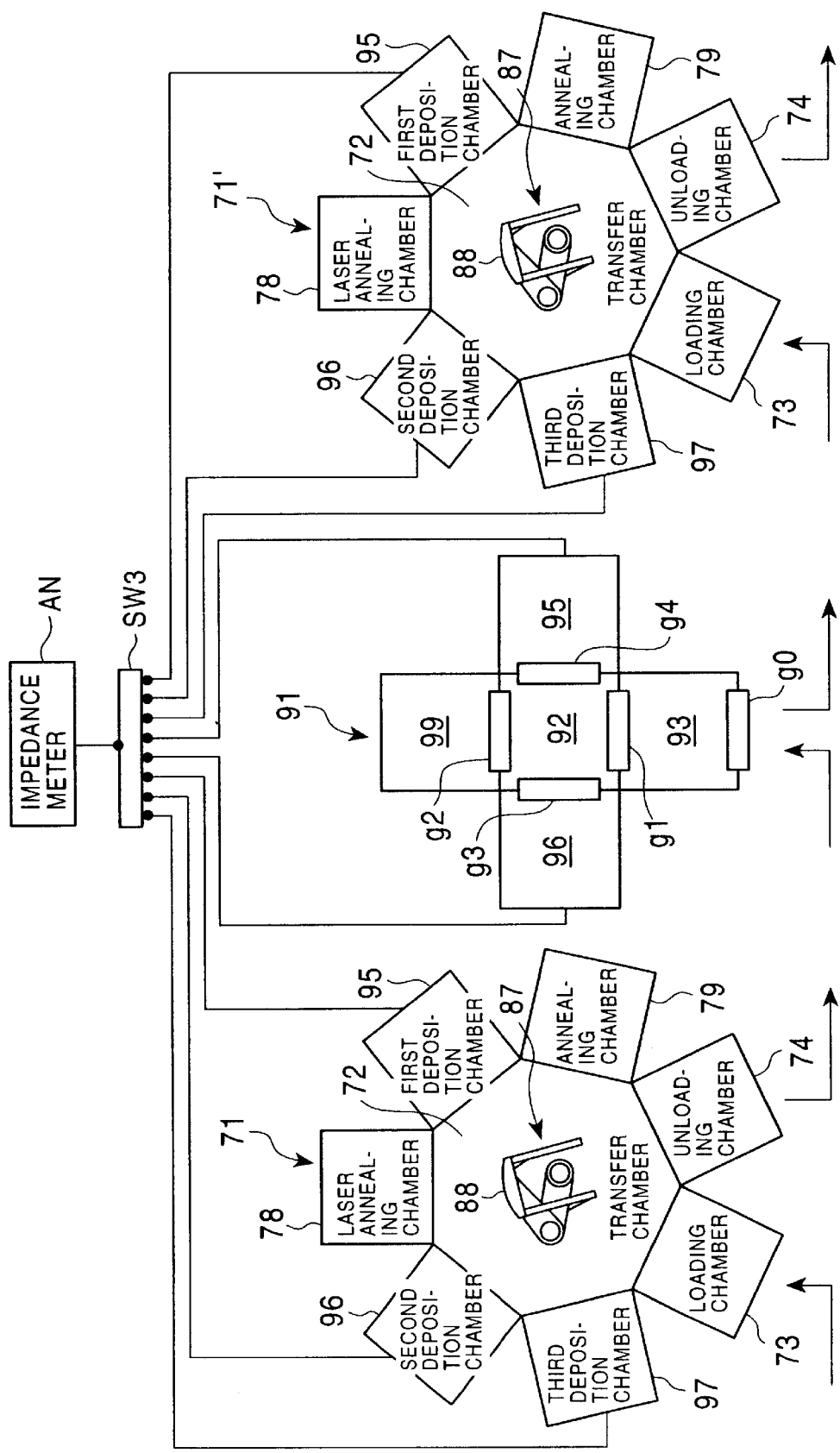
FIG. 18 is a schematic view of an outline configuration of the plasma processing system of the fourth embodiment.

FIG. 18 is a schematic view of an outline configuration of the plasma processing system of this embodiment.

The plasma processing system of this embodiment is substantially a combination of plasma processing apparatuses 71 and 71' which correspond to the plasma processing apparatus 71 shown in FIGS. 9 to 11 (see the second embodiment) and a plasma processing apparatus 91 which corresponds to the plasma processing apparatus 91 shown in FIGS. 12 to 17 (see the third embodiment). Components having the same functions as in the second and third embodiments are referred to with the same reference numerals, and a detailed description thereof with reference to drawings has been omitted.

As shown in FIG. 18, the plasma processing system of this embodiment constitutes a part of a production line which includes the plasma processing apparatus 71, the plasma processing apparatus 91, and the plasma processing apparatus 71'. The plasma processing apparatus 71 has three plasma processing chambers 95, 96, and 97. The plasma processing apparatus 91 has two plasma processing chambers 95 and 96. The plasma processing apparatus 71' has three plasma processing chambers 95, 96, and 97. These plasma processing chambers 95, 96, and 97 in the plasma processing apparatuses 71, 71', and 91 have substantially the same configuration.

Impedance measuring terminals of the plasma processing chambers 95, 96, and 97 are connected to an impedance meter AN via a switch SW3. In the measurement of the impedance, the switch SW3 connects only one of the plasma chambers 95, 96, and 97 to the impedance meter AN. Coaxial cables have the same length between the impedance measuring terminals of the plasma processing chambers 95, 96, and 97 and the switch SW3 so that the impedances from these impedance measuring terminals to the switch SW3 are the same. A detachable probe of an impedance meter AN is connected to the impedance measuring terminal, as in the third embodiment shown in FIG. 13.

The loss capacitance $C_X$ of each plasma processing chamber is measured by operating the switch SW3 as in the third embodiment. In this embodiment, 5 times the plasma electrode capacitance $C_e$ is greater than the loss capacitance $C_X$.

Furthermore, a variation between the maximum $C_{emax}$ and the minimum $C_{emin}$ among the plasma electrode capacitances $C_e$ of these plasma processing chambers 95, 96, and 97 is defined by:

$$(C_{emax}-C_{emin})/(C_{emax}+C_{emin}) \quad (12)$$

and is less than 0.03. Moreover, a variation between the maximum $C_{Xmax}$ and the minimum $C_{Xmin}$ among the loss capacitances $C_X$ of these plasma processing chambers 95, 96, and 97 is defined by:

$$(C_{Xmax}-C_{Xmin})/(C_{Xmax}+C_{Xmin}) \quad (13)$$

and is less than 0.03.

In the plasma processing system of the present invention, for example, a substrate 16, which has been preliminarily treated, is subjected to a first layer deposition treatment in the plasma processing chamber 95 of the plasma processing apparatus 71, is annealed in the annealing chamber 79, and is annealed in the laser annealing chamber 78. The treated substrate 16 is subjected to second and third layer deposition treatments in the plasma processing chambers 96 and 97.

The substrate 16 is transferred from this plasma processing apparatus 71 and a photoresist is applied thereto by a photolithographic step using another apparatus (not shown).

The substrate 16 is transferred into the plasma processing apparatus 91 and is plasma-etched in the processing chambers 95 and 96. Next, the substrate 16 is transferred to another plasma processing chamber not shown in the drawing and is subjected to a layer deposition treatment therein.

The substrate 16 is transferred from the plasma processing apparatus 91. After the resist is removed, the substrate 16 is subjected to photolithographic patterning in another apparatus not shown in the drawing.

Finally, the substrate 16 is subjected to first, second, and third deposition treatments in the plasma processing chambers 95, 96, and 97 of the plasma processing apparatus 71', and is transferred to the subsequent step to complete the steps in the plasma processing system according to this embodiment.

The plasma processing system of this embodiment exhibits the same advantages as those in the first to third embodiments shown in FIGS. 1 to 17. Moreover, 5 times the plasma electrode capacitance $C_e$ is greater than the loss capacitance $C_X$; hence, the shunt components other than the current flowing in the parallel plate electrodes 4 and 8 among the current supplied from the radiofrequency generator 1 can be controlled in each plasma processing chamber. Thus, the power can be effectively fed into the plasma space, and the effective power consumption in the plasma space is achieved compared with conventional plasma processing apparatuses when the same frequency is supplied. In a layer deposition process, the deposition rate will be improved. By setting the plasma electrode capacitance $C_e$ and the loss capacitance $C_X$ to the above-described range, the overall radiofrequency characteristics of the actual apparatus can be controlled. Since such a control generates a stable plasma, the plasma processing apparatus exhibits a stable operation.

Since the loss current which shunts toward other ground potential positions of each plasma processing chamber is reduced, the effective power consumption in the plasma space is improved compared with conventional plasma processing apparatuses.

In the plasma processing system and the inspection method therefor in this embodiment, the variation between the maximum $C_{emax}$ and the minimum $C_{emin}$ among the plasma electrode capacitances $C_e$ of these plasma processing chambers 95, 96, and 97 is less than 0.03, and the variation between the maximum $C_{Xmax}$ and the minimum $C_{Xmin}$ among the loss capacitances $C_X$ of these plasma processing chambers 95, 96, and 97 is less than 0.03. The plasma processing chambers 95, 96, and 97 thereby have substantially the same radiofrequency characteristics. Since the impedance characteristics of the plasma processing chambers 95, 96, and 97 can be controlled within a predetermined range, these plasma chambers consume substantially the same power and generate substantially the same plasma density in each plasma space.

As a result, substantially the same results can be obtained by the same process recipe for these plasma processing chambers 95, 96, and 97. When layers are deposited in these processing chambers, these layers will have substantially the same characteristics, e.g., the thickness, the isolation voltage, and the etching rate. When the above variations are less than 0.03, the variation in layer thickness can be controlled within ±2% under the same deposition conditions.

As a result, the overall radiofrequency characteristics of the individual plasma processing chambers 95, 96, and 97 can be optimized so as to generate a stable plasma. Thus, the operations of the plasma processing chambers 95, 96, and 97 are stable and uniform. Such optimization has not been considered in conventional processes.

This optimization does not require a determination of process conditions by the relationships between enormous amounts of data on these processing chambers 95, 96, and 97 and the results obtained by evaluation of actually processed substrates.

Thus, in installation of new systems and inspection of installed systems, the time required for achieving substantially the same results using the same process recipe in these plasma processing chambers 95, 96, and 97 can be significantly reduced compared with an inspection method by actual deposition onto the substrate 16. Moreover, this evaluation method can directly evaluate this plasma processing system in situ in a short period of time, instead of a two-stage evaluation, i.e., processing of the substrates and confirmation and evaluation of the operation of the plasma processing system based on the evaluation of the processed substrates. In this embodiment, inspection by layer deposition on substrates is performed to determine the process recipe when the plasma processing apparatus is installed. Since the plasma processing chambers 95, 96, and 97 have the same radiofrequency characteristics, the layer deposition may be performed in only one of the chambers. In the maintenance of the plasma processing apparatus, actual layer deposition is not required because the radiofrequency characteristics of the plasma processing chambers are controlled within the predetermined value. In contrast, in conventional methods performing actual layer deposition on substrates, these plasma processing chambers must be independently evaluated.

Accordingly, the inspection method of this embodiment does not require a shutdown of the production line for several days to several weeks to check and evaluate the operation of the plasma processing system. The production line, therefore, has high productivity with reduced expenses for substrates used in the inspection, processing of these substrates, and labor during the inspection operations.

In the plasma processing chambers 95, 96, and 97 of this embodiment, 5 times the plasma electrode capacitance $C_e$ is greater than the loss capacitance $C_X$. Thus, the radiofrequency characteristics of these plasma processing chambers 95, 96, and 97 can be simultaneously optimized. As a result, electrical power from the radiofrequency generator 1 can be effectively fed into the plasma space between the plasma excitation electrode 4 and the susceptor electrode 8 even if the input radiofrequency is higher than 13.56 MHz, which is conventionally used. If the same frequency is supplied, the electrical power will be more efficiently consumed in the plasma space of each plasma processing chamber compared with conventional plasma processing apparatuses.

As a result, the processing rate is improved by the higher-frequency plasma excitation. In other words, the deposition rate of the layer is improved in the plasma enhanced CVD or the like. Furthermore, as a result of the stabilized plasma generation in these plasma processing chambers 95, 96, and 97, the operations of the plasma processing apparatuses 71, 91, and 71' are stable. Accordingly, the operation of the plasma processing system is stable and uniform.

By the improvements in effective power consumption and plasma density in the plasma space of each of the plasma processing chambers 95, 96, and 97, a uniform treatment in the planar direction is achieved on a substrate 16. When a layer is deposited, the resulting layer has a uniform thickness. Moreover, a layer formed by, for example, plasma CVD or sputtering exhibits improved characteristics, i.e., high isolation voltage, high etching resistance, and high hardness or density.

Since effective electrical power consumption in the plasma space is improved compared with conventional plasma processing systems when the same frequency is supplied, a required deposition rate and required layer characteristics can be achieved using reduced input power, resulting in improved effective power consumption, reduced operational costs, and higher productivity in the overall plasma processing system. Moreover, processing time can be reduced, thus reducing carbon dioxide emission due to electrical power saving.

In the plasma processing system of this embodiment, the impedance measuring terminal 61 is provided at the output terminal position PR of the matching circuit 2A of each of the plasma processing chambers 95, 96, and 97, and the impedance meter AN is detachably connected to the impedance measuring terminal 61 by the switch SW3. When the impedance of these plasma processing chambers 95, 96, and 97 is measured, the matching circuit 2A is detached from the respective plasma processing chamber by the switches SW1 and SW2. Thus, it is unnecessary to detach the matching circuit 2A from the radiofrequency feed line. Moreover, the radiofrequency characteristics of these plasma processing chambers 95, 96, and 97 can be measured using one impedance meter AN.

Thus, probing is readily performed when the radiofrequency characteristics are measured, resulting in effective measurement of the crystalline silicon. Moreover, the radiofrequency characteristics can be readily measured by operating the switches SW1 and SW2 without detaching the impedance measuring probe 105.

Furthermore, the impedance $Z_1$ for the switch SW1 is equal to the impedance $Z_2$ for the switch SW2, and the impedance from the impedance measuring terminal 61 to the switch SW3 is the same in the plasma processing chambers 95, 96, and 97 of the plasma processing apparatuses 71, 91, and 71'; hence, the impedance which is observed by the impedance meter AN connected to the impedance measuring terminal 61 by operation of the switches SW1, SW2, and SW3 is regarded as the impedance which is observed at the output terminal position PR of the final output stage in the matching circuit 2A.

In this embodiment, the operation of the switches SW1, SW2, and SW3 may be cooperated with the switching of the plasma processing chambers 95, 96, and 97. The switches SW1 and SW2 may be replaced with one switch in which the impedance from the branch point B to the output terminal position PR is equal to that from the branch point B to the probe.

In this embodiment, the plasma electrode capacitance $C_e$ and the loss capacitance $C_X$ are measured for the plasma excitation electrode 4. Alternatively, the plasma electrode capacitance $C_e$ and the loss capacitance $C_X$ may be measured for the susceptor electrode 8. In such a case, shown in FIG. 13, these values are measured at a measuring point PR' which corresponds to the output terminal of the matching circuit 25.

Moreover, in addition to the plasma processing apparatus using the parallel plate type electrodes 4 and 8, the present invention can be applied to an ICP excitation type plasma processing apparatus, an RLSA type plasma processing apparatus, and an RIE type processing apparatus.

Figure 22:
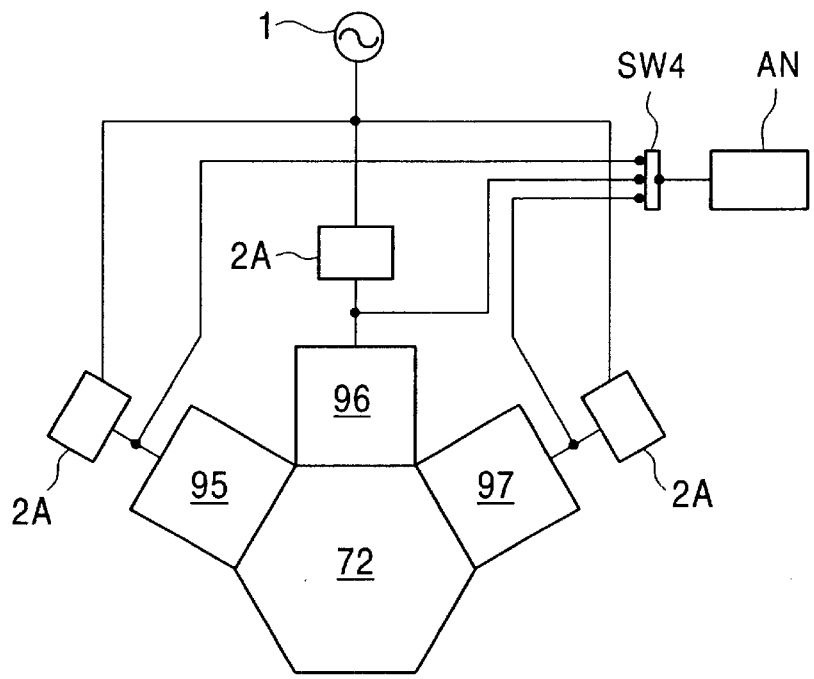
FIG. 22 is a schematic view of another configuration of the plasma processing apparatus in accordance with the present invention.
Figure 23:
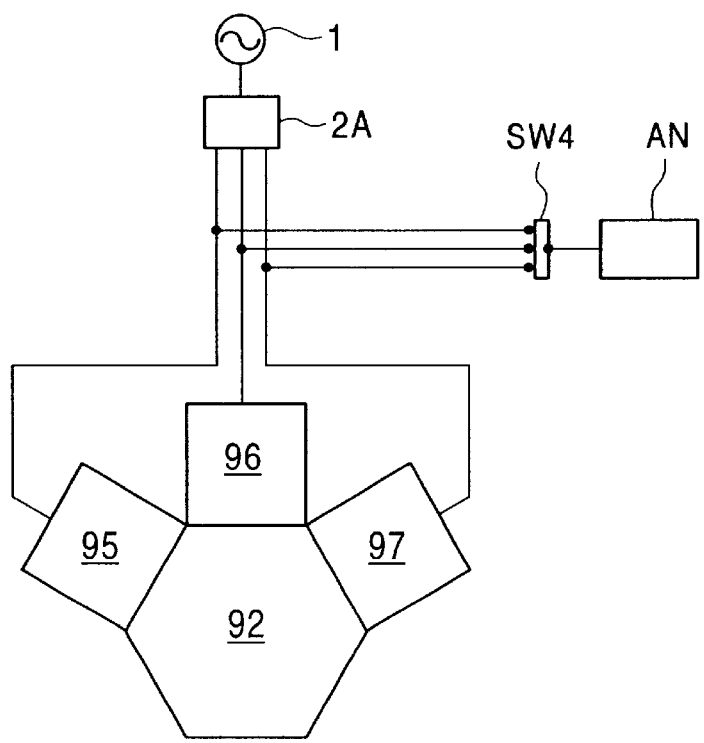
FIG. 23 is a schematic view of another configuration of the plasma processing apparatus in accordance with the present invention.

In the above embodiments, as shown in FIG. 21, each of the plasma processing chambers 95, 96, and 97 is provided with a matching circuit 2A and a radiofrequency generator 1. An impedance meter AN is connected to a connection point for every matching circuit 2A via a switch SW4. Alternatively, as shown in FIG. 22, one radiofrequency generator 1 may be connected to three matching circuits 2A for the plasma processing chambers 95, 96, and 97, or as shown in FIG. 23, one matching circuit 2A may be connected to these plasma processing chambers 95, 96, and 97. In such a case, the impedance meter AN is connected to a connection point between each plasma chamber and the matching circuit 2A via the switch SW4.

In the above embodiments, the capacitance of the upper component 19 which is separated from the plasma processing chamber is measured as the loss capacitance $C_X$. Alternatively, the total capacitance $C_T$ of the plasma processing chamber may be measured at the output terminal position PR to determine the loss capacitance $C_X$ from the total capacitance $C_T$ and the plasma electrode capacitance $C_e$ defined by the areas of and the distance between the parallel plate electrodes 4 and 8. In this case, the total capacitance $C_T$ includes shunt components other than the capacitance $C_A$ between the plasma excitation electrode 4 and the gas feeding tube 17 separated by the insulator 17a, the capacitance $C_B$ between the plasma excitation electrode 4 and the chassis 21, and the capacitance $C_C$ between the plasma excitation electrode 4 and the upper chamber wall 10a. Thus, the resulting loss capacitance $C_X$ is more precise.

Fifth Embodiment

A performance validation system of a plasma processing apparatus or a plasma processing system according to a fifth embodiment of the present invention will now be described with reference to the drawings. In the following description, a person who distributes and maintains the plasma processing apparatus or the plasma processing system is referred to as a "maintenance engineer".

Figure 24:
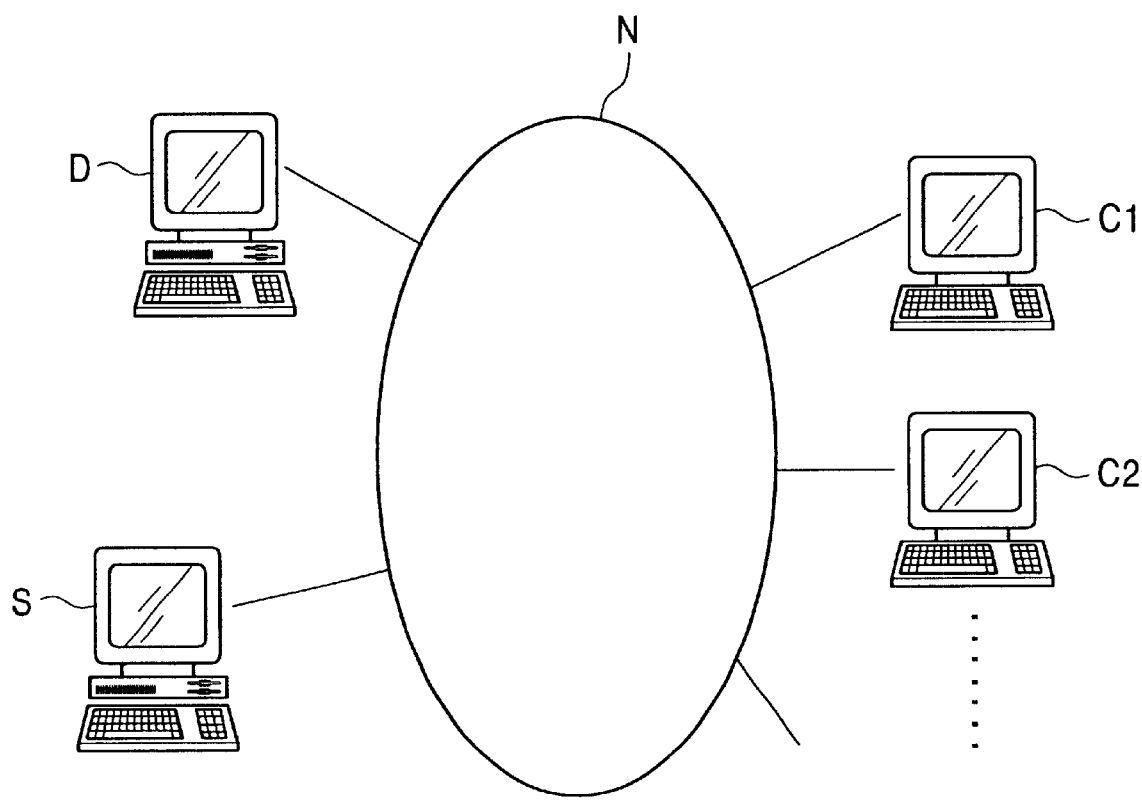
FIG. 24 is a schematic view illustrating a performance validation system of a plasma processing apparatus in accordance with the present invention.

FIG. 24 is a schematic diagram of the performance validation system of the plasma processing apparatus or system of the present invention.

The performance validation system comprises a customer terminal (client terminal) C1, an engineer terminal (client terminal) C2, a server computer (hereinafter simply referred to as "server") S which functions as operational performance information providing means, a database computer (hereinafter simply referred to as "database") D which stores information, and a public line N. The customer terminal C1 and the engineer terminal C2, the server S, and the database D are linked to each other via the public line N.

The terminals C1 and C2 have a function to communicate with the server S using a widespread Internet communication protocol, such as TCP/IP. The customer terminal C1 functions as a customer-side information terminal for validating the state of the performance of the plasma chamber which the customer purchased from the maintenance engineer, via the public line N. The customer terminal C1 also has a function to view an information web page which is a "plasma chamber performance information page" stored in the server S. The engineer terminal C2 which allows the maintenance engineer to upload "plasma electrode capacitance $C_e$ and the loss capacitance $C_X$" which partially constitute the "performance information" and to receive e-mail sent from the customer through the customer terminal C1.

Herein, the configuration of the plasma processing apparatus or the plasma processing system is identical to any one of the configurations according to the above-described first to fourth embodiments. The configuration of the plasma processing apparatus including the number of chambers can be set as desired.

Communication with the server S is performed through a modem when the public line N is an analog line or through a dedicated terminal adapter or the like when the public line N is a digital line such as an integrated services digital network (ISDN).

The server S is a computer that provides performance information. The server S transmits the performance information to the customer terminal C1 using an Internet communication protocol upon the request of the display from the customer terminal C1. Herein, each of the customers who purchased the plasma chambers receives a "browsing password" for viewing the performance information before the plasma processing apparatus is delivered to the customer from the maintenance engineer. The password is required when the customer wants to view operation and maintenance information which is part of the performance information, and the server S sends the operation and maintenance information to the customer terminal C1 only when a registered browsing password is received.

The "performance information", which will be described in detail below, comprises information regarding models of the plasma processing chambers of the plasma processing apparatus or plasma processing system available from the maintenance engineer, information regarding quality and performance of each model in the form of specifications, information regarding parameters indicative of quality and performance of specific apparatuses delivered to customers, and information regarding the parameters and maintenance history.

The information regarding quality and performance of specific apparatuses and the information regarding the parameters and the maintenance history are accessible only from the customers provided with "browsing passwords".

The above performance information includes "operation and maintenance information" and "standard performance information". The "operation and maintenance information" is provided from the maintenance engineer or the customer to the server S to indicate the actual state of operation and maintenance. The "standard performance information" is stored in the database D and functions as a catalog accessible from potential customers. The "standard performance information" includes an objective description regarding the performance of the plasma processing in the plasma chamber and allows an estimation of the deposition state in deposition processes such as plasma-enhanced CVD and sputtering processes.

In this embodiment, the "standard performance information" is stored in the database D.

Upon the request from the customer terminal C1 to view the "performance information", the server S retrieves the requested "standard performance information" from the database D and sends the information in the form of a performance information page to the customer terminal C1 of the customer. When a customer sends a request to view the "performance information" along with the browsing password of the customer, the server S retrieves the requested "standard performance information" from the database D as described above, prepare "performance information" by combining the retrieved "standard performance information page" and the "operation and maintenance information" provided from the maintenance engineer through the engineer terminal C2, and sends the "performance information page" to the customer terminal C1 of the customer.

The database D stores the "standard performance information", which is part of the "performance information", for every model of the plasma chambers of the plasma processing apparatus or plasma processing system, reads out the "standard performance information" in response to a search request from the server S, and transmits the retrieved information to the server S. Although only one server S is shown in FIG. 24, a plurality of servers managed by maintenance engineers at different locations are provided in this embodiment to share general purpose "standard performance information" which is stored in the database D.

Figure 25:
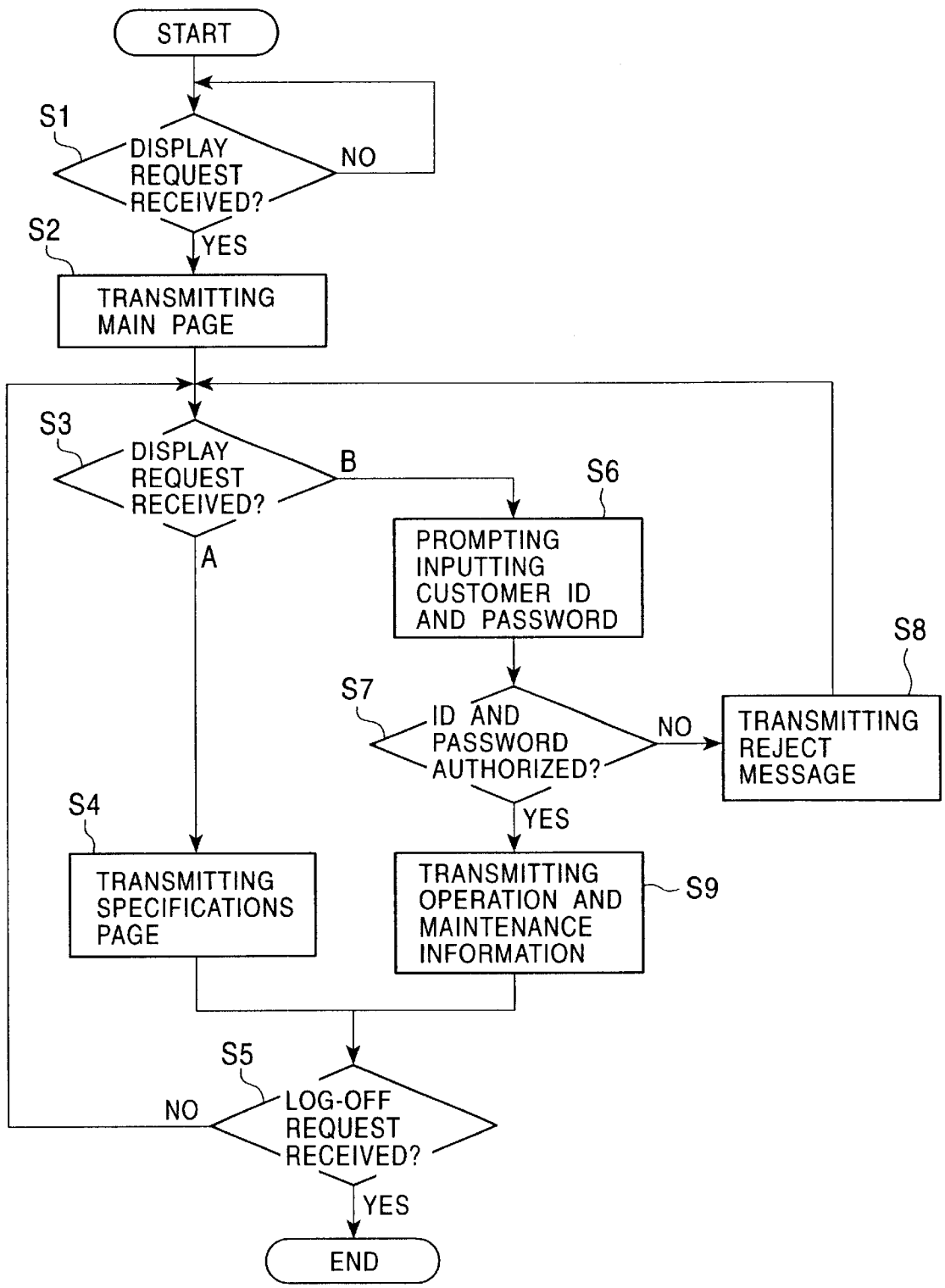
FIG. 25 is a flowchart illustrating processing for providing performance information from a server in the performance validation system shown in FIG. 24.

An operation of the performance validation system for the plasma processing apparatus or the plasma processing system will now be described in detail with reference to FIG. 25 which is a flowchart illustrating the process of providing the "performance information" executed by the server S.

In general, the maintenance engineer presents the "standard performance information" contained in the "performance information" of models of the plasma chamber of the plasma processing apparatus or system to the customer under consideration of purchasing, as a reference for purchase. The customer can understand the performance of each model and the possible plasma processes using the same through this "standard performance information".

Furthermore, the maintenance engineer presents the customer who purchased the plasma processing apparatus or the plasma processing system with the "standard operation information" as the reference during the use of the plasma chambers, and the "operation and maintenance information" as the parameters of the operation. The customer, i.e., the user of the plasma chambers, may validate the operation of the plasma chambers by comparing the "standard performance information" with the "operation and maintenance information", so as to determine whether the maintenance is necessary and to find the state of the plasma processing.

For example, a customer who is considering purchasing a new plasma processing apparatus or system from the maintenance engineer may access the server S to readily confirm the "standard performance information" of the plasma processing apparatus or system as follows.

The customer who wants to access sends a request for access from the customer terminal C1 to the server S based on an IP address of the server S set in advance.

Upon receiving the request for access (Step S1), the server S transfers a main page CP to the customer terminal C1 (Step S2).

Figure 26:
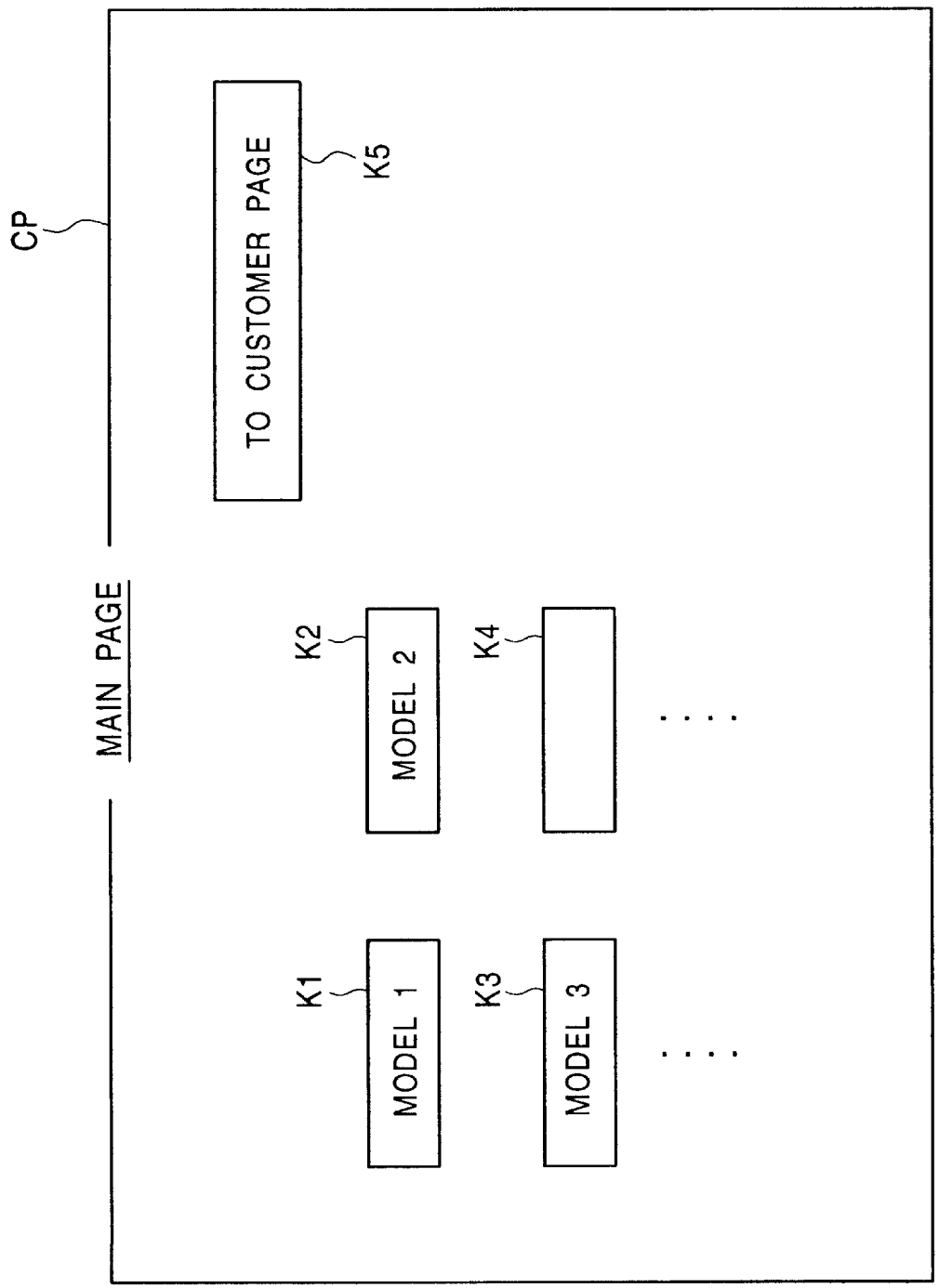
FIG. 26 shows an output form of a main page CP in accordance with the performance validation system of the plasma processing apparatus of the present invention.

FIG. 26 shows an example of the main page CP sent from the server S to the customer terminal C1. The main page CP comprises model selection buttons K1 to K4 for displaying the "standard performance information" contained in the "performance information" according to models available from the maintenance engineer and a user button K5 for requesting the display of a customer page exclusive to the customer who uses the plasma processing apparatus or system purchased from the maintenance engineer.

For example, the customer may select one of the model selection buttons K1 to K4 using a pointing device such as a mouse of the customer terminal C1 to specify the model of the plasma chambers of the plasma processing apparatus or system. Such a selection is sent to the server as the request for displaying the "standard performance information" among the "performance information".

Upon receipt of the request (Step S3), the server S sends the customer terminal C1 a subpage containing the requested information on the selected model. That is, when display of "standard performance information" is requested (A in FIG. 25), the server S retrieves data such as "vacuum performance", "gas charge/discharge performance", "temperature performance", "electrical performance of the plasma processing chamber", and the like, and data regarding variations in these parameters effected in the plasma processing apparatus or plasma processing system from the database D and sends the customer terminal C1 a specifications page CP1 shown in FIG. 27 containing these data (Step S4).

Figure 27:
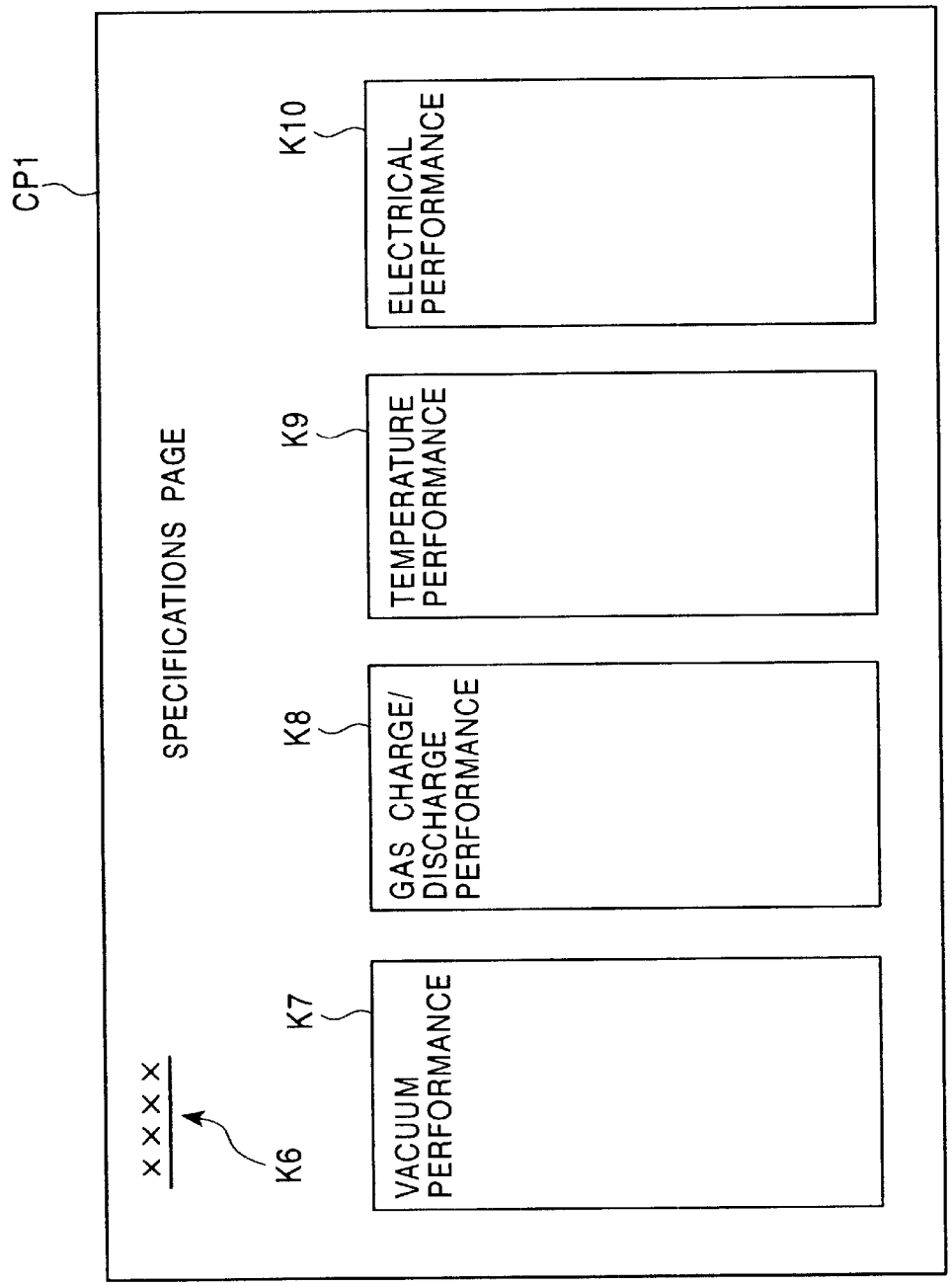
FIG. 27 shows an output form of a subpage CP1 in accordance with the performance validation system of the plasma processing apparatus of the present invention.

As shown in FIG. 27, the specifications page CP1 comprises a model section K6 which indicates the selected model of the apparatus, a vacuum performance section K7, a gas charge/discharge performance section K8, a temperature performance section K9, and an electrical performance section K10 which indicates the electrical performance of the plasma processing chamber. These constitute the "standard performance information" of the selected model and each contains the following descriptions.

The vacuum performance section K7 contains below:

ultimate degree of vacuum: $1 \times 10^{-4}$ Pa or less; and operational pressure: 30 to 300 Pa.

The gas supply/discharge performance section K8 contains below:

| maximum gas flow rates: | |
|---|---|
| $SiH_4$ | 100 SCCM, |
| $NH_3$ | 500 SCCM, |
| $N_2$ | 2,000 SCCM; and | discharge property: 20 Pa or less at a flow of 500 SCCM.

The temperature performance section K9 contains below:

heater temperature: 200 to 350±10° C.; and chamber temperature: 60 to 80±2.0° C.

Herein, the SCCM (standard cubic centimeters per minute) represents a converted gas flow rate at standard conditions (0° C. and 1,013 hPa) and the unit thereof is $cm^3/min$.

A variation in each of the above-described parameters P among the plurality of plasma chambers constituting the plasma processing apparatus or the plasma processing system is defined by relationship (10B) below:

$$(P_{max}-P_{min})/(P_{max}+P_{min}) \tag{10B}$$

wherein $P_{max}$ and $P_{min}$ represent the maximum and the minimum, respectively, of a particular parameter among these plasma processing chambers. The upper limit of the variation in the plasma processing apparatus or system is displayed for each of the parameters.

In the electrical performance section K10, the values of the plasma electrode capacitance $C_e$ and the loss capacitance $C_X$ described in the first to fourth embodiments and the upper limit of the variations thereof. In addition, this section includes values such as the capacitance $C_L$ of the load capacitor 22, the capacitance $C_{tu}$ of the tuning capacitor 24, the resistance R and reactance X of the plasma processing chamber at the power frequency $f_e$, and a first series resonant frequency $f_0$ described below. Furthermore, the specification page CP1 includes a performance guarantee statement such as "we guarantee that each of the parameters is within the setting range described in this page upon the delivery of the plasma chamber".

In this manner, the overall radiofrequency characteristics of the plasma processing apparatus or system and the variations in the electrical characteristics between the plasma chambers can be presented to a potential purchaser as a novel reference which has never been considered before. The performance information can be printed out at the customer terminal C1 or the engineer terminal C2 so that the performance information can be presented in the form of a catalog or specifications. When the values of the plasma electrode capacitance $C_e$, the loss capacitance $C_X$, the first series resonant frequency $f_0$, resistance R, reactance X, and the like, and the performance guarantee statement are presented to a potential purchaser through a terminal such as customer terminal C1, by a catalog, or by specifications, the potential purchaser can purchase the plasma chamber from the maintenance engineer based on the examination of the performance of the plasma chamber.

After the server S completes the transmission of the above-described subpage to the customer terminal C1, the server S waits for the request to display another subpage (Step S3) if a log-off request from the customer terminal C1 is not received (Step S5). If the server S receives the log-off request from the customer terminal C1, the server S terminates the communication with the customer terminal C1.

Herein, the definition of the first series resonant frequency $f_0$ is explained.

First, the dependence of the impedance of the plasma chamber on frequency is measured. The region for measuring the impedance of the plasma processing chamber is defined as described above, and then the vector quantity (Z, θ) of the impedance is measured while varying the oscillation frequency within a range including the power frequency $f_e$. Herein, in view of the power frequency $f_e$, which is generally set at 13.56 MHz, 27.12 MHz, 40.68 MHz, or the like, the oscillation frequency is varied over the range of, for example, 1 MHz to 100 MHz.

The impedance Z and the phase θ are plotted versus the oscillation frequency to depict an impedance characteristic curve and a phase curve. The first series resonant frequency $f_0$ is defined as the lowest frequency among the frequencies at the minima of the impedance curve.

The customer who purchased the plasma processing apparatus or system from the maintenance engineer can readily check the "performance information" of the specific plasma chambers of the plasma processing apparatus or system by accessing the server S as below.

When the customer and the maintenance engineer sign a sales contract, a customer ID, which is unique to the individual customer and a "customer password (browsing password)" for accessing the "operation and maintenance information" of the plasma processing apparatus or system or the plasma chambers thereof are given to the individual customer by the maintenance engineer. The customer ID may be associated with the serial number of the purchased plasma processing apparatus or system or with the serial number of the plasma chambers constituting the plasma processing apparatus or system. The server S sends the "operation and maintenance information" to the customer terminal C1 only when the registered browsing password is provided.

The customer, who wants to access the information, selects the user button K5 in the above-described main page CP to send the request for the display of a customer page to the server S.

Figure 28:
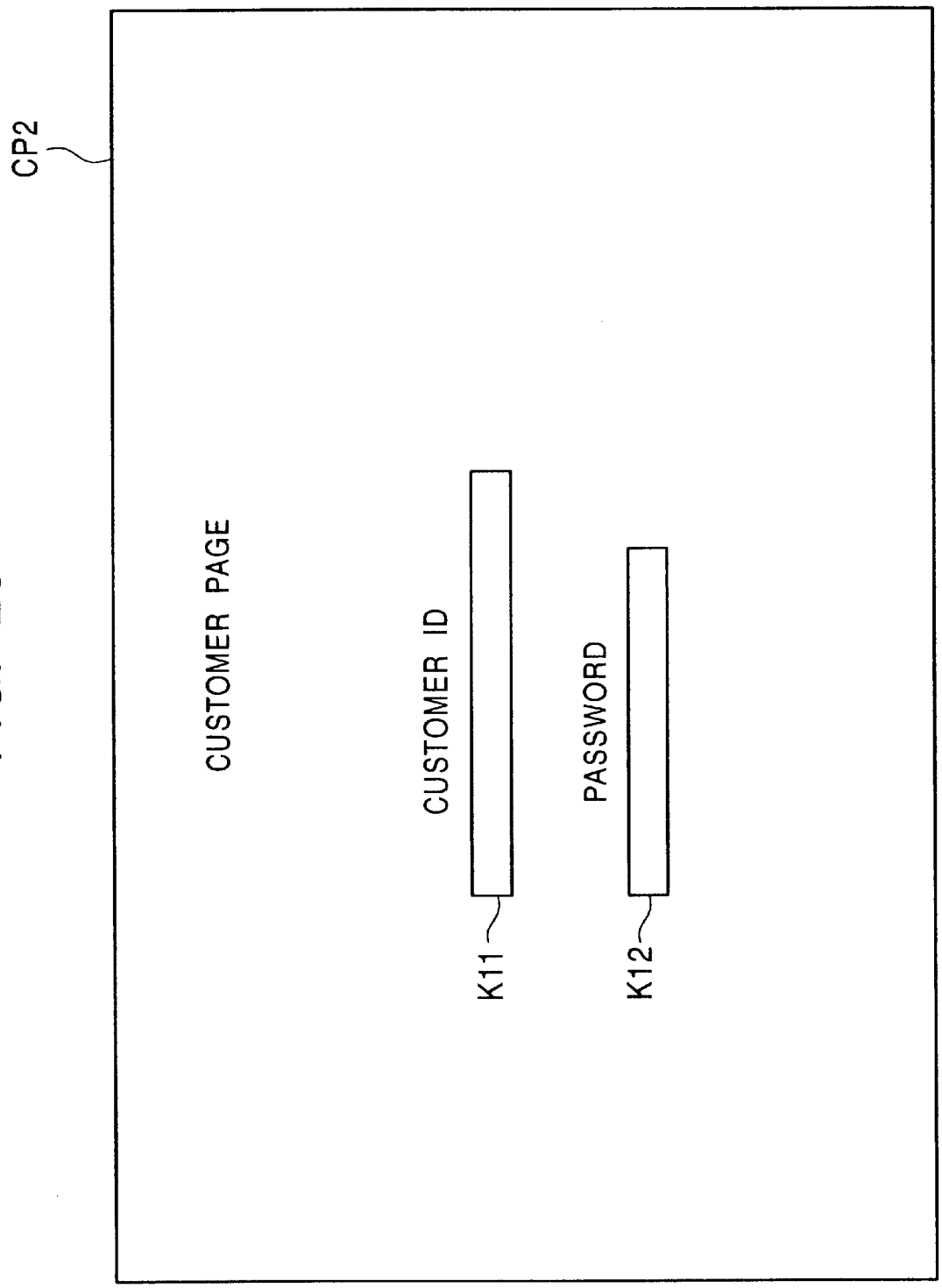
FIG. 28 shows an output form of a subpage CP2 in accordance with the performance validation system of the plasma processing apparatus of the present invention.

Upon receiving the request for display (Step S3-B), the server S sends a subpage prompting the customer to input the "browsing password" (Step S6). FIG. 28 shows the customer page CP2 which comprises a customer ID input box K11 and a password input box K12.

The customer page CP2 prompting the customer to input is displayed at the customer terminal C1. In response to the prompt, the customer inputs the "browsing password" and the "customer ID", which are provided from the maintenance engineer, through the customer terminal C1 so as to allow the server S to identify the plasma processing apparatus or system and each plasma chamber thereof.

That is, the customer enters the customer ID into the customer ID input box K11 and the browsing password into the password input box K12. Only when the server S receives the authorized "customer ID" and "browsing password" from the customer terminal C1 (Step S7), the server S transmits the "operation and maintenance information" subpage previously associated with this "browsing password" to the customer terminal C1 (Step S9).

In other words, the "operation and maintenance information" is accessible only by the specific customer who signed the sales contract for the plasma processing apparatus or system, i.e., who possesses the authorized "browsing password". A third party using the server S cannot access the "operation and maintenance information". Although the maintenance engineer generally signs sales contracts with a plurality of customers and delivers a plurality of plasma processing apparatuses or systems for these customers, each of the customers is provided with a "browsing password" unique to the customer, unique to the plasma processing apparatus or system, or unique each of the plasma chambers constituting the plasma processing apparatus or system and can individually access the "operation and maintenance information" associated with the assigned "browsing password".

Thus, it becomes possible to securely prevent confidential information regarding the purchase of the plasma chamber from leakage to other customers. Furthermore, the plasma processing apparatus or system and the plasma processing chambers thereof can be separately identified even when they are delivered simultaneously. If the server S does not receive a authorized "browsing password" (Step S7), a message rejecting the access and prompting the customer to reenter the "browsing password" is transmitted to the customer terminal C1 (Step S8). If the customer entered a wrong "browsing password", the customer may reenter a correct password to access the "operation and maintenance information".

When the ID and the password are verified (Step S7), the server S retrieves data corresponding to the requested information from the database D and transmits it to the customer terminal C1 in the form of a subpage. That is, when the server S receives a request from the customer terminal C1 requesting display of the "standard performance information" and the "operation and maintenance information" of the specific plasma processing apparatus or system and the plasma processing chambers thereof identified by the customer ID, data such as "vacuum performance", "gas charge/discharge performance", "electrical performance of the plasma processing chamber", and the like are retrieved from the database D according to the specified model, and a specification page (subpage) CP3 containing these data is transmitted to the customer terminal C1 (Step S9).

Figure 29:
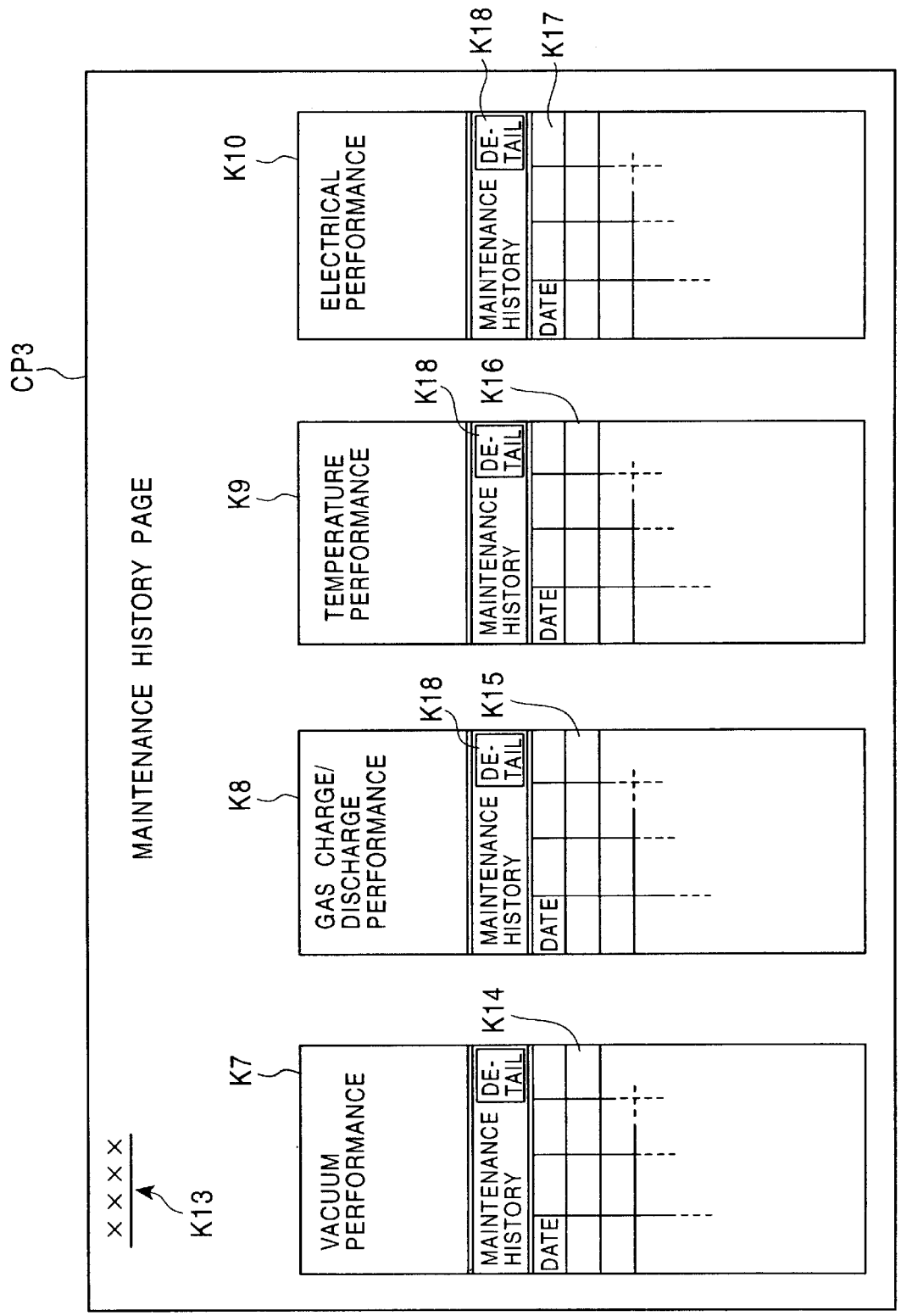
FIG. 29 shows an output form of a subpage CP3 in accordance with the performance validation system of the plasma processing apparatus of the present invention.

FIG. 29 shows a maintenance history page (subpage) CP3 containing "operation and maintenance information", which is transmitted from the server S to the customer terminal C1.

The maintenance history page CP3 comprises a serial number section K13 indicating the serial numbers of the plasma processing apparatus or system and the plasma processing chambers thereof, the vacuum performance section K7, the gas charge/discharge performance section K8, the temperature performance section K9, the electrical performance section K10, a vacuum performance maintenance section K14, a gas charge/discharge performance maintenance section K15, a temperature performance maintenance section K16, and an electrical characteristic maintenance section K17. These constitute the "standard performance information" and the "operation and maintenance information" of the specific plasma chamber that is purchased.

An example of the description in the vacuum performance maintenance section K14 is as follows:

ultimate degree of vacuum: $1.3 \times 10^{-5}$ Pa or less;

operational pressure: 200 Pa.

An example of the description in the gas charge/discharge performance maintenance section K15 is as follows:

| gas flow rates: | |
|---|---|
| $SiH_4$ | 40 SCCM, |
| $NH_3$ | 160 SCCM, |
| $N_2$ | 600 SCCM; and | discharge property: $6.8 \times 10^{-7}$ Pa.m$^3$/sec.

An example of the description in the temperature performance maintenance section K16 is as follows:

heater temperature: 302.3±4.9° C.; and chamber temperature: 80.1±2.1° C.

The variation in each of the above-described parameters P among these plasma chambers constituting the plasma processing apparatus or the plasma processing system is defined by relationship (10B) below:

$$(P_{max}-P_{min})/(P_{max}+P_{min}) \quad (10B)$$

wherein $P_{max}$ represents the maximum value and $P_{min}$ represents the minimum value of this parameter among these plasma processing chambers. The variation which is set for each of the parameters P of the plasma processing apparatus or system is displayed.

A "detail" button K18 is provided in each of the sections K14, K15, K16, and K17 in this subpage CP3 so that the customer can browse the corresponding information.

When the customer submits a display request by selecting a "detail" button K18, a detailed maintenance page CP4 including detailed information on the maintenance history is transmitted from the server S to the customer terminal C1.

FIG. 30 shows the detailed maintenance page CP4 (subpage) transmitted from the server S to the customer terminal C1.

The detailed maintenance page CP4 shown in FIG. 30 includes the electrical performance section K10.

The detailed maintenance page CP4 comprises the serial number display sections K13 for displaying the serial numbers of the purchased plasma processing apparatus or system and the plasma chambers thereof, the electrical performance section K10, and the electrical characteristic maintenance section K17. In the electrical characteristic maintenance section K17, the values of the parameters P measured at the time of maintenance and the values of the variations among these measured values of the parameters P are displayed according to the serial numbers of the plasma processing chambers of the plasma processing apparatus or system.

In the electrical performance section K10, as described in the first to fifth embodiments, the standard values of the plasma electrode capacitance $C_e$ and loss capacitance $C_X$ are described. In addition, the section K10 includes the values of the resistance R, reactance X, and first series resonant frequency $f_0$ of the plasma processing chamber at the power frequency $f_e$, the plasma electrode capacitance $C_e$, the loss capacitance $C_X$, the relationship between the plasma electrode capacitance $C_e$ and the loss capacitance $C_X$, between the plasma excitation electrode 4 and the grounded potential portion, the variation, etc.

As shown in FIGS. 29 and 30, in both the maintenance history page CP3 and the detailed maintenance page CP4, the "operation and maintenance information" and the "standard performance information" comprising data such as the "vacuum performance", "gas charge/discharge performance", "temperature performance", "electrical performance", etc. retrieved from the database D, are displayed together. Thus, the customer can view the "operation and maintenance information" while referring to the "standard performance information". The customer may use the "standard performance information" as the reference during use and the "operation and maintenance information" as the parameter indicating the actual state of the operation. By comparing the "standard performance information" to the "operation and maintenance information", the customer can validate the operation of the plasma processing apparatus or system and the plasma processing chambers thereof, determine whether it is necessary to perform maintenance, and find the state of the plasma processing.

If the server S does not receive a log-off request from the customer terminal C1 after transmission of the subpages C3 and C4 to the customer terminal C1 (Step S5), the server S transmits an invalid connection message to the customer terminal C1 (Step S8) to prompt reentry of the "customer password" or to wait for the next display request (Step S3). If the server S receives the log-off request from the customer terminal C1 (Step S5), the communication with the customer terminal C1 is terminated.

As described above, according to the present invention, the performance validation system for the above-described plasma processing apparatus or system comprises a customer terminal, an engineer terminal, and information providing means. The customer terminal requests browsing of performance information to the information providing means via a public line, a maintenance engineer uploads the performance information to the information providing means through the engineer terminal, and the information providing means provides the performance information uploaded from the engineer terminal to the customer terminal upon the request from the customer terminal. The performance information includes values in various parameters such as plasma electrode capacitance $C_e$, the loss capacitance $C_X$, and the variations thereof between the plasma processing chambers constituting the plasma processing apparatus or system and can be output as a catalog or a specification document so that any customer can obtain information for determining the purchase. The customer can also view the performance information comprising the standard performance information and the operation and maintenance information of the plasma processing chambers of the plasma processing apparatus or system in use.

EXAMPLES

Experiment A

Using one plasma processing chamber, values of the plasma electrode capacitance $C_e$ and the loss capacitance $C_X$ were varied to measure changes in layer characteristics in a layer deposition process.

Also, using a plurality of plasma processing chambers, the variations in the plasma electrode capacitance $C_e$ and the loss capacitance $C_X$ were controlled within a predetermined range to measure changes in layer characteristics in a layer deposition process.

The plasma processing apparatus used in EXPERIMENT A is of a dual frequency type shown in FIG. 13.

Comparative Example 1

Parameters were set as follows:
Plasma electrode capacitance $C_e$: 25 pF
Loss capacitance $C_X$: 960 pF
Size of parallel plate electrodes 4 and 8: 25 cm square
Interelectrode distance: 30 mm
Input power: 1,000 W
Power frequency $f_e$: 40.68 MHz
In COMPARATIVE EXAMPLE 1,
$38.4C_e=C_X$,
$\therefore 26C_e<C_X$.

Example 1

Parameters were set as follows:
Plasma electrode capacitance $C_e$: 37 pF
Loss capacitance $C_X$: 960 pF
Size of parallel plate electrodes 4 and 8: 25 cm square
Interelectrode distance: 20 mm
Input power: 1,000 W
Power frequency $f_e$: 40.68 MHz
In EXAMPLE 1,
$25.9C_e=C_X$.

Example 2

Parameters were set as follows:
Plasma electrode capacitance $C_e$: 37 pF
Loss capacitance $C_X$: 250 pF
Size of parallel plate electrodes 4 and 8: 25 cm square
Interelectrode distance: 20 mm
Input power: 1,000 W
Power frequency $f_e$: 40.68 MHz
In EXAMPLE 2,
$6.76C_e=C_X$,
$\therefore C_e>C_X$.

Example 3

Parameters were set as follows:
Plasma electrode capacitance $C_e$: 37 pF
Loss capacitance $C_X$: 180 pF
Size of parallel plate electrodes 4 and 8: 25 cm square
Interelectrode distance: 20 mm
Input power: 800 W
Power frequency $f_e$: 40.68 MHz In EXAMPLE 2,
$4.86C_e=C_X$,
$\therefore 5C_e>C_X$.

In order to evaluate the results of EXAMPLES 1 to 3 and COMPARATIVE EXAMPLE 1, $SiN_X$ layers were deposited and evaluated as follows.

(1) Deposition Rate and Planar Uniformity
Step 1: Depositing a required layer on a 6-inch substrate by a plasma-enhanced CVD process.
Step 2: Patterning a resist layer by photolithography.
Step 3: Dry-etching the $SiN_X$ layer with $SF_6$ and $O_2$.
Step 4: Removing the resist layer by ashing with $O_2$.
Step 5: Measuring the surface roughness using a contact displacement meter to determine the layer thickness.
Step 6: Calculating the deposition rate from the deposition time and the layer thickness.
Step 7: Measuring the planar uniformity at 16 points on the substrate surface.

(2) BHF Etching Rate
Steps 1 and 2: Same as above.
Step 3: Immersing the substrate in a BHF solution ($HF:NH_4F=1:10$) for one minute to etch the layer.
Step 4: Rinsing the substrate with deionized water, drying the substrate, and removing the resist layer with a mixture of sulfuric acid and hydrogen peroxide ($H_2SO_4+H_2O_2$).
Step 5: Measuring the roughness as in Step 5 in Procedure (1) to determine the layer thickness after the etching.
Step 6: Calculating the etching rate from the immersion time and the reduced layer thickness.

Furthermore, the $SiN_X$ film was evaluated as follows:
(3) Isolation Voltage
Step 1: Depositing a chromium layer on a glass substrate by sputtering and patterning the chromium layer to form a lower electrode;
Step 2: Depositing a $SiN_X$ layer by plasma-enhanced CVD;
Step 3: Forming an upper electrode as in Step 1;
Step 4: Forming a contact hole for the lower electrode;
Step 5: Probing the upper and the lower electrodes to measure the current-voltage characteristic (I–V characteristic) by varying the voltage to approximately 200 V; and
Step 6: Defining the isolation voltage as the voltage V at 100 pA corresponding to 1 $\mu A/cm^2$ in a 100 $\mu m$ square electrode.

Conditions for depositing the layer were as follows:

| Substrate Temperature: 250° C. | |
| --- | --- |
| $SiH_4$: | 100 sccm |
| $NH_3$: | 700 sccm |
| $N_2$: | 450 sccm |
| Pressure: 150 Pa | |

Table 1 shows the results.

TABLE 1

| | COMPARATIVE EXAMPLE 1 | EXAMPLE 1 | EXAMPLE 2 | EXAMPLE 3 |
| --- | --- | --- | --- | --- |
| Power output (W) | 1000 | 1000 | 1000 | 1000 |
| Loss capacitance $C_X$ (pF) | 960 | 960 | 250 | 250 |
| Plasma electrode capacitance $C_e$ (pF) | 25 | 37 | 37 | 37 |

TABLE 1-continued

|  | COMPARATIVE EXAMPLE 1 | EXAMPLE 1 | EXAMPLE 2 | EXAMPLE 3 |
|---|---|---|---|---|
| Deposition rate (nm/min) | 85 | 120 | 430 | 430 |
| Planar thickness uniformity (%) | >±10 | ~±10 | ±5 | ±5 |
| BHF etching rate (nm/min) | >200 | ~200 | ~200 | ~200 |
| Isolation voltage MV/cm | ~4 | ~4 | ~7 | ~7 |

The results show that the deposition rate is higher than 100 nm/min and the resulting layer has a uniform thickness when 26 times the plasma electrode capacitance $C_e$ is greater than the loss capacitance $C_X$. Furthermore, in EXAMPLES of the present invention, the BHF etching rate is 200 nm/min or less and shows that the layer has improved quality.

When 7 times the plasma electrode capacitance $C_e$ is greater than the loss capacitance $C_X$, the deposition rate becomes five times that in COMPARATIVE EXAMPLE 1 and the planar thickness uniformity becomes half of that in EXAMPLE 1. In such a case, the isolation voltage is also improved.

When 5 times the plasma electrode capacitance $C_e$ is greater than the loss capacitance $C_X$, the resulting effects are substantially the same as those in EXAMPLE 2 though the input power is reduced from 1,000 W to 800 W.

Accordingly, setting the plasma electrode capacitance $C_e$ and the loss capacitance $C_X$ to the predetermined value improves the performance of the plasma processing apparatus.

Experiment B

In EXPERIMENT B, the variations of the plasma electrode capacitance $C_e$ and the loss capacitance $C_X$ between a plurality of plasma chambers were controlled within a predetermined value to measure changes in layer characteristics after layer deposition.

The plasma processing apparatus used in EXPERIMENT B was of a dual-frequency type having two plasma processing chambers as shown in the third embodiment. The size of the parallel plate electrodes 4 and 8 was 25 cm square, and the interelectrode distance was 15 mm. The input power was 800 W and the power frequency $f_e$ was 40.68 MHz.

Example 4

The variation between the maximum and the minimum of each of the plasma electrode capacitance $C_e$ and the loss capacitance $C_X$ among these plasma processing chambers was set to be 0.09 according to relationships (12) and (13). The average plasma electrode capacitance $C_e$ was set to be 37 pF and the average loss capacitance $C_X$ was set to be 250 pF.

Example 5

The variation between the maximum and the minimum of each of the plasma electrode capacitance $C_e$ and the loss capacitance $C_X$ among these plasma processing chambers was set to be 0.02 according to relationships (12) and (13). The average plasma electrode capacitance $C_e$ was set to be 37 pF and the average loss capacitance $C_X$ was set to be 980 pF.

Comparative Example 2

The variation between the maximum and the minimum of each of the plasma electrode capacitance $C_e$ and the loss capacitance $C_X$ among these plasma processing chambers was set to be 0.11 according to relationships (12) and (13). The average plasma electrode capacitance $C_e$ was set to be 37 pF and the average loss capacitance $C_X$ was set to be 180 pF.

In each of EXAMPLES 4 and 5 and COMPARATIVE EXAMPLE 2, a silicon nitride layer was deposited according to the same recipe to measure a variation in layer thickness among these plasma processing chambers, as follows.

Step 1: Depositing a $SiN_X$ layer on a 6-inch glass substrate by plasma-enhanced CVD;

Step 2: Patterning a resist layer by photolithography;

Step 3: Dry-etching the $SiN_X$ layer with $SF_6$ and $O_2$;

Step 4: Removing the resist layer by ashing with $O_2$;

Step 5: Measuring the unevenness in the layer thickness using a contact displacement meter;

Step 6: Calculating the deposition rate from the deposition time and the layer thickness; and Step 7: Measuring the planar uniformity at 16 points on the substrate surface.

Herein, the layer was deposited under the following conditions:

| Substrate temperature: 350° C. | |
|---|---|
| $SiH_4$ flow rate: | 40 SCCM |
| $NH_3$ flow rate: | 200 SCCM |
| $N_2$ flow rate: | 600 SCCM |

Pressure: 150 Pa

The results are shown in Table 2.

TABLE 2

|  | Variation in Deposition Rate | Variation in Loss Capacitance |
|---|---|---|
| COMPARATIVE EXAMPLE 2 | 6.2% | 0.11 |
| EXAMPLE 4 | 4.9% | 0.09 |
| EXAMPLE 5 | 1.9% | 0.02 |

The results show that the variation in thickness according to plasma processing chambers is improved when variations in the plasma electrode capacitance $C_e$ and the loss capacitance $C_X$ is controlled within the predetermined value.

What is claimed is:

1. A plasma processing apparatus comprising:
   a plasma processing chamber having a plasma excitation electrode, a susceptor electrode, and a radiofrequency feeder, the plasma excitation electrode and the susceptor electrode generating a plasma in cooperation with each other;
   a radiofrequency generator for supplying a radiofrequency voltage to the plasma excitation electrode; and a matching circuit having an input terminal and an output terminal, the input terminal being connected to the radiofrequency generator and the output terminal being connected to an input end of the radiofrequency feeder so as to achieve impedance matching between the plasma processing chamber and the radiofrequency generator, wherein 26 times a plasma electrode capacitance $C_e$ between the plasma excitation electrode and the susceptor electrode is greater than a loss capacitance $C_X$ between the plasma excitation electrode and ground potential positions which are DC-grounded.

2. The plasma processing apparatus according to claim 1, wherein 7 times the plasma electrode capacitance $C_e$ is greater than the loss capacitance $C_X$.

3. The plasma processing apparatus according to claim 2, wherein 5 times the plasma electrode capacitance $C_e$ is greater than the loss capacitance $C_X$.

4. The plasma processing apparatus according to claim 1, wherein the plasma excitation electrode and the susceptor electrode are of a parallel plate type, the plasma excitation electrode constitutes a part of an upper component of the plasma processing chamber, and the loss capacitance $C_X$ is a capacitance which is measured at a measuring position corresponding to the output terminal of the matching circuit of the upper component.

5. The plasma processing apparatus according to claim 4, further comprising a measuring terminal provided in the vicinity of the measuring position for measuring radiofrequency characteristics of the plasma processing chamber, and a switch which electrically disconnects the measuring position from the measuring terminal and electrically connects the radiofrequency feeder to the radiofrequency generator when the plasma is excited and which electrically connects the measuring position to the measuring terminal and electrically disconnects the radiofrequency feeder from the radiofrequency generator when the radiofrequency characteristics of the plasma processing chamber are measured.

6. A performance validation system for the plasma processing apparatus according to claim 1, comprising:

a customer terminal, an engineer terminal, and an information provider, wherein the customer terminal requests browsing of performance information to the information provider via a public line, a maintenance engineer uploads the performance information to the information provider through the engineer terminal, and the information provider provides the performance information uploaded from the engineer terminal to the customer terminal upon the request from the customer terminal.

7. The performance validation system for the plasma processing apparatus according to claim 6, wherein the performance information comprises the plasma electrode capacitance $C_e$.

8. The performance validation system for the plasma processing system according to claim 6, wherein the performance information comprises the plasma electrode capacitance $C_e$.

9. A plasma processing apparatus comprising a plurality of plasma processing chamber units, each unit comprising: a plasma processing chamber having a plasma excitation electrode, a susceptor electrode, and a radiofrequency feeder, the plasma excitation electrode and the susceptor electrode generating a plasma in cooperation with each other; a radiofrequency generator for supplying a radiofrequency voltage to the plasma excitation electrode; and a matching circuit having an input terminal and an output terminal, the input terminal being connected to the radiofrequency generator and the output terminal being connected to an input end of the radiofrequency feeder so as to achieve impedance matching between the plasma processing chamber and the radiofrequency generator, wherein a variation in plasma electrode capacitance $C_e$ between the plasma excitation electrode and the susceptor electrode among the plurality of plasma processing chambers is set within a predetermined value, the variation being defined by $(C_{emax} - C_{emin})/(C_{emax} + C_{emin})$ wherein $C_{emax}$ and $C_{emin}$ are the maximum and the minimum, respectively, of the plasma electrode capacitance $C_e$, and wherein a variation in loss capacitance $C_X$ between the plasma excitation electrode and ground potential positions which are DC-grounded among the plasma processing chambers is set within a predetermined value, the variation being defined by $(C_{Xmax} - C_{Xmin})/(C_{Xmax} + C_{Xmin})$ wherein $C_{Xmax}$ and $C_{Xmin}$ are the maximum and the minimum, respectively, of the loss capacitance $C_X$.

10. The plasma processing apparatus according to claim 9, wherein both the variation in the plasma electrode capacitance $C_e$ and the variation in the loss capacitance $C_X$ are less than 0.1.

11. The plasma processing apparatus according to claim 10, wherein both the variation in the plasma electrode capacitance $C_e$ and the variation in the loss capacitance $C_X$ are less than 0.03.

12. The plasma processing apparatus according to claim 9, wherein 26 times the plasma electrode capacitance $C_e$ is greater than the loss capacitance $C_X$.

13. The plasma processing apparatus according to claim 9, wherein the plasma excitation electrode and the susceptor electrode are of a parallel plate type;

the plasma electrode capacitance $C_e$ is a capacitance between the plasma excitation electrode and the susceptor electrode, the plasma excitation electrode constitutes a part of an upper component of the plasma processing chamber, and the loss capacitance $C_X$ is a capacitance which is measured at a measuring position corresponding to the output terminal of the matching circuit of the upper component.

14. The plasma processing apparatus according to claim 13, further comprising a measuring terminal provided in the vicinity of the measuring position for measuring radiofrequency characteristics of the plasma processing chamber, and a switch which electrically disconnects the measuring position from the measuring terminal and electrically connects the radiofrequency feeder to the radiofrequency generator when the plasma is excited and which electrically connects the measuring position to the measuring terminal and electrically disconnects the radiofrequency feeder from the radiofrequency generator when the radiofrequency characteristics of the plasma processing chamber are measured.

15. A performance validation system for the plasma processing apparatus according to claim 9, comprising:

a customer terminal, an engineer terminal, and information provider, wherein the customer terminal requests browsing of performance information to the information provider via a public line, a maintenance engineer uploads the performance information to the information provider through the engineer terminal, and the information provider provides the performance information uploaded from the engineer terminal to the customer terminal upon the request from the customer terminal.

16. The performance validation system for the plasma processing apparatus according to claim 15, wherein the performance information comprises the plasma electrode capacitance $C_e$.

17. A plasma processing system comprising a plurality of plasma processing apparatuses, each plasma processing apparatus comprising a plurality of plasma processing chambers, each plasma processing chamber comprising: a plasma processing chamber having a plasma excitation electrode, a susceptor electrode, and a radiofrequency feeder, the plasma excitation electrode and the susceptor electrode generating a plasma in cooperation with each other; a radiofrequency generator for supplying a radiofrequency voltage to the plasma excitation electrode; and a matching circuit having an input terminal and an output terminal, the input terminal being connected to the radiofrequency generator and the output terminal being connected to an input end of the radiofrequency feeder so as to achieve impedance matching between the plasma processing chamber and the radiofrequency generator, wherein a variation in plasma electrode capacitance $C_e$ between the plasma excitation electrode and the susceptor electrode among the plurality of plasma processing chambers is set within a predetermined value, the variation being defined by $(C_{emax}-C_{emin})/(C_{emax}+C_{emin})$ wherein $C_{emax}$ and $C_{emin}$ are the maximum and the minimum, respectively, of the plasma electrode capacitance $C_e$, and wherein a variation in loss capacitance $C_X$ between the plasma excitation electrode and ground potential positions which are DC-grounded among the plasma processing chambers is set within a predetermined value, the variation being defined by $(C_{Xmax}-C_{Xmin})/(C_{Xmax}+C_{Xmin})$ wherein $C_{Xmax}$ and $C_{Xmin}$ are the maximum and the minimum, respectively, of the loss capacitance $C_X$.

18. The plasma processing system according to claim 17, wherein both the variation in the plasma electrode capacitance $C_e$ and the variation in the loss capacitance $C_X$ are less than 0.1.

19. The plasma processing system according to claim 18, wherein both the variation in the plasma electrode capacitance $C_e$ and the variation in the loss capacitance $C_X$ are less than 0.03.

20. The plasma processing system according to claim 18, wherein 26 times the plasma electrode capacitance $C_e$ is greater than the loss capacitance $C_X$.

21. The plasma processing system according to claim 20, wherein 7 times the plasma electrode capacitance $C_e$ is greater than the loss capacitance $C_X$.

22. The plasma processing system according to claim 21, wherein 5 times the plasma electrode capacitance $C_e$ is greater than the loss capacitance $C_X$.

23. The plasma processing system according to claim 20, wherein the plasma excitation electrode and the susceptor electrode are of a parallel plate type, the plasma excitation electrode constitutes a part of an upper component of the plasma processing chamber, and the loss capacitance $C_X$ is a capacitance which is measured at a measuring position corresponding to the output terminal of the matching circuit of the upper component.

24. The plasma processing system according to claim 23, further comprising a measuring terminal provided in the vicinity of the measuring position for measuring radiofrequency characteristics of the plasma processing chamber, and a switch which electrically disconnects the measuring position from the measuring terminal and electrically connects the radiofrequency feeder to the radiofrequency generator when the plasma is excited and which electrically connects the measuring position to the measuring terminal and electrically disconnects the radiofrequency feeder from the radiofrequency generator when the radiofrequency characteristics of the plasma processing chamber are measured.

25. The plasma processing system according to claim 24, further comprising a radiofrequency measuring meter which is detachably connected to the measuring terminal of each of the plurality of plasma processing chambers.

26. The plasma processing system according to claim 25, wherein the radiofrequency characteristics between the measuring position and the radiofrequency measuring meter are the same among the plurality of plasma processing chambers.

27. A performance validation system for the plasma processing system according to claim 17, comprising:

a customer terminal, an engineer terminal, and information provider, wherein the customer terminal requests browsing of performance information to the information provider via a public line, a maintenance engineer uploads the performance information to the information provider through the engineer terminal, and the information provider provides the performance information uploaded from the engineer terminal to the customer terminal upon the request from the customer terminal.

28. An inspection method for a plasma processing apparatus having a plasma processing chamber having a plasma excitation electrode, a susceptor electrode, and a radiofrequency feeder, the plasma excitation electrode and the susceptor electrode generating a plasma in cooperation with each other; a radiofrequency generator for supplying a radiofrequency voltage to the plasma excitation electrode; and a matching circuit having an input terminal and an output terminal, the input terminal being connected to the radiofrequency generator and the output terminal being connected to an input end of the radiofrequency feeder so as to achieve impedance matching between the plasma processing chamber and the radiofrequency generator, the method comprising:

setting the plasma electrode capacitance $C_e$ between the plasma excitation electrode and the susceptor electrode and the loss capacitance $C_X$ between the plasma excitation electrode and ground potential positions which are DC-grounded so that 26 times the plasma electrode capacitance $C_e$ is greater than the loss capacitance $C_X$.

29. The inspection method for the plasma processing apparatus according to claim 28, wherein 7 times the plasma electrode capacitance $C_e$ is greater than the loss capacitance $C_X$.

30. The inspection method for the plasma processing apparatus according to claim 29, wherein 5 times the plasma electrode capacitance $C_e$ is greater than the loss capacitance $C_X$.

31. The inspection method for the plasma processing apparatus according to claim 28, wherein the plasma excitation electrode and the susceptor electrode are of a parallel plate type, the plasma excitation electrode constitutes a part of an upper component of the plasma processing chamber, and the loss capacitance $C_X$ is a capacitance which is measured at a measuring position corresponding to the output terminal of the matching circuit of the upper component.

32. An inspection method for a plasma processing apparatus having a plurality of plasma processing chamber units, each unit comprising: a plasma processing chamber having a plasma excitation electrode, a susceptor electrode, and a radiofrequency feeder, the plasma excitation electrode and the susceptor electrode generating a plasma in cooperation with each other; a radiofrequency generator for supplying a radiofrequency voltage to the plasma excitation electrode; and a matching circuit having an input terminal and an output terminal, the input terminal being connected to the radiofrequency generator and the output terminal being connected to an input end of the radiofrequency feeder so as to achieve impedance matching between the plasma processing chamber and the radiofrequency generator, the method comprising:

setting a variation in plasma electrode capacitance $C_e$ between the plasma excitation electrode and the susceptor electrode among the plurality of plasma processing chambers at a predetermined value wherein the variation is defined by $(C_{emax} - C_{emin})/(C_{emax} + C_{emin})$ wherein $C_{emax}$ and $C_{emin}$ are the maximum and the minimum, respectively, of the plasma electrode capacitance $C_e$ and a variation in loss capacitance $C_X$ between the plasma excitation electrode and ground potential positions which are DC-grounded among the plasma processing chambers at a predetermined value wherein the variation is defined by $(C_{Xmax} - C_{Xmin})/(C_{Xmax} + C_{Xmin})$ wherein $C_{Xmax}$ and $C_{Xmin}$ are the maximum and the minimum, respectively, of the loss capacitance $C_X$.

33. The inspection method for the plasma processing apparatus according to claim 32, wherein both the variation in the plasma electrode capacitance $C_e$ and the variation in the loss capacitance $C_X$ are set such that they are less than 0.1.

34. The inspection method for the plasma processing apparatus according to claim 33, wherein both the variation in the plasma electrode capacitance $C_e$ and the variation in the loss capacitance $C_X$ are set such that they are less than 0.03.

35. The inspection method for the plasma processing apparatus according to claim 32, wherein 26 times the plasma electrode capacitance $C_e$ is greater than the loss capacitance $C_X$.

36. The inspection method for the plasma processing apparatus according to claim 32, wherein
the plasma excitation electrode and the susceptor electrode are of a parallel plate type,
the plasma excitation electrode constitutes a part of an upper component of the plasma processing chamber, and
the loss capacitance $C_X$ is a capacitance which is measured at a measuring position corresponding to the output terminal of the matching circuit of the upper component.

37. An inspection method for a plasma processing system having a plurality of plasma processing apparatuses, each plasma processing apparatus having a plurality of plasma processing chambers, each plasma processing chamber comprising: a plasma processing chamber having a plasma excitation electrode, a susceptor electrode, and a radiofrequency feeder, the plasma excitation electrode and the susceptor electrode generating a plasma in cooperation with each other; a radiofrequency generator for supplying a radiofrequency voltage to the plasma excitation electrode; and a matching circuit having an input terminal and an output terminal, the input terminal being connected to the radiofrequency generator and the output terminal being connected to an input end of the radiofrequency feeder so as to achieve impedance matching between the plasma processing chamber and the radiofrequency generator, the method comprising:

setting a variation in plasma electrode capacitance $C_e$ between the plasma excitation electrode and the susceptor electrode among the plurality of plasma processing chambers at a predetermined value wherein the variation is defined by $(C_{emax} - C_{emin})/(C_{emax} + C_{emin})$ wherein $C_{emax}$ and $C_{emin}$ are the maximum and the minimum, respectively, of the plasma electrode capacitance $C_e$ and a variation in loss capacitance $C_X$ between the plasma excitation electrode and ground potential positions which are DC-grounded among the plasma processing chambers at a predetermined value wherein the variation is defined by $(C_{Xmax} - C_{Xmin})/(C_{Xmax} + C_{Xmin})$ wherein $C_{Xmax}$ and $C_{Xmin}$ are the maximum and the minimum, respectively, of the loss capacitance $C_X$.

38. The inspection method for the plasma processing system according to claim 37, wherein both the variation in the plasma electrode capacitance $C_e$ and the variation in the loss capacitance $C_X$ are set such that they are less than 0.1.

39. The inspection method for the plasma processing system according to claim 38, wherein both the variation in the plasma electrode capacitance $C_e$ and the variation in the loss capacitance $C_X$ are set such that they are less than 0.03.

40. The inspection method for the plasma processing system according to claim 38, wherein 26 times the plasma electrode capacitance $C_e$ is greater than the loss capacitance $C_X$.

41. The inspection method for the plasma processing system according to claim 40, wherein 7 times the plasma electrode capacitance $C_e$ is greater than the loss capacitance $C_X$.

42. The inspection method for the plasma processing system according to claim 41, wherein 5 times the plasma electrode capacitance $C_e$ is greater than the loss capacitance $C_X$.

43. The inspection method for the plasma processing apparatus according to claim 38, wherein
the plasma excitation electrode and the susceptor electrode are of a parallel plate type,
the plasma excitation electrode constitutes a part of an upper component of the plasma processing chamber, and
the loss capacitance $C_X$ is a capacitance which is measured at a measuring position corresponding to the output terminal of the matching circuit of the upper component.

* * * * *

UNITED STATES PATENT AND TRADEMARK OFFICE
CERTIFICATE OF CORRECTION

PATENT NO. : 6,538,388 B2
DATED : March 25, 2003
INVENTOR(S) : Akira Nakano et al.

It is certified that error appears in the above-identified patent and that said Letters Patent is hereby corrected as shown below:

<u>Title page,</u>
Item [73], Assignee, immediately after "(JP)" insert -- ; Tadahiro Ohmi, Miyagi-ken (JP) --.

Signed and Sealed this

Fifth Day of October, 2004

JON W. DUDAS
*Director of the United States Patent and Trademark Office*